(12) United States Patent
Palmer et al.

(10) Patent No.: US 10,108,516 B2
(45) Date of Patent: Oct. 23, 2018

(54) AFFINITY DATA COLLECTION IN A COMPUTING SYSTEM

(71) Applicant: KnuEdge Incorporated, San Diego, CA (US)

(72) Inventors: Douglas A. Palmer, San Diego, CA (US); Jerome V. Coffin, San Diego, CA (US)

(73) Assignee: KnuEdge Incorporated, San Diego, CA (US)

( * ) Notice: Subject to any disclaimer, the term of this patent is extended or adjusted under 35 U.S.C. 154(b) by 18 days.

(21) Appl. No.: 15/399,681

(22) Filed: Jan. 5, 2017

(65) Prior Publication Data

US 2017/0125073 A1 May 4, 2017

Related U.S. Application Data

(63) Continuation-in-part of application No. 14/608,505, filed on Jan. 29, 2015.

(Continued)

(51) Int. Cl.
*G06F 11/30* (2006.01)
*G11C 7/10* (2006.01)
(Continued)

(52) U.S. Cl.
CPC ............ *G06F 11/3006* (2013.01); *G06F 9/50* (2013.01); *G11C 7/1036* (2013.01); *G11C 19/00* (2013.01); *G06F 2212/657* (2013.01)

(58) Field of Classification Search
CPC . G11C 7/1036; G11C 19/00; G06F 2212/657; G06F 9/50; G06F 11/3006
See application file for complete search history.

(56) References Cited

U.S. PATENT DOCUMENTS

| 4,920,487 A | 4/1990 | Baffes |
| 8,655,815 B2 | 2/2014 | Palmer |

(Continued)

FOREIGN PATENT DOCUMENTS

GB        2457309 A1    8/2009

OTHER PUBLICATIONS

A Todd et al., "Power Supply noise aware workload assignment for multi-core systems", 2008, Proc. ICCAD, pp. 330-337.

(Continued)

*Primary Examiner* — Jacob D Dascomb
(74) *Attorney, Agent, or Firm* — Fish & Richardson P.C.

(57) ABSTRACT

A data collecting instrument including an input coupled with an output network port of a processing device, the input configured to receive a destination address of each data packet transmitted from the output network port, where the processing device is connected to a plurality of processing devices and is configured to transmit data packets from output network ports of the processing device to other devices of the plurality; one or more address registers configured to store information about a destination address range; a counter register configured to store a counter value; and digital circuitry coupled with the input, the one or more address registers, and the counter register; the digital circuitry configured to (i) determine, based on the information stored in the one or more address registers, that the destination address is within the destination address range; and (ii) increment the counter value stored in the counter register.

28 Claims, 25 Drawing Sheets

Related U.S. Application Data

(60) Provisional application No. 62/275,149, filed on Jan. 5, 2016.

(51) Int. Cl.
*G11C 19/00* (2006.01)
*G06F 9/50* (2006.01)

(56) References Cited

U.S. PATENT DOCUMENTS

| | | |
|---|---|---|
| 8,848,726 B1 | 9/2014 | Palmer |
| 2003/0229662 A1 | 12/2003 | Luick |
| 2005/0068897 A1* | 3/2005 | Arita ............... H04L 49/90 370/235 |
| 2006/0294588 A1* | 12/2006 | Lahann ............ H04L 63/1416 726/23 |
| 2007/0220522 A1 | 9/2007 | Coene et al. |
| 2008/0263315 A1* | 10/2008 | Zhang ............... G06F 9/30098 711/208 |
| 2008/0282232 A1* | 11/2008 | Cong ............... G06F 11/3404 717/127 |
| 2011/0191477 A1 | 8/2011 | Zhang et al. |
| 2012/0204181 A1 | 8/2012 | Yachide |
| 2013/0067484 A1 | 3/2013 | Sonoda et al. |
| 2013/0239111 A1 | 9/2013 | Bingham et al. |
| 2014/0032457 A1 | 1/2014 | Palmer |
| 2014/0156907 A1 | 6/2014 | Palmer |
| 2014/0204943 A1 | 7/2014 | Palmer |
| 2014/0297846 A1 | 10/2014 | Hoja et al. |
| 2014/0359638 A1* | 12/2014 | de Lima ............ G06Q 40/04 719/313 |
| 2015/0007185 A1 | 1/2015 | Dey et al. |
| 2016/0020993 A1* | 1/2016 | Wu ............... H04L 45/14 370/392 |
| 2016/0224379 A1 | 8/2016 | Palmer |

OTHER PUBLICATIONS

International Search Report for International Application No. PCT/US2016/015064, dated May 6, 2016.
International Application No. PCT/US2016/015064, Notification Concerning Transmittal of International Preliminary Report on Patentability, dated Aug. 10, 2017, 8 pages.
Written Opinion for International Application No. PCT/US2016/015064, dated May 6, 2016.

* cited by examiner $100A$ $100B$

AFFINITY DATA COLLECTION IN A COMPUTING SYSTEM

CROSS-REFERENCE TO RELATED APPLICATIONS

This application claims benefit of the Provisional Application No. 62/275,149, entitled "LamdbaFabric: A Scale-Invariant Computing Interconnect Scheme," filed on Jan. 5, 2016. The entire contents of this priority application are hereby incorporated by reference. This application is a continuation-in-part of U.S. patent application Ser. No. 14/608,505, entitled "Mapping Processes to Processors in a Network On a Chip Computing System," filed on Jan. 29, 2015, and published as US Publication No. 2016/0224379, the entire contents of which are hereby incorporated by reference.

FIELD OF THE DISCLOSURE

The technologies described herein relate generally to processor affinity, i.e., assignment of a particular task to a given core of a multicore processor. More specifically, the disclosed technologies relate to collecting affinity data including data associated with network-traffic between computing devices of a computing system, and adjusting task assignments among the computing devices based on the collected affinity data.

BACKGROUND

Parallel processing has been implemented in computer systems for a long time. For example, from the early day mainframe computers to modern day personal computers, laptops, tablets or smartphones, parallel processing has been implemented using a combination of hardware and software capable of taking advantage of the hardware. The hardware can include multiple processors and a shared memory between the processors. In some implementations of a computing system, the processors are cores (also referred to as processing engines) of a processing device. In other implementations of a computing system, the processors are processing devices networked together in one or more data centers, where each of the processing devices can have a single core or multiple cores.

Existing parallel processing techniques, however, put substantial burden on programmers to manage and control the parallel processing. For example, the programmers have to create "threads" to execute tasks in parallel and have to determine how to allocate tasks to the threads, and to different processors of the computing system. Therefore, developing parallel software with existing systems often increases costs, increases the number of software bugs, and tends to be quite limited with respect to the degree of parallelism that can be achieved.

SUMMARY

In this specification, technologies are described for dynamically and adaptively allocating tasks to processors of a computing system. The computing system includes a plurality of processing devices and each processing device includes multiple computing resources. The computing resources communicate with each other using packet-based communications and have respective addresses in a flat address space. In a flat address space, as unique identifiers of single computing resources, each address specifies a computing resource's location (i.e., unit of memory that can be addressed separately.) Moreover, each processing device of at least some of the processing devices of the computing system has system activity monitoring (SAM) features implemented as a SAM instrument coupled with an output network port of the processing device. The SAM instrument includes digital circuitry arranged and configured to check destination addresses of data packets as they leave the processing device over a time interval (e.g., a few milliseconds, 10s of millisecond, 100s of milliseconds), and to count data packets that fall into a certain address range, for instance. Network-traffic data collected in this manner can be used by a supervisor computing resource of the computing system, e.g., by a host of the computing system, to monitor and debug system performance. For instance, network-traffic data collected from processing devices equipped with respective SAM instruments is used by the supervisor computing resource of the computing system to balance and/or assign tasks and processes within the computing system.

Particular aspects of the disclosed technologies can be implemented so as to realize one or more of the following potential advantages. For example, performing system activity monitoring using the disclosed combination of (i) network-traffic data collection implemented at the output network ports of the processing devices and (ii) a single, flat address space used for the entire network of processing devices can be less expensive than performing system activity monitoring using conventional network-traffic data collection implemented at each computing resource of each processing device. As another example, performing system activity monitoring using the disclosed (i)-(ii) combination can have higher resolution than performing system activity monitoring using a conventional addressing scheme in which all data being sent to a particular network address is counted together. As an example of the latter cases, when network address translation (NAT) is used to give a single network address to an entire network of processing devices, there is little or no ability to resolve computers within that network.

As yet another example, a conventional debugger can use a breakpoint that is set to stop a program's execution when, for example, a particular location is written to, e.g., when a particular variable is modified. Setting such a breakpoint can be implemented in accordance with the disclosed technologies in a more selective manner, for instance by stopping execution if the particular variable has changed a predetermined number (e.g., 50) of times; or only stopping execution when/if a value outside of a predetermined address range is written to the variable.

Details of one or more implementations of the disclosed technologies are set forth in the accompanying drawings and the description below. Other features, aspects, descriptions and potential advantages will become apparent from the description, the drawings and the claims.

Figure 1A:
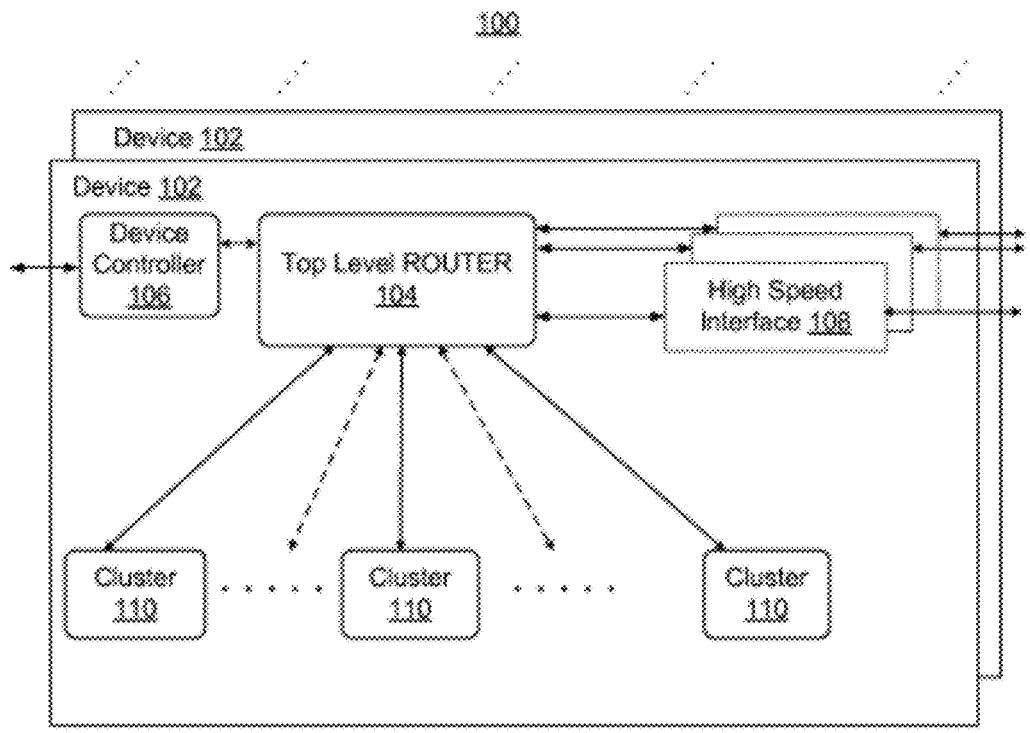
FIG. 1A is a block diagram of an example of a computing system.

Certain illustrative aspects of the systems, apparatuses, and methods according to the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

Technologies are described for dynamically and adaptively allocating tasks to processors of a computing system. The computing system includes a plurality of processing devices and each processing device includes multiple computing resources. The computing resources communicate with each other using packet-based communications and have respective addresses in a flat address space. Moreover, each processing device of at least some of the processing devices of the computing system includes circuitry configured to collect affinity data (e.g., network-traffic data, bandwidth data, latency data), the affinity data collection circuitry coupled with an output network port of the processing device. The affinity data collection circuitry is arranged and configured to check destination addresses of data packets as they leave the processing device over a time interval and count data packets that fall into a certain address range, for instance. In this manner, the disclosed data collection can be used at different levels of resolution that can be configured anywhere from individual registers within a specific processing device all the way to entire networks of processing devices, while keeping costs relatively low.

The network-traffic data collected in this manner can be used by a supervisor computing resource of the computing system, e.g., a host of the computing system, to adjust an assignment of tasks and processes among the processing devices of the computing system. The disclosed technologies can be used to collect network-traffic data in computing systems in which network communications between the processing devices is carried out using protocols such as Ethernet or InfiniBand, as well as wireless protocols such as Bluetooth, 802.11, 802.16 and LTE.

In this specification, the disclosed technologies are used to collect network-traffic data in computing systems in which computing resources (e.g., cores) of each processing device (formed on a respective integrated circuit (IC) chip) communicate with each other and with computing resources (e.g., cores) of other processing devices (e.g., other IC chips) based on data packets, in accordance with network on a chip (NOC) architecture. As such, each NOC processing device (also referred to simply as an NOC device) includes an L1-level router with a number of ports configured to transmit data packets. The circuitry for collecting affinity data on data packets being passed between the NOC devices of a network of the computing system can be associated with each port of the L1-router. The affinity data collection circuitry can be implemented generally as a data collecting instrument, or more specifically as a system activity monitoring (SAM) instrument, that includes at least one set of registers to specify a range of destination addresses to be counted. Each set of registers includes at least one register to specify a range of addresses, and at least one register to count packets sent to that destination. The addresses used are physical or virtual addresses that specify not only the NOC device to which a packet is destined, but can also specify addresses within that NOC device, such as an individual computing resource (e.g., a core aka processing engine) within the NOC processor.

Prior to describing example implementations of affinity data collection for computing resources of a computing system, where communication between the computing resources is carried out based on NOC architecture, structural aspects and functional aspects of the computing system and of the computing resources are described first.

FIG. 1A shows an example of computing system 100 that includes at least one processing device 102. A typical computing system 100, however, may include a plurality of processing devices 102. In some implementations, each processing device 102, which may also be referred to as device 102, includes a router 104, a device controller 106, a plurality of high speed interfaces 108 and a plurality of clusters 110. The router 104 may also be referred to as a top level router or a level one router. Each cluster 110 includes a plurality of processing engines to provide computational capabilities for the computing system 100. In some implementations, the high speed interfaces 108 include communication ports to communicate data outside of the device 102, for example, to other devices 102 of the computing system 100 and/or interfaces to other computing systems. Unless specifically expressed otherwise, data as used herein may refer to both program code and pieces of information upon which the program code operates.

In some implementations, the processing device 102 includes 2, 4, 8, 16, 32 or another number of high speed interfaces 108. Each high speed interface 108 may implement a physical communication protocol. For example, each high speed interface 108 implements the media access control (MAC) protocol, and thus may have a unique MAC address associated with it. The physical communication may be implemented in a known communication technology, for example, Gigabit Ethernet, or any other existing or future-developed communication technology. For example, each high speed interface 108 implements bi-directional high-speed serial ports, such as 10 Giga bits per second (Gbps) serial ports. Two processing devices 102 implementing such high speed interfaces 108 may be directly coupled via one pair or multiple pairs of the high speed interfaces 108, with each pair including one high speed interface 108 on one processing device 102 and another high speed interface 108 on the other processing device 102.

Figure 5:
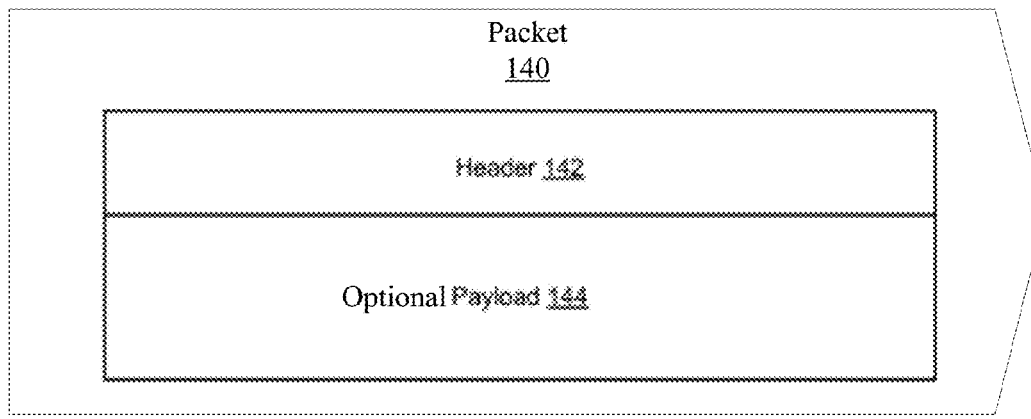
FIG. 5 is a block diagram of an example of a packet used to address a computing resource of a computing system.

In accordance with network on a chip architecture, data communication between different computing resources of the computing system 100 is implemented using routable packets. The computing resources include device level resources such as a device controller 106, cluster level resources such as a cluster controller or cluster memory controller, and/or the processing engine level resources such as individual processing engines and/or individual processing engine memory controllers. An example of a routable packet 140 (or simply packet 140) is shown in FIG. 5. The packet 140 includes a header 142. Optionally, the packet also includes a payload 144. The header 142 includes a routable destination address for the packet 140. The router 104 may be a top-most router configured to route packets on each processing device 102. In some implementations, the router 104 is a programmable router. That is, the routing information used by the router 104 may be programmed and updated. In some cases, the router 104 is implemented using an address resolution table (ART) or Look-up table (LUT) to route any packet it receives on the high speed interfaces 108, or any of the internal interfaces interfacing the device controller 106 or clusters 110. For example, depending on the destination address, a packet 140 received from one cluster 110 may be routed to a different cluster 110 on the same processing device 102, or to a different processing device 102; and a packet 140 received from one high speed interface 108 may be routed to a cluster 110 on the processing device or to a different processing device 102.

In some implementations, the device controller 106 controls the operation of the processing device 102 from power on through power down. In some implementations, the device controller 106 includes a device controller processor, one or more registers and a device controller memory space. The device controller processor may be any existing or future-developed microcontroller. In some implementations, for example, an ARM® Cortex M0 microcontroller is used for its small footprint and low power consumption. In other implementations, a bigger and more powerful microcontroller is chosen if needed. The one or more registers include one to hold a device identifier (DEVID) for the processing device 102 after the processing device 102 is powered up. The DEVID is used to uniquely identify the processing device 102 in the computing system 100. In some implementations, the DEVID is loaded on system start from a non-volatile storage, for example, a non-volatile internal storage on the processing device 102 or a non-volatile external storage. The device controller memory space may include both read-only memory (ROM) and random access memory (RAM). In some implementations, the ROM may store bootloader code that during a system start is executed to initialize the processing device 102 and load the remainder of the boot code through a bus from outside of the device controller 106. In some implementations, the instructions for the device controller processor, also referred to as the firmware, reside in the RAM after they are loaded during the system start.

Here, the registers and device controller memory space of the device controller 106 are read and written to by computing resources of the computing system 100 using packets. That is, they are addressable using packets. As used herein, the term "memory" may refer to RAM, SRAM, DRAM, eDRAM, SDRAM, volatile memory, non-volatile memory, and/or other types of electronic memory. For example, the header of a packet includes a destination address such as DEVID:PADDR, of which the DEVID may identify the processing device 102 and the PADDR may be an address for a register of the device controller 106 or a memory location of the device controller memory space of a processing device 102. In some implementations, a packet directed to the device controller 106 has a packet operation code, which may be referred to as packet opcode or just opcode, to indicate what operation needs to be performed for the packet. For example, the packet operation code may indicate reading from or writing to the storage location pointed to by PADDR. It should be noted that the device controller 106 also sends packets in addition to receiving them. The packets sent by the device controller 106 may be self-initiated or in response to a received packet (e.g., a read request). Self-initiated packets include, for example, reporting status information, requesting data, etc.

Figure 1B:
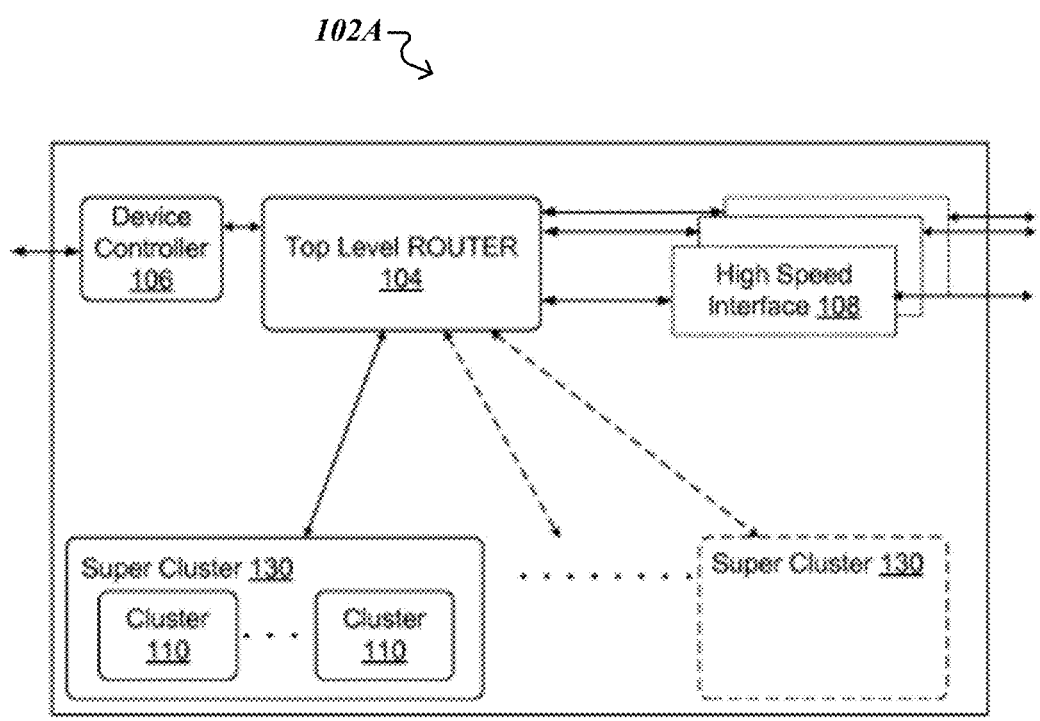
FIG. 1B is a block diagram of an example of a processing device of a computing system.

In some implementations, a plurality of clusters 110 on a processing device 102 are grouped together. FIG. 1B shows a block diagram of another example of a processing device 102A of the computing system 100. The example processing device 102A is one particular embodiment of the processing device 102. Therefore, the processing device 102 referred to in the present disclosure may include any embodiments of the processing device 102, including the example processing device 102A. As shown on FIG. 1B, a plurality of clusters 110 may be grouped together to form a super cluster 130 and the example of processing device 102A may include a plurality of such super clusters 130. In some implementations, a processing device 102 includes 2, 4, 8, 16, 32 or another number of clusters 110, without further grouping the clusters 110 into super clusters. In other implementations, a processing device 102 may include 2, 4, 8, 16, 32 or another number of super clusters 130 and each super cluster 130 may include a plurality of clusters.

Figure 2A:
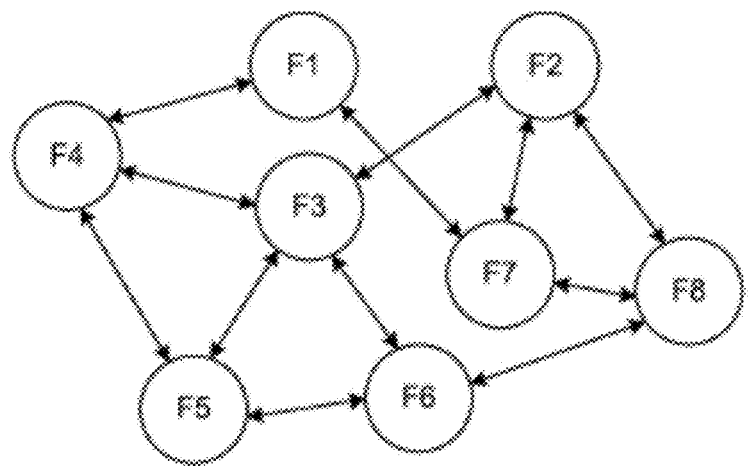
FIG. 2A is a block diagram of topology of connections of an example of a computing system.

FIG. 2A shows a block diagram of an example of a computing system 100A. The computing system 100A may be one example implementation of the computing system 100 of FIG. 1A. The computing system 100A includes a plurality of processing devices 102 designated as F1, F2, F3, F4, F5, F6, F7 and F8. As shown in FIG. 2A, each processing device 102 is directly coupled to one or more other processing devices 102. For example, F4 is directly coupled to F1, F3 and F5; and F7 is directly coupled to F1, F2 and F8. Within computing system 100A, one of the processing devices 102 may function as a host for the whole computing system 100A. In some implementations, the host has a unique device ID that every processing devices 102 in the computing system 100A recognizes as the host. Any of the processing devices 102 may be designated as the host for the computing system 100A. For example, F1 may be designated as the host and the device ID for F1 is set as the unique device ID for the host.

In other implementations, the host is a computing device of a different type, such as a computer processor (for example, an ARM ® Cortex or Intel® x86 processor). Here, the host communicates with the rest of the system 100A through a communication interface, which represents itself to the rest of the system 100A as the host by having a device ID for the host.

The computing system 100A may implement any appropriate techniques to set the DEVIDs, including the unique DEVID for the host, to the respective processing devices 102 of the computing system 100A. In some implementations, the DEVIDs are stored in the ROM of the respective device controller 106 for each processing devices 102 and loaded into a register for the device controller 106 at power up. In other implementations, the DEVIDs are loaded from an external storage. Here, the assignments of DEVIDs may be performed offline (when there is no application running in the computing system 100A), and may be changed offline from time to time or as appropriate. Thus, the DEVIDs for one or more processing devices 102 may be different each time the computing system 100A initializes. Moreover, the DEVIDs stored in the registers for each device controller 106 may be changed at runtime. This runtime change is controlled by the host of the computing system 100A. For example, after the initialization of the computing system 100A, which loads the pre-configured DEVIDs from ROM or external storage, the host of the computing system 100A may reconfigure the computing system 100A and assign different DEVIDs to the processing devices 102 in the computing system 100A to overwrite the initial DEVIDs in the registers of the device controllers 106.

Figure 2B:
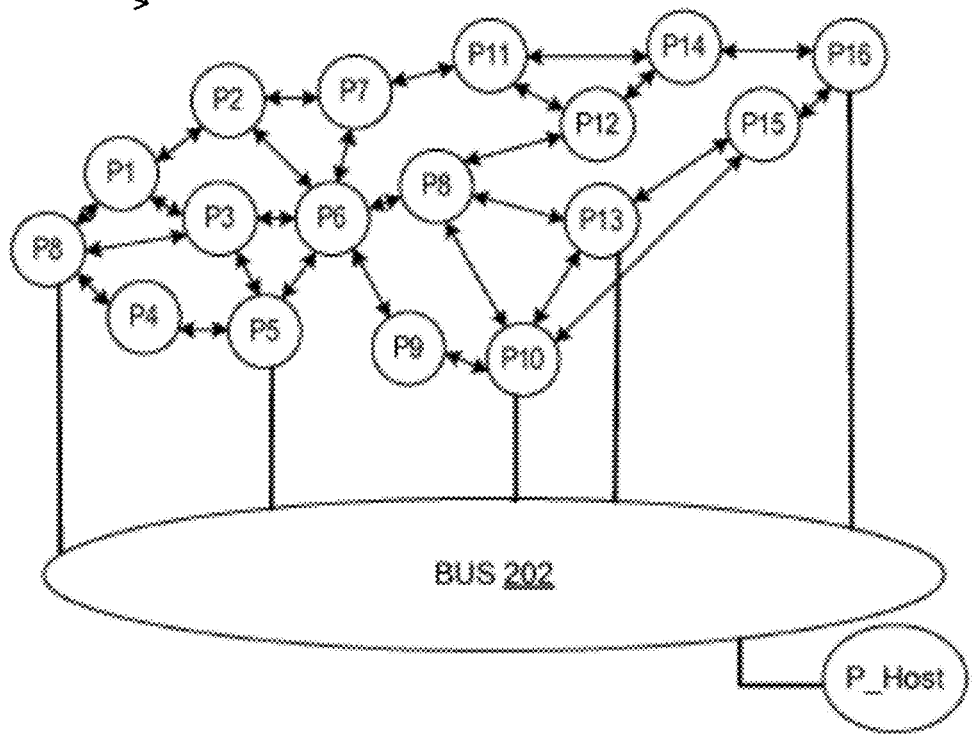
FIG. 2B is a block diagram of topology of connections of another example of a computing system.

FIG. 2B is a block diagram of a topology of another example of a computing system 100B. The computing system 100B is another example implementation of the computing system 100 of FIG. 1 and includes a plurality of processing devices 102 (designated as P1 through P16 on FIG. 2B), a bus 202 and a processing device P_Host. Each processing device of P1 through P16 is directly coupled to another processing device of P1 through P16 by a direct link between them. At least one of the processing devices P1 through P16 is coupled to the bus 202. In the example shown in FIG. 2B, the processing devices P8, P5, P10, P13, P15 and P16 are coupled to the bus 202. Here, the processing device P_Host is coupled to the bus 202 and is designated as the host for the computing system 100B. In the computing system 100B, the host may be a computer processor (for example, an ARM® Cortex or Intel® x86 processor). The host communicates with the rest of the computing system 100B through a communication interface coupled to the bus and represents itself to the rest of the system 100B as the host by having a device ID for the host.

Figure 3A:
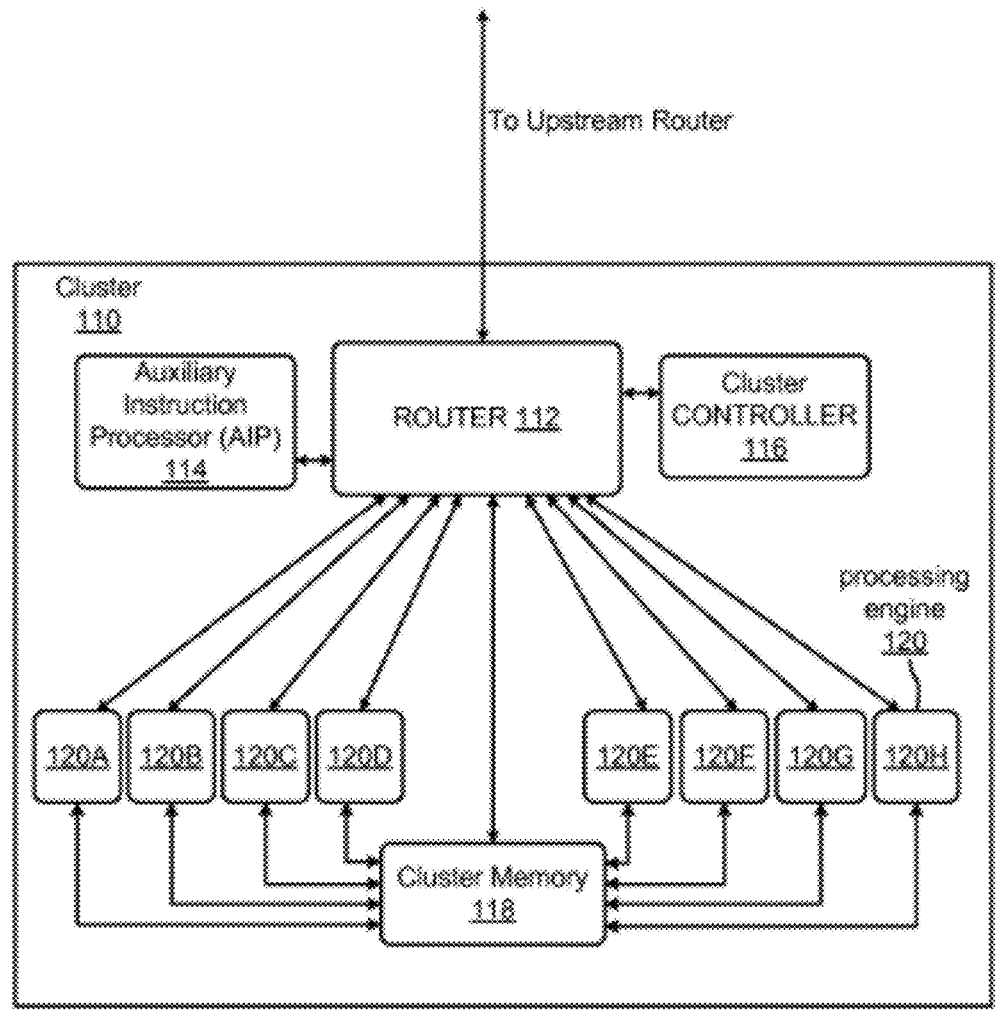
FIG. 3A is a block diagram of an example of a cluster of a computing device.

FIG. 3A shows a block diagram of an example of a cluster 110. The cluster 110 includes a router 112, a cluster controller 116, an auxiliary instruction processor (AIP) 114, a cluster memory 118 and a plurality of processing engines 120. The router 112 is coupled to an upstream router to provide interconnection between the upstream router and the cluster 110. The upstream router may be, for example, the router 104 of the processing device 102 if the cluster 110 is not part of a super cluster 130.

In accordance with network on a chip architecture, examples of operations to be performed by the router 112 include receiving a packet destined for a computing resource within the cluster 110 from outside the cluster 110 and/or transmitting a packet originating within the cluster 110 destined for a computing resource inside or outside the cluster 110. A computing resource within the cluster 110 may be, for example, the cluster memory 118 or any of the processing engines 120 within the cluster 110. A computing resource outside the cluster 110 may be, for example, a computing resource in another cluster 110 of the computer device 102, the device controller 106 of the processing device 102, or a computing resource on another processing device 102. In some implementations, the router 112 also transmits a packet to the router 104 even if the packet may target a resource within itself. In some cases, the router 104 implements a loopback path to send the packet back to the originating cluster 110 if the destination resource is within the cluster 110.

In some implementations, the cluster controller 116 sends packets, for example, as a response to a read request, or as unsolicited data sent by hardware for error or status report. The cluster controller 116 also receives packets, for example, packets with opcodes to read or write data. In some implementations, the cluster controller 116 is a microcontroller, for example, one of the ARM® Cortex-M microcontrollers and includes one or more cluster control registers (CCRs) that provide configuration and control of the cluster 110. In other implementations, instead of using a microcontroller, the cluster controller 116 is custom made to implement any functionalities for handling packets and controlling operation of the router 112. Here, the functionalities may be referred to as custom logic and may be implemented, for example, by FPGA or other specialized circuitry. Regardless of whether it is a microcontroller or implemented by custom logic, the cluster controller 116 may implement a fixed-purpose state machine encapsulating packets and memory access to the CCRs.

In some implementations, each cluster memory 118 is part of the overall addressable memory of the computing system 100. That is, the addressable memory of the computing system 100 includes the cluster memories 118 of all clusters of all devices 102 of the computing system 100. The cluster memory 118 is a part of the main memory shared by the computing system 100. In some implementations, any memory location within the cluster memory 118 may be addressed by any processing engine within the computing system 100 by a physical address. In some implementations, the physical address is a combination of the DEVID, a cluster identifier (CLSID) and a physical address location (PADDR) within the cluster memory 118. As such, the physical address is formed as a string of bits, e.g., DEVID:CLSID:PADDR. The DEVID may be associated with the device controller 106 as described above and the CLSID may be a unique identifier to uniquely identify the cluster 110 within the local processing device 102. It should be noted that in at least some implementations, each register of the cluster controller 116 also be assigned a physical address (PADDR). Therefore, the physical address DEVID:CLSID:PADDR may also be used to address a register of the cluster controller 116, in which PADDR may be an address assigned to the register of the cluster controller 116.

In some other implementations, any memory location within the cluster memory 118 is addressed by any processing engine within the computing system 100 by a virtual address. The virtual address may be a combination of a DEVID, a CLSID and a virtual address location (ADDR). As such, the virtual address is formed as a string of bits, e.g., DEVID:CLSID:ADDR. The DEVID and CLSID in the virtual address may be the same as in the physical addresses.

In some cases, the width of ADDR is specified by system configuration. For example, the width of ADDR is loaded into a storage location convenient to the cluster memory 118 during system start and/or changed from time to time when the computing system 100 performs a system configuration. In some implementations, to convert the virtual address to a physical address, the value of ADDR is added to a base physical address value (BASE). The BASE may also be specified by system configuration as the width of ADDR and stored in a location convenient to a memory controller of the cluster memory 118. In one example, the width of ADDR is stored in a first register and the BASE is stored in a second register in the memory controller. Thus, the virtual address DEVID:CLSID:ADDR is converted to a physical address as DEVID:CLSID:ADDR+BASE. Note that the result of ADDR+BASE has the same width as the target physical address.

The address in the computing system 100 may be 8 bits, 16 bits, 32 bits, 64 bits, or any other number of bits wide. In some implementations, the address is 32 bits wide. The DEVID may be 10, 15, 20, 25 or any other number of bits wide. The width of the DEVID is chosen based on the size of the computing system 100, for example, how many processing devices 102 the computing system 100 has or is designed to have. In some implementations, the DEVID is 20 bits wide and the computing system 100 using this width of DEVID contains up to $2^{20}$ processing devices 102. The width of the CLSID is chosen based on how many clusters 110 the processing device 102 is designed to have. For example, the CLSID may be 3, 4, 5, 6, 7, 8 bits or any other number of bits wide. In some implementations, the CLSID is 5 bits wide and the processing device 102 using this width of CLSID contains up to $2^5$ clusters. The width of the PADDR for the cluster level may be 20, 30 or any other number of bits. For example, the PADDR for the cluster level is 27 bits and the cluster 110 using this width of PADDR contains up to $2^{27}$ memory locations and/or addressable registers. Therefore, in some implementations, if the DEVID is 20 bits wide, CLSID is 5 bits and PADDR has a width of 27 bits, then a physical address DEVID:CLSID:PADDR or DEVID:CLSID:ADDR+BASE is 52 bits.

For performing the virtual to physical memory conversion, the first register (ADDR register) may have 4, 5, 6, 7 bits or any other number of bits. In some implementations, the first register is 5 bits wide. If the value of the 5 bits register is four (4), the width of ADDR is 4 bits; and if the value of 5 bits register is eight (8), the width of ADDR will be 8 bits. Regardless of ADDR being 4 bits or 8 bits wide, if the PADDR for the cluster level is 27 bits, then BASE is 27 bits, and the result of ADDR+BASE still is a 27 bits physical address within the cluster memory 118.

In the example illustrated in FIG. 3A, a cluster 110 includes one cluster memory 118. In other examples, a cluster 110 includes a plurality of cluster memories 118 that each includes a memory controller and a plurality of memory banks, respectively. Moreover, in yet another example, a cluster 110 includes a plurality of cluster memories 118 and these cluster memories 118 are connected together via a router that are downstream of the router 112.

The AIP 114 is a special processing engine shared by all processing engines 120 of one cluster 110. In some implementations, the AIP 114 is implemented as a coprocessor to the processing engines 120. For example, the AIP 114 implements less commonly used instructions such as some floating point arithmetic including one or more of addition, subtraction, multiplication, division and square root, etc. In the example shown in FIG. 3A, the AIP 114 is coupled to the router 112 directly and is configured to send and receive packets via the router 112. As a coprocessor to the processing engines 120 within the same cluster 110, although not shown in FIG. 3A, the AIP 114 may also be coupled to each processing engines 120 within the same cluster 110 directly. In other implementations, a bus shared by all the processing engines 120 within the same cluster 110 is used for communication between the AIP 114 and all the processing engines 120 within the same cluster 110. In some other implementations, a multiplexer is used to control access to the bus shared by all the processing engines 120 within the same cluster 110 for communication with the AIP 114. In yet other implementations, a multiplexer is used to control communication between the AIP 114 and all the processing engines 120 within the same cluster 110.

Figure 3B:
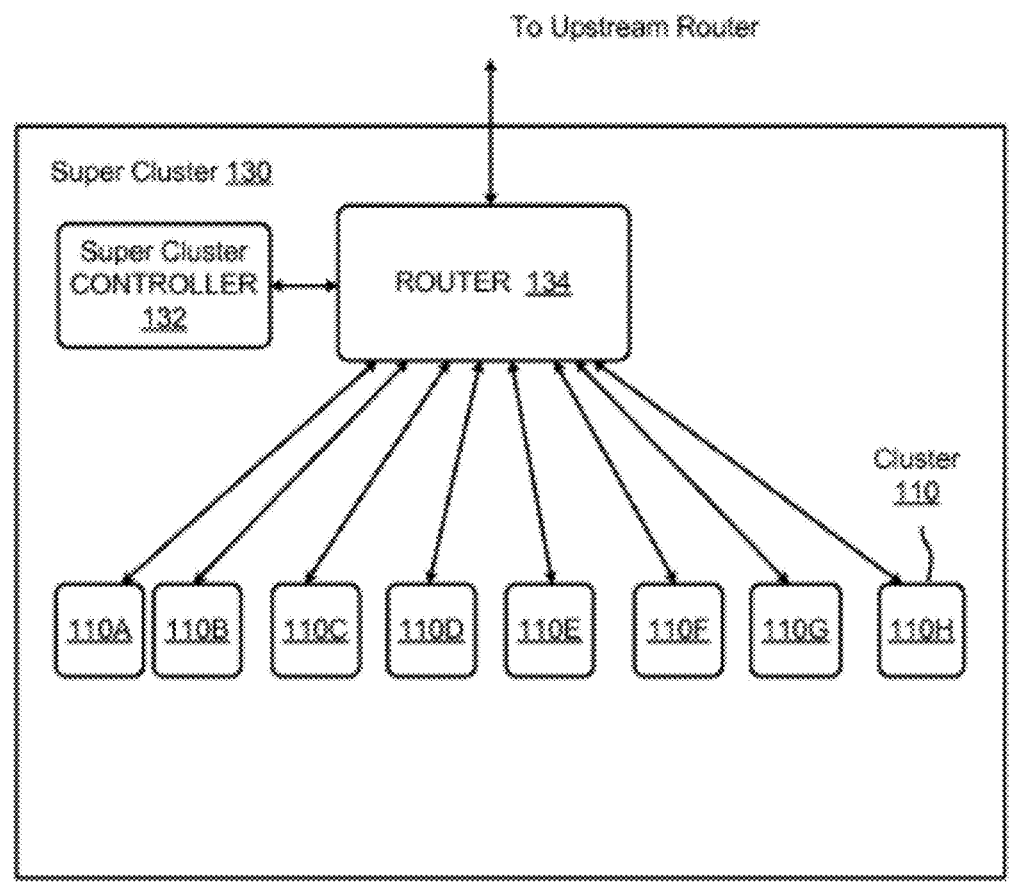
FIG. 3B is a block diagram of an example of a super cluster of a computing device.

The grouping of the processing engines 120 on a computing device 102 may have a hierarchy with multiple levels. For example, multiple clusters 110 are grouped together to form a super cluster. FIG. 3B is a block diagram of an example of a super cluster 130 of the computing device 102. In the example shown in FIG. 3B, a plurality of clusters 110A through 110H are grouped into the super cluster 130. Although 8 clusters are shown in the super cluster 130 on FIG. 3B, the super cluster 130 may include 2, 4, 8, 16, 32 or another number of clusters 110. The super cluster 130 includes a router 134 and a super cluster controller 132, in addition to the plurality of clusters 110. The router 134 is configured to route packets among the clusters 110 and the super cluster controller 132 within the super cluster 130, and to and from computing resources outside the super cluster 130 via a link to an upstream router. In implementations in which the super cluster 130 is used in a processing device 102A, the upstream router for the router 134 is the top level router 104 of the processing device 102A and the router 134 is an upstream router for the router 112 within the cluster 110. In some implementations, the super cluster controller 132 may be configured to implement CCRs, receive and send packets, and implement a fixed-purpose state machine encapsulating packets and memory access to the CCRs. In some cases, the super cluster controller 132 is implemented similar to the way the cluster controller 116 is implemented in a cluster 110. In other implementations, the super cluster 130 is implemented with just the router 134 and does not have a super cluster controller 132.

As noted above, a cluster 110 may include 2, 4, 8, 16, 32 or another number of processing engines 120. FIG. 3A shows an example of a plurality of processing engines 120 that have been grouped into a cluster 110, and FIG. 3B shows an example of a plurality of clusters 110 that have been grouped into a super cluster 130. Grouping of processing engines is not limited to clusters or super clusters. In some implementations, more than two levels of grouping is implemented and each level has its own router and controller.

Figure 4:
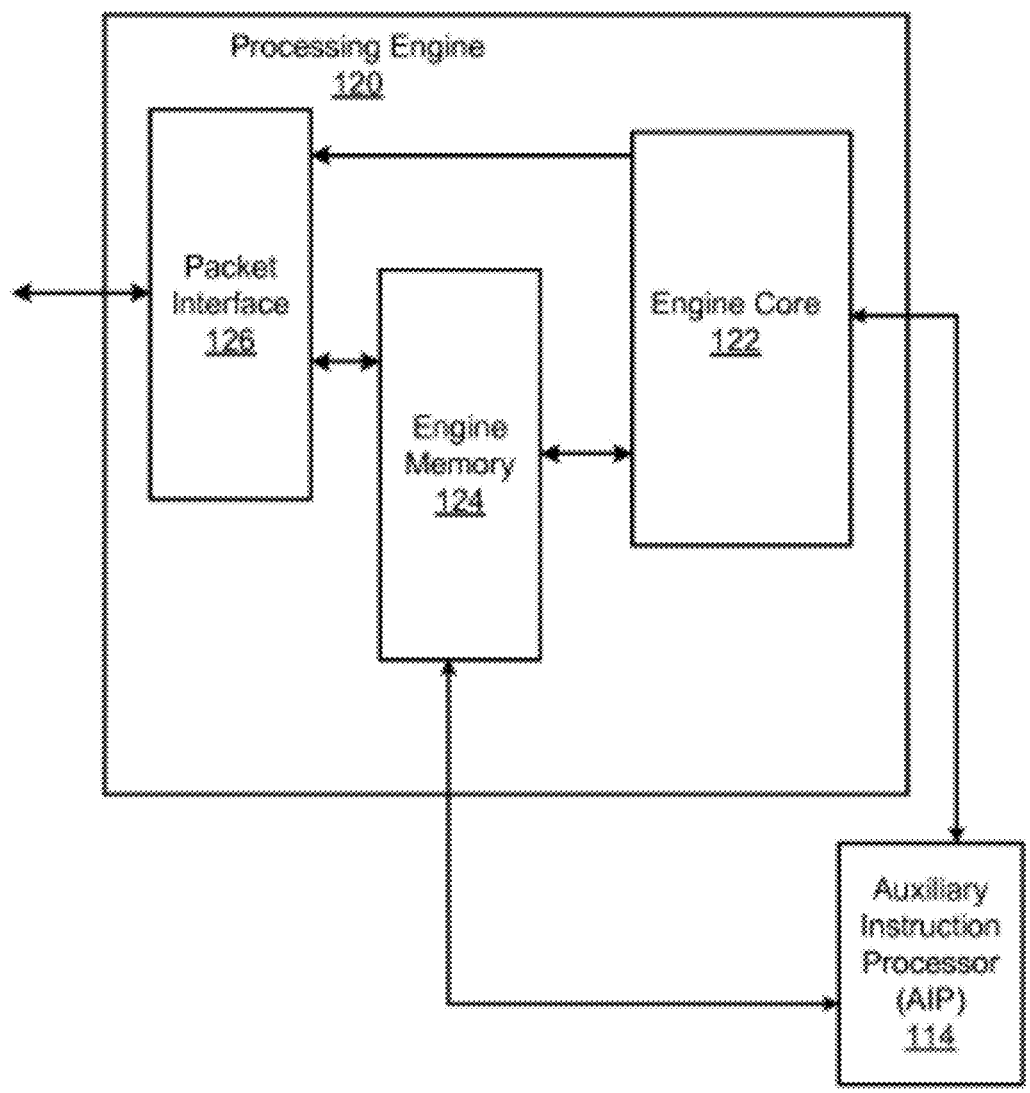
FIG. 4 is a block diagram of an example of a processing engine of a cluster.

FIG. 4 shows a block diagram of an example of a processing engine 120 of a processing device 102. In the example shown in FIG. 4, the processing engine 120 includes an engine core 122, an engine memory 124 and a packet interface 126. Here, the processing engine 120 is directly coupled to an AIP 114. As described above, the AIP 114 may be shared by all processing engines 120 within a cluster 110. In some implementations, the processing core 122 is a central processing unit (CPU) with an instruction set and implements some or all features of modern CPUs, such as, for example, a multi-stage instruction pipeline, one or more arithmetic logic units (ALUs), one or more floating point units (FPUs) or any other CPU technology. The instruction set includes one instruction set for the ALU to perform arithmetic and logic operations, and another instruction set for the FPU to perform floating point operations. In some cases, the FPU is a completely separate execution unit containing a multi-stage, single-precision floating point pipeline. When an FPU instruction reaches the instruction pipeline of the processing engine 120, the instruction and its source operand(s) are dispatched to the FPU.

The instructions of the instruction set may implement the arithmetic and logic operations and the floating point operations, such as those in the INTEL® x86 instruction set, using a syntax similar or different from the x86 instructions. In some implementations, the instruction set includes customized instructions. For example, one or more instructions are implemented according to the features of the computing system 100 and in accordance with network on a chip architecture. In one example, one or more instructions cause the processing engine executing the instructions to generate packets directly with system wide addressing. In another example, one or more instructions have a memory address located anywhere in the computing system 100 as an operand. In the latter example, a memory controller of the processing engine executing the instruction generates packets according to the memory address being accessed.

The engine memory 124 includes a program memory, a register file including one or more general purpose registers, one or more special registers and one or more events registers. In some implementations, the program memory is a physical memory for storing instructions to be executed by the processing core 122 and data to be operated upon by the instructions. In some cases, portions of the program memory are disabled and powered down for energy savings. For example, a top half or a bottom half of the program memory is disabled to save energy when executing a program small enough that half or less of the storage may be needed. The size of the program memory may be 1 thousand (1K), 2K, 3K, 4K, or any other number of storage units. The register file may include 128, 256, 512, 1024, or any other number of storage units. In some implementations, the storage unit is 32-bit wide, which may be referred to as a longword, and the program memory includes 2K 32-bit longwords and the register file includes 256 32-bit registers.

In some implementations, the register file includes one or more general purpose registers and special registers for the processing core 122. The general purpose registers serve functions that are similar or identical to the general purpose registers of an x86 architecture CPU. The special registers are used for configuration, control and/or status, for instance. Examples of special registers include one or more of the following registers: a next program counter, which may be used to point to the program memory address where the next instruction to be executed by the processing core 122 is stored; and a device identifier (DEVID) register storing the DEVID of the processing device 102.

In some implementations, the register file is implemented in two banks—one bank for odd addresses and one bank for even addresses—to permit multiple fast accesses during operand fetching and storing. The even and odd banks are selected based on the least-significant bit of the register address if the computing system 100 is implemented in little endian or on the most-significant bit of the register address if the computing system 100 is implemented in big-endian.

In some implementations, the engine memory 124 is part of the addressable memory space of the computing system 100. That is, any storage location of the program memory, any general purpose register of the register file, any special register of the plurality of special registers and any event register of the plurality of events registers is assigned a memory address PADDR. Each processing engine 120 on a processing device 102 is assigned an engine identifier (ENGINE ID), therefore, to access the engine memory 124, any addressable location of the engine memory 124 may be addressed by DEVID:CLSID:ENGINE ID: PADDR. In some cases, a packet addressed to an engine level memory location includes an address formed as DEVID:CLSID: ENGINE ID: EVENTS:PADDR, in which EVENTS is one or more bits to set event flags in the destination processing engine 120. It should be noted that when the address is formed as such, the events need not form part of the physical address, which is still DEVID:CLSID:ENGINE ID:PADDR. In this form, the events bits may identify one or more event registers to be set but these events bits are separate from the physical address being accessed.

In accordance with network on a chip architecture, the packet interface 126 includes a communication port for communicating packets of data. The communication port is coupled to the router 112 and the cluster memory 118 of the local cluster. For any received packets, the packet interface 126 directly passes them through to the engine memory 124. In some cases, a processing device 102 implements two mechanisms to send a data packet to a processing engine 120. A first mechanism uses a data packet with a read or write packet opcode. This data packet is delivered to the packet interface 126 and handled by the packet interface 126 according to the packet opcode. Here, the packet interface 126 includes a buffer to hold a plurality of storage units, for example, 1K, 2K, 4K, or 8K or any other number. In a second mechanism, the engine memory 124 further includes a register region to provide a write-only, inbound data interface, which may be referred to a mailbox. In some implementations, the mailbox includes two storage units that each can hold one packet at a time. Here, the processing engine 120 has an event flag, which is set when a packet has arrived at the mailbox to alert the processing engine 120 to retrieve and process the arrived packet. While this packet is being processed, another packet may be received in the other storage unit, but any subsequent packets are buffered at the sender, for example, the router 112 or the cluster memory 118, or any intermediate buffers.

In various implementations, data request and delivery between different computing resources of the computing system 100 is implemented by packets. FIG. 5 illustrates a block diagram of an example of a packet 140 in accordance with network on a chip architecture. As shown in FIG. 5, the packet 140 includes a header 142 and an optional payload 144. The header 142 includes a single address field, a packet opcode (POP) field and a size field. The single address field indicates the address of the destination computing resource of the packet, which may be, for example, an address at a device controller level such as DEVID:PADDR, an address at a cluster level such as a physical address DEVID:CLSID: PADDR or a virtual address DEVID:CLSID:ADDR, or an address at a processing engine level such as DEVID:CLSID: ENGINE ID:PADDR or DEVID:CLSID:ENGINE ID:E-VENTS:PADDR. The POP field may include a code to indicate an operation to be performed by the destination computing resource. Examples of operations in the POP field may include read (to read data from the destination) and write (to write data (e.g., in the payload 144) to the destination).

In some implementations, examples of operations in the POP field further include bulk data transfer. For example, certain computing resources implement a direct memory access (DMA) feature. Examples of computing resources that implement DMA may include a cluster memory controller of each cluster memory 118, a memory controller of each engine memory 124, and a memory controller of each device controller 106. Any computing resource that implements the DMA may perform bulk data transfer to another computing resource using packets with a packet opcode for bulk data transfer.

In addition to bulk data transfer, the examples of operations in the POP field further include transmission of unsolicited data. For example, any computing resource may generate a status report or incur an error during operation, the status or error is reported to a destination using a packet with a packet opcode indicating that the payload 144 contains the source computing resource and the status or error data.

The POP field may be 2, 3, 4, 5 or any other number of bits wide. In some implementations, the width of the POP field is selected depending on the number of operations defined for packets in the computing system 100. Also, in some embodiments, a packet opcode value can have different meaning based on the type of the destination computing resource that receives it. For example, for a three-bit POP field, a value 001 may be defined as a read operation for a processing engine 120 but a write operation for a cluster memory 118.

In some implementations, the header 142 further includes an addressing mode field and an addressing level field. Here, the addressing mode field contains a value to indicate whether the single address field contains a physical address or a virtual address that may need to be converted to a physical address at a destination. Further here, the addressing level field contains a value to indicate whether the destination is at a device, cluster memory or processing engine level.

The payload 144 of the packet 140 is optional. If a particular packet 140 does not include a payload 144, the size field of the header 142 has a value of zero. In some implementations, the payload 144 of the packet 140 contains a return address. For example, if a packet is a read request, the return address for any data to be read may be contained in the payload 144.

Figure 6:
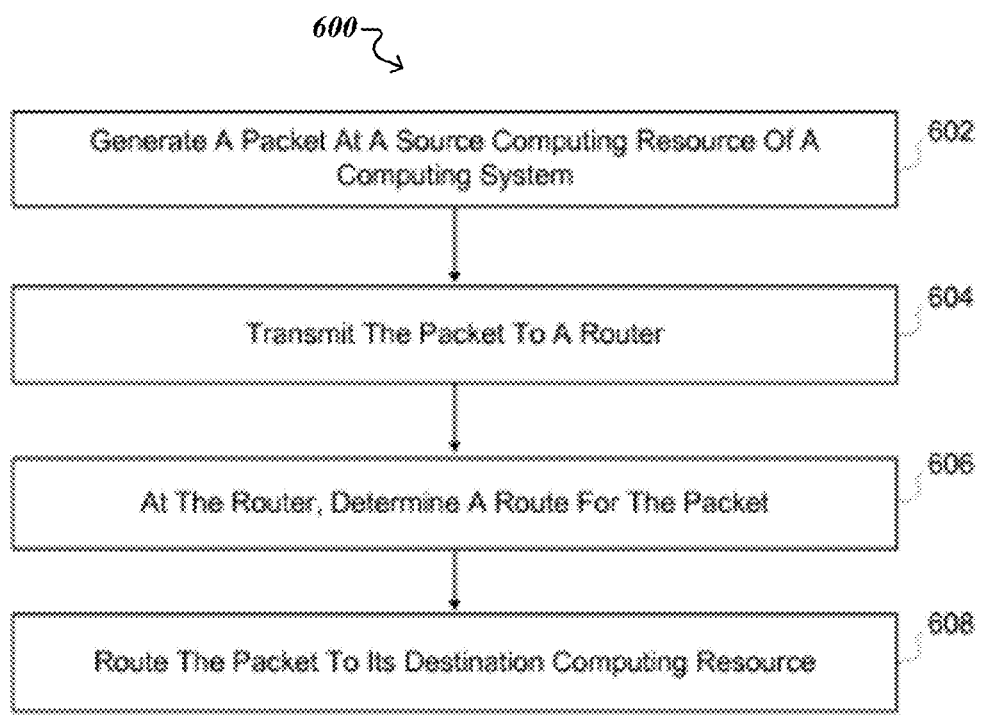
FIG. 6 is a flow diagram showing an example of a process of addressing a computing resource of a computing system using a packet.

FIG. 6 is a flow diagram showing an example of a process 600 of addressing a computing resource of a computing system using a packet in accordance with network on a chip architecture. An implementation of the computing system 100 may have one or more processing devices 102 configured to execute some or all of the operations of the process 600 in response to instructions stored electronically on an electronic storage medium. The one or more processing devices 102 include one or more devices configured through hardware, firmware, and/or software to execute one or more of the operations of the process 600.

The process 600 may start with block 602, at which a packet is generated at a source computing resource of the computing system 100. The source computing resource may be, for example, a device controller 106, a cluster controller 118, a super cluster controller 132 if a super cluster is implemented, an AIP 114, a memory controller for a cluster memory 118, or a processing engine 120. The generated packet may be the packet 140 described above in connection with FIG. 5. From block 602, the process 600 may continue to the block 604, where the packet is transmitted to an appropriate router based on the source computing resource that generated the packet. For example, if the source computing resource is a device controller 106, the generated packet is transmitted to a top level router 104 of the local processing device 102; if the source computing resource is a cluster controller 116, the generated packet is transmitted to a router 112 of the local cluster 110; if the source computing resource is a memory controller of the cluster memory 118, the generated packet is transmitted to a router 112 of the local cluster 110, or a router downstream of the router 112 if there are multiple cluster memories 118 coupled together by the router downstream of the router 112; and if the source computing resource is a processing engine 120, the generated packet is transmitted to a router of the local cluster 110 if the destination is outside the local cluster and to a memory controller of the cluster memory 118 of the local cluster 110 if the destination is within the local cluster.

At block 606, a route for the generated packet is determined at the router. As described above, the generated packet includes a header that includes a single destination address. The single destination address is any addressable location of a uniform memory space of the computing system 100. The uniform memory space is an addressable space that covers all memories and registers for each device controller, cluster controller, super cluster controller if a super cluster is implemented, cluster memory and processing engine of the computing system 100. In some cases, the addressable location is part of a destination computing resource of the computing system 100. The destination computing resource may be, for example, another device controller 106, another cluster controller 118, a memory controller for another cluster memory 118, or another processing engine 120, which is different from the source computing resource. The router that received the generated packet determines the route for the generated packet based on the single destination address. At block 608, the generated packet is routed to its destination computing resource.

Figure 7A:
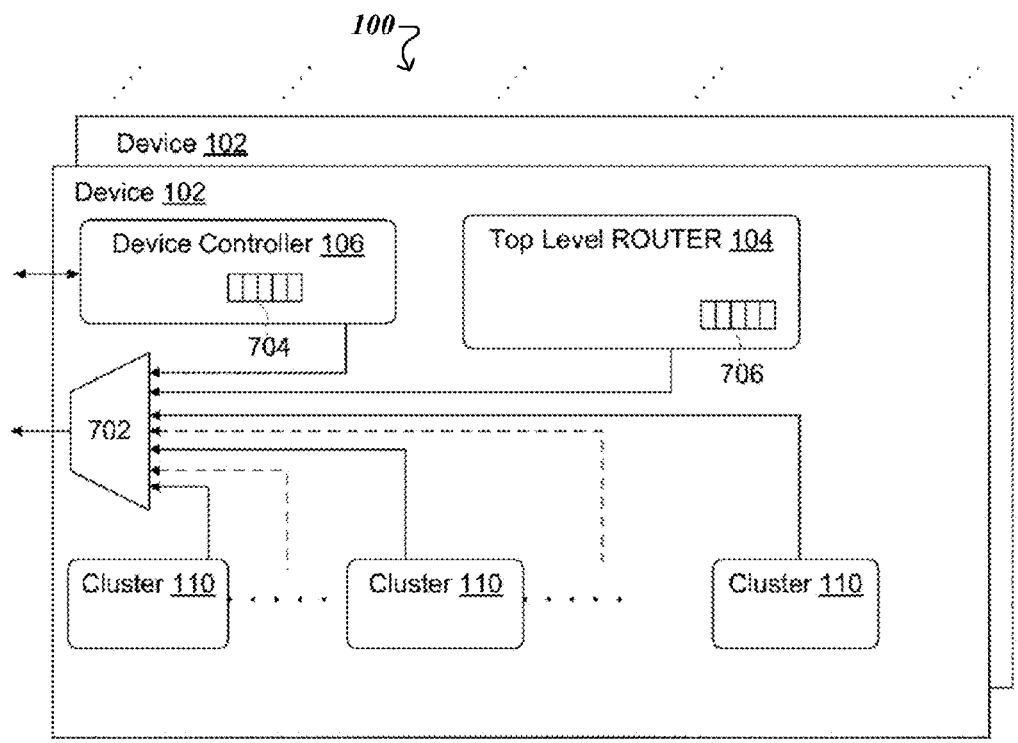
FIG. 7A is a block diagram of an example of a computing system with system control and monitoring features.
Figure 7B:
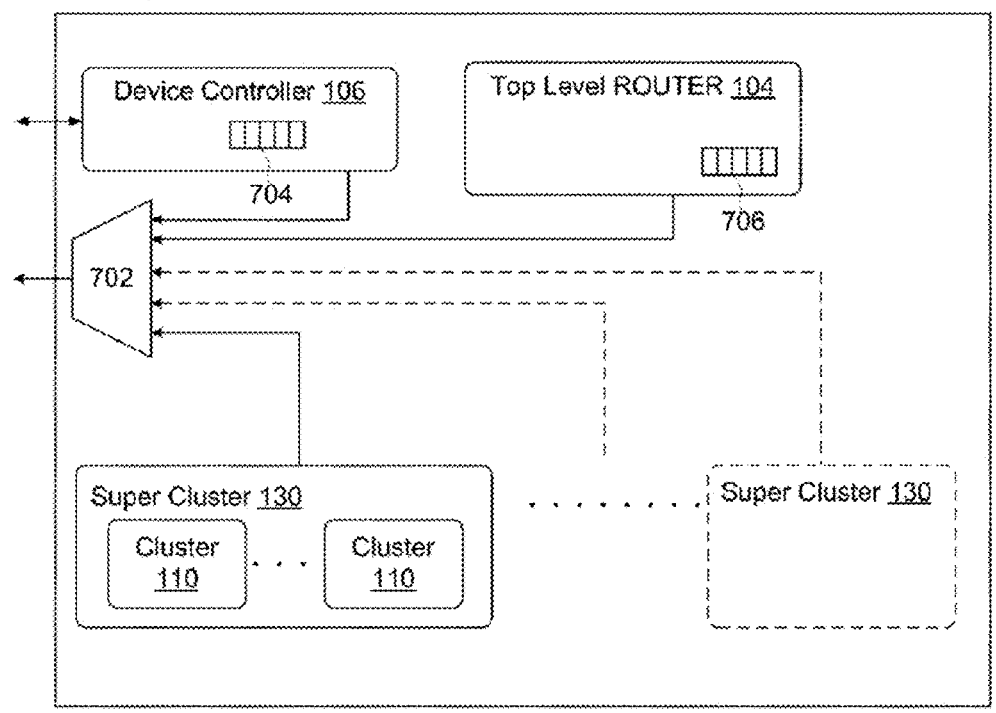
FIG. 7B is a block diagram of an example of a processing device with system control and monitoring features.

Each processing device 102 may also implement a system control and monitoring functionality. FIG. 7A shows the computing system 100 with system activity monitoring (SAM) features implemented at the processing device level according to the present disclosure. FIG. 7B shows a processing device 102A with system control and monitoring features according to the present disclosure. As shown on FIG. 7A, each processing device 102 may implement SAM features at the processing device level. The device level SAM features may include a SAM instrument 704 for the device controller 106, a SAM instrument 706 for the top level router 104, and a multiplexer 702. The multiplexer 702 may be configured to output SAM data from the processing device 102. The SAM data may be collected by the SAM instruments 704, 706, and SAM instruments within a cluster and super cluster (if the super cluster is implemented). The inputs of the multiplexer 702 may be coupled to the device controller 106, top level router 104, and clusters 110 (or super clusters 130 as shown in FIG. 7B if super clusters are implemented) to receive SAM data and may be controlled to select one of the SAM data inputs to output from the processing device 102. In one embodiment, a host of the computing system 100 may control the SAM data to output from the multiplexer 702 and the host may collect the SAM data from all processing devices 102 for analysis.

Figure 7C:
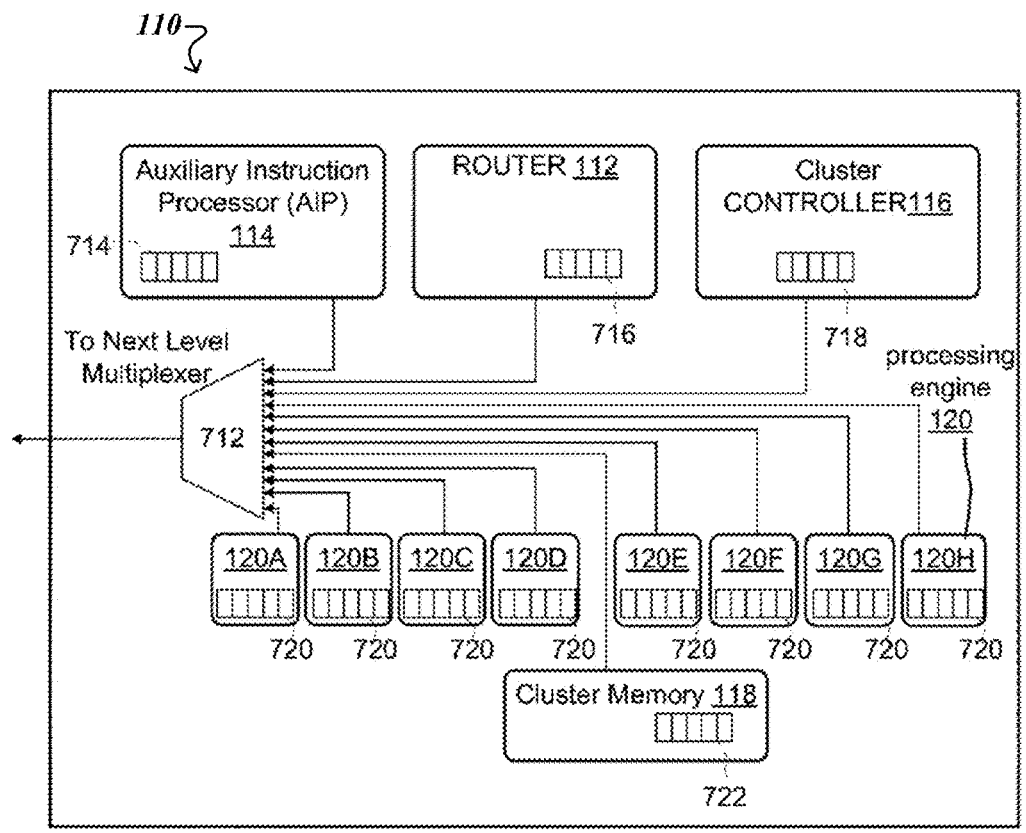
FIG. 7C is a block diagram of an example of a cluster with system control and monitoring features.

FIG. 7C shows a cluster 110 with SAM features according to the present disclosure. As shown on FIG. 7C, the cluster 110 may include a multiplexer 712, a SAM instrument 714 for the AIP 114, a SAM instrument 716 for the router 112, a SAM instrument 718 for the cluster controller 116, a SAM instrument 722 for the cluster memory 118, and a SAM instrument 720 for each of the processing engines 120 respectively. The SAM data of the cluster 110 may be collected by the SAM instruments 714, 716, 718, 720 and 722 within the cluster 110. The inputs of the multiplexer 712 may be coupled to the AIP 114, router 112, cluster controller 116, cluster memory 118 and all processing engines 120 to receive SAM data and may be controlled to select one of the SAM data inputs to output from the cluster 110. In one embodiment, a host of the computing system 100 may control the SAM data to output from the multiplexer 712 and propagate to the next level multiplexer. For example, in a processing device 102 without a super cluster, the next level multiplexer for the multiplexer 712 may be the multiplexer 702.

Figure 7D:
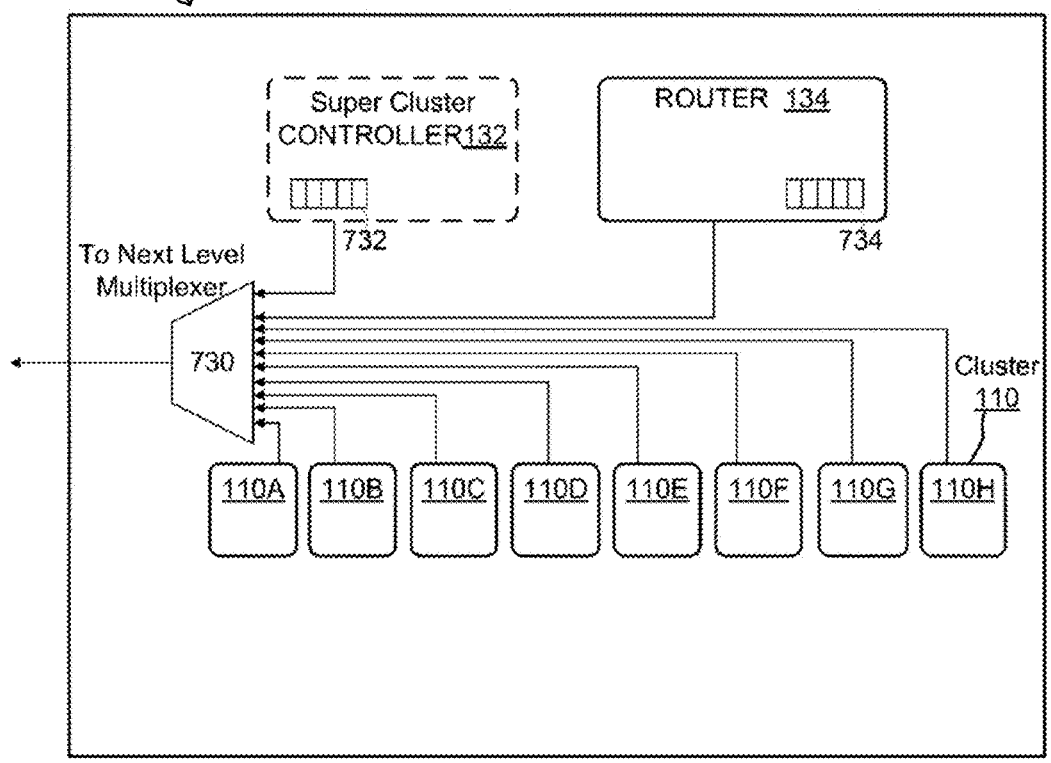
FIG. 7D is a block diagram of an example of a super cluster with system control and monitoring features.

FIG. 7D shows a super cluster 130 with SAM features according to the present disclosure. The SAM features of the super cluster 130 may include a multiplexer 730, a SAM instrument 732 for the super cluster controller 132 and a SAM instrument 734 for the router 134. The multiplexer 730 may be the next level multiplexer for the multiplexers 712 within the clusters 110A through 110H. The inputs of the multiplexer 730 may be coupled to the super cluster controller 132, the router 134 and clusters 110A through 110H to receive SAM data and may be controlled to select one of the SAM data inputs to output from the super cluster 130. In one embodiment, a host of the computing system 100 may control the SAM data to output from the multiplexer 730 and propagate to the next level multiplexer. For example, in a processing device 102 with one level of super clusters, the next level multiplexer may be the multiplexer 702. It should be noted that the super cluster controller 132 may be optional, and in one embodiment the super cluster controller 132 may not be implemented and thus is shown in dashed lines.

Each of the SAM instruments 704, 706, 714, 716, 718, 720, 722, 732 and 734 may include one or more counters, one or more registers, and/or some non-volatile storage (for example, a plurality of registers or flash memory), respectively. Examples of counters may include a counter counting how many packets have been sent by a computing resource and/or how many packets have been received by a computing resource. Examples of registers may include a register storing a programmable threshold of time for a counting period for a SAM counter. An example of usage of a non-volatile storage may include storing a programmable threshold of time for a counting period for a SAM counter (e.g., to be used during system start up). Although not shown, a processing device 102 may include other SAM instruments, for example, signal lines for controlling the multiplexers 702, 712 and 730, registers that may at least temporarily save some configuration parameters for SAM instruments 704, 706, 714, 716, 718, 720, 722, 732 and 734, and multiplexers 702, 712 and 730.

In one embodiment, for example, one or more counters of a SAM instrument 706 may be used to count how many packets may be received at an ingress port during a beginning time and an end time, how many packets may be sent to an egress port during a beginning time and an end time, and/or how many packets may be received from (or sent to) an internal port coupled to a cluster 110 (or a super cluster 130 if the super cluster is implemented) during a beginning time and an end time, etc. The information collected by the counters may also include, for example, the identity of the destination computing resource and/or the identity of the sender computing resource. Each of the destination and/or sender computer resources may be a cluster 110 (or super cluster 130 if the super cluster is implemented) or the device controller 106 on the processing device 102, or another processing device 102. The ports to be monitored, the beginning and end times, and any additional information to be collected, may be programmable. In one embodiment, the parameters specifying the information needed to be collected by the counters may be programmed in the registers of the SAM instrument 706 at run time and may be capable of being updated from time to time. For example, a host of the computing system 100 may send instructions to a processing device 102 to program the SAM instruments on the processing device 102. The instructions may contain the parameters for information to be collected and may be sent from time to time.

The communications for the SAM data, such as the one-directional links in FIGS. 7A, 7B, 7C, and 7D, may be a data path separate from the data path for packet delivery. In one embodiment, the multiplexers 702, 712 and 730 may be controlled to select which SAM data to output. For example, at any time during the operation of the computing system 100, the multiplexers 702, 712 and 730 may be controlled to output SAM data from certain processing engine(s), cluster(s), super cluster(s) (if implemented) or processing device(s). In another embodiment, the multiplexers may be controlled to rotate through all processing engine(s), cluster(s), super cluster(s) (if implemented) or processing device(s), for example, in a round-robin manner. In one embodiment, SAM data may be aggregated by a host of the computing system 100 so that the host may generate a holistic view of activities and performance for the computing system 100 at or near real time. The performance information may be used by the host to diagnose system performance. For example, the host may implement hardware and/or software to collect and analyze the performance information from all processing engines, all clusters, all super clusters (if they are implemented) and all processing devices of the computing system 100. In addition to performance analysis, the SAM data may also help with hardware debug, software debug, runtime debug, in-device performance analysis and cross-device performance analysis.

Although the SAM instruments 704, 706, 714, 716, 718, 720, 732 and 734 are shown with their respective computing resources device controller 106, top level router 104, AIP 114, router 112, cluster controller 116, processing engine 120, super cluster controller 132 and router 134, in one embodiment, these SAM instruments may be located outside their respective computing resources. In such an embodiment, the inputs to the multiplexers 702, 712 and 730 may be coupled to those SAM instruments directly without being coupled to the respective computing resources.

Figure 8:
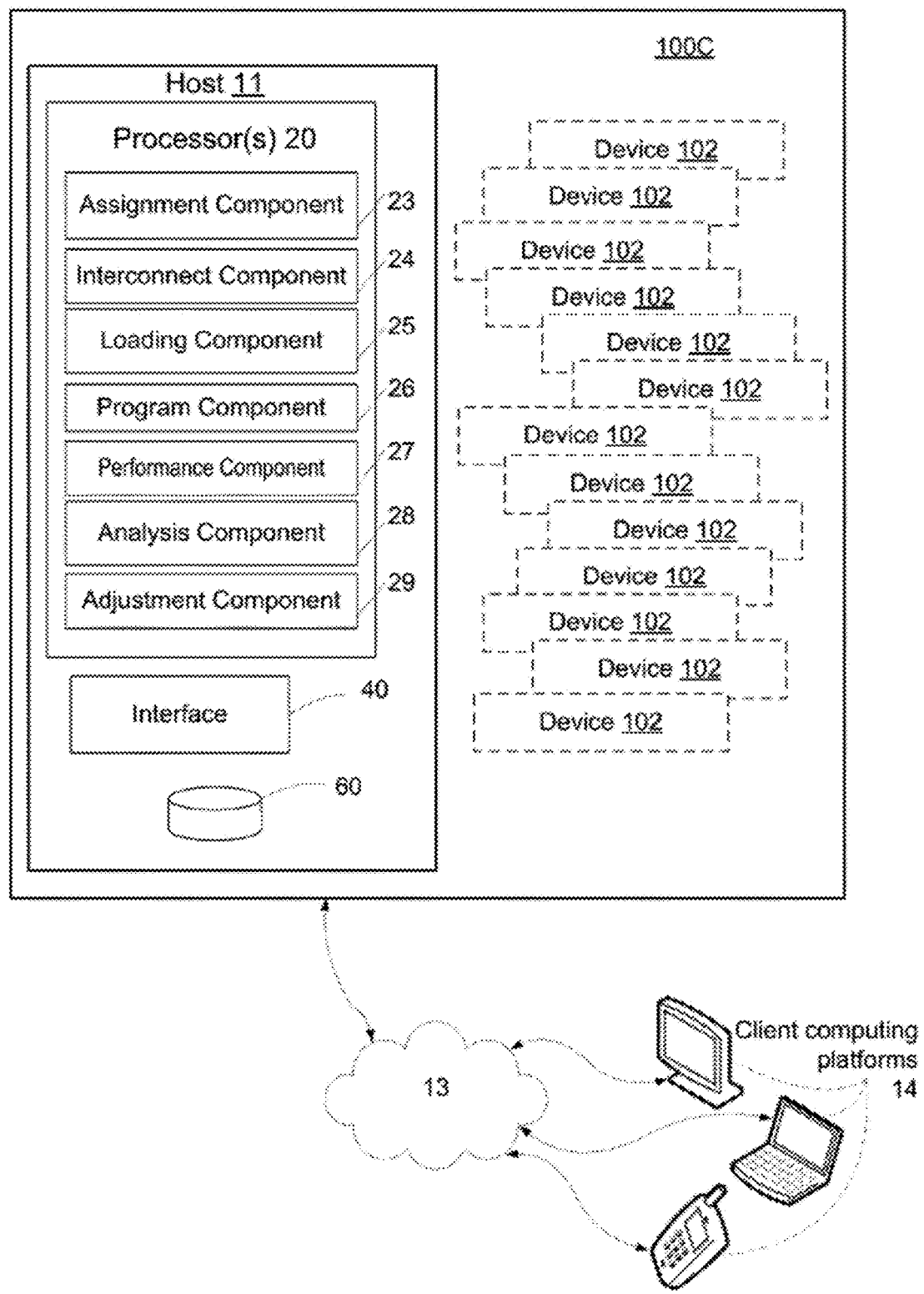
FIG. 8 shows a host configured to assign computation tasks in an example of a computing system.

FIG. 8 illustrates an example of a host 11 configured to assign computation tasks in a computing system 100C according to the present disclosure. The computing system 100C may be an example of the computing system 100 and may implement all features of the computing system 100 described herein. The host 11 may be an example of a host for the computing system 100 and may implement all features of a host of the computing system 100 described herein. As depicted in FIG. 8, the computing system 100C may include a plurality of processing devices 102 in addition to the host 11. The number of processing devices 102 may be as low as a couple or as high as hundreds of thousands, or even higher limited only by the width of DEVID. The exact number of processing devices 102 is immaterial and thus, the processing devices 102 are shown in phantom. The host 11 may include one or more processors 20, a physical storage 60, and an interface 40. In one embodiment, the topology and/or interconnections within the computing system 100C may be fixed. In another embodiment, the topology and/or interconnections within the computing system 100C may be programmable.

Interface 40 may be configured to provide an interface between the computing system 100C and a user (e.g., a system administrator) through which the user can provide and/or receive information. This enables data, results, and/or instructions and any other communicable items, collectively referred to as "information," to be communicated between the user and the computing system 100C. Examples of interface devices suitable for inclusion in interface 40 include a keypad, buttons, switches, a keyboard, knobs, levers, a display screen, a touch screen, speakers, a microphone, an indicator light, an audible alarm, and a printer. Information may be provided by interface 40 in the form of auditory signals, visual signals, tactile signals, and/or other sensory signals.

It is to be understood that other communication techniques, either hard-wired or wireless, are also contemplated herein as interface 40. For example, in some implementations, interface 40 may be integrated with physical storage 60. In this example, information is loaded into computing system 100C from storage (e.g., a smart card, a flash drive, a removable disk, etc.) that enables the user(s) to customize the implementation of computing system 100C. Other examples of input devices and techniques adapted for use with computing system 100C as interface 40 include an RS-232 port, RF link, an IR link, modem (telephone, cable, Ethernet, internet or other). In short, any technique for communicating information with computing system 100C is contemplated as interface 40.

One or more processors 20 (interchangeably referred to herein as processor 20) may be configured to execute computer program components. The computer program components may include an assignment component 23, an interconnect component 24, a loading component 25, a program component 26, a performance component 27, an analysis component 28, an adjustment component 29, and/or other components. The functionality provided by components 23-29 may be attributed for illustrative purposes to one or more particular components of computing system 100C.

Figure 10A:
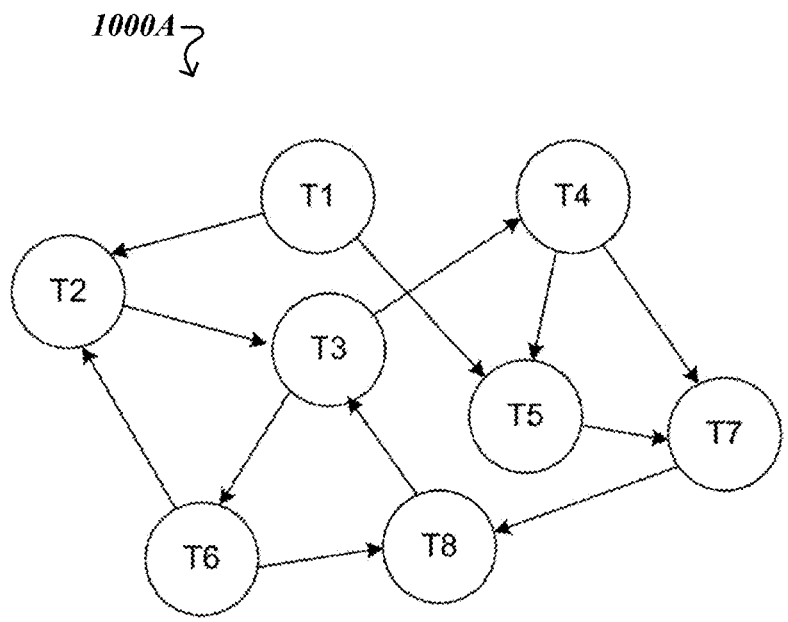
FIG. 10A shows a directed graph representation of a computing problem and/or a software application.

The functionality provided by components 23-29 may be used to load and execute one or more computer applications, including one or more computer test applications, one or more computer web server applications, or one or more computer database management applications. For example, an application could include software-defined radio (SDR) or some representative portion thereof. For example, a test application could be based on an application such as SDR, for example by scaling down the scope to make testing easier and/or faster. Other applications are considered within the scope of this disclosure. For example, a SDR application may include one or more of a mixer, a filter, an amplifier, a modulator, a demodulator, a detector, and/or other tasks and/or components that, when interconnected, may form an application. For example, FIG. 10A illustrates a computing problem and/or an application that includes a set of functional processing elements that form a directed graph representation. The functional processing elements may be labeled T1-T8. Directional links within the directed graph may represent data exchange between functional processing elements. The set of functional processing elements as depicted in FIG. 10A may correspond to a set of interconnected tasks. In one embodiment, such division of tasks may be created by software programmers when one or more modules may be created for a software application.

Assignment component 23 may be configured to assign one or more computing resources within the computing system 100C to perform one or more tasks. The computing resources that may be assigned tasks may include processing devices 102, clusters 110, super clusters 130 (if super clusters are implemented), and/or processing engines 120. In some implementations, assignment component 23 may be configured to perform assignments in accordance with and/or based on a particular routing. For example, a routing may limit the number of processing devices 102 and/or processing engines 120 that are directly connected to a particular processing engine 120. In some implementations, for example, the routing of a network of processing devices 102 may be fixed (i.e. the hardware connections between different processing devices 102 may be fixed), but the assignment of particular tasks to specific computing resources may be refined, improved, and/or optimized in pursuit of higher performance. In some implementations, for example, the routing of a network of processing engines 102 may not be fixed (i.e. programmable between iterations of performing an assignment and determining the performance of a particular assignment), and the assignment of particular tasks to specific processing devices 102 and/or processing engines 120 may also be adjusted, e.g. in pursuit of higher performance.

Figure 10B:
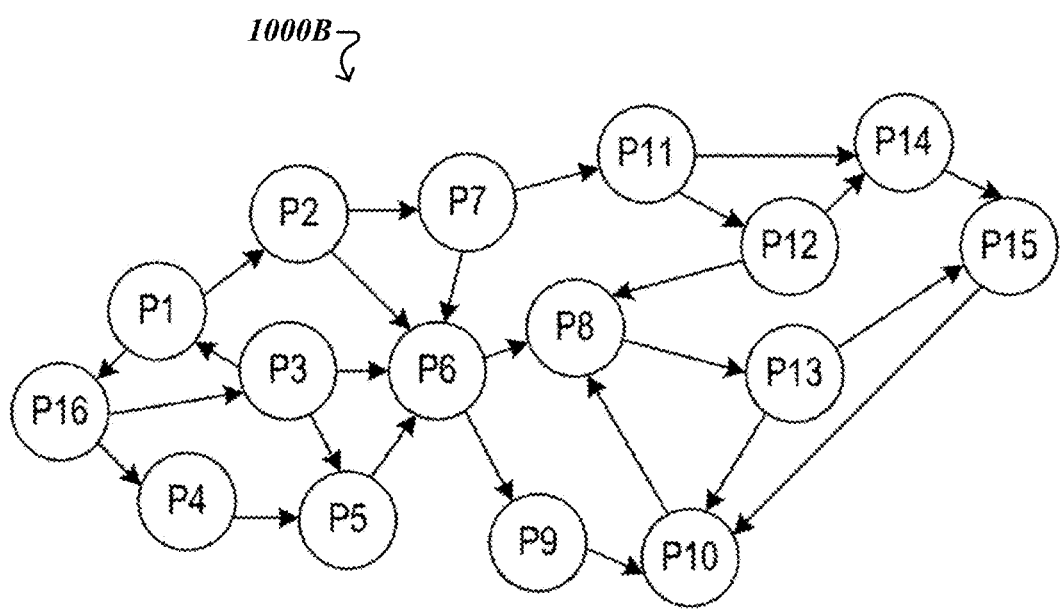
FIG. 10B shows a directed graph representation of a set of physical processing elements that corresponds to an implementation and/or assignment of a computing problem and/or a software application.

Assignment component 23 may be configured to determine and/or perform assignments repeatedly, e.g. in the pursuit of higher performance. As used herein, any association (or correspondence) involving applications, processing resources, tasks, and/or other entities related to the operation of a computing system 100C described herein, may be a one-to-one association, a one-to-many association, a many-to-one association, and/or a many-to-many association or N-to-M association (note that N and M may be different numbers greater than 1). For example, assignment component 23 may assign one or more computing resources to perform the task of one or more mixers of an SDR application. For example, FIG. 10B illustrates a set of physical processing elements that form a directed graph representation that corresponds to a computing problem and/or a software application the same as or similar to the depiction in FIG. 10A. Referring to FIG. 10B, the physical processing elements are labeled P1-P16 as depicted. In one embodiment, the physical processing elements may correspond to processing devices 102. In another embodiment, the physical processing elements may correspond to processing engines 120. In yet another embodiment, the physical processing elements may correspond to clusters 110. In still another embodiment, the physical processing elements may correspond to super clusters 130 if super clusters are implemented. Combinations including one or more processing engines 120, clusters 110, super clusters 130, and one or more processing devices 102 may be envisioned within the scope of this disclosure. Referring to FIG. 10B, directional links within the directed graph may represent data exchange and/or a physical communication connection between physical processing elements. The set of physical processing elements as depicted in FIG. 10B may correspond to a set of processing engines 120, clusters 110, super clusters 130 (if super clusters are implemented) and/or processing devices 102 as assigned by assignment component 23.

Interconnect component 24 may be configured to obtain and/or determine interconnections between the physical processing elements to support an assignment by assignment component 23. A set of determined interconnections may be referred to as a routing. In one embodiment, interconnect component 24 may be configured to determine interconnections between individual ones of a set of computing resources such that interconnections and/or relations among a set of interconnected tasks correspond to an assignment by assignment component 23.

Figure 10C:
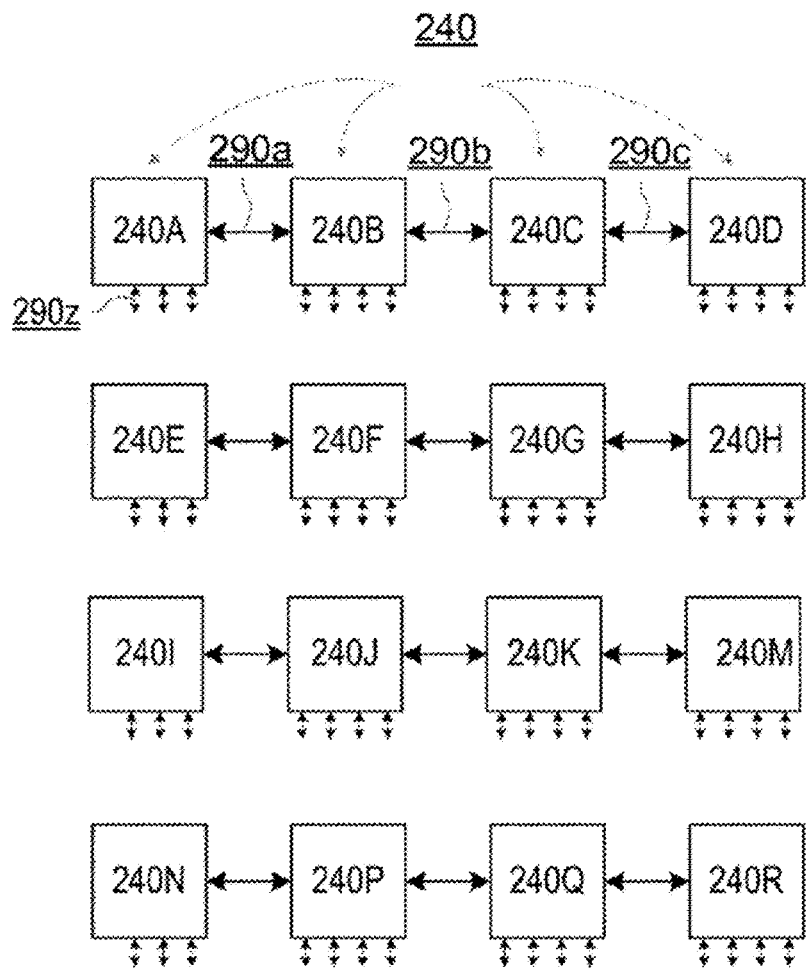
FIG. 10C shows a network of interconnected physical processing elements.

For example, FIG. 10C illustrates physical processing elements that form a network that corresponds to a set of interconnections that support an assignment of a set of physical processing elements the same as or similar to the depiction in FIG. 10B. Referring to FIG. 10C, the set of physical processing elements is labeled 240 and the individual physical processing elements are labeled 240A-240R, as depicted. In some implementations, the physical processing elements may correspond to processing devices 102, clusters 110, super clusters 130 (if super clusters are implemented), processing engines 120, and/or any combination thereof. Referring to FIG. 10C, arrows within the network (including connections 290a, 290b, 290c, and 290z) may represent data exchange and/or a physical communication connection between physical processing elements. For example, connection 290a may represent communication between physical processing elements 240A and 240B, connection 290b may represent communication between physical processing elements 240B and 240C, connection 290c may represent communication between physical processing elements 240C and 240D, connection 290z may represent communication between physical processing elements 240A and another element depicted in FIG. 10C, and so forth for any arrows depicted in FIG. 10C. The set of physical processing elements as depicted in FIG. 10C may correspond to a set of interconnections as determined by interconnect component 24.

Returning to FIG. 8, loading component 25 may be configured to load and/or program state, functions and/or connections into computing system 100C and/or its components. State may include instructions, information regarding interconnections with other processing devices 102, clusters 110, super clusters 130 (if super clusters are implemented), and/or set of processing engines 120, and/or other information needed to execute a particular task. The instructions may include instructions the generate signals that are indicative of occurrences of particular events within processing engines 120, clusters 110, super clusters 130 (if super clusters are implemented), and/or processing devices 102. In some implementations, the state may be determined by program component 26. In some implementations, loading component 25 may be configured to load and/or program a set of processing engines 120, clusters 110, super clusters 130 (if super clusters are implemented), and/or processing devices 102, a set of interconnections, as determined by interconnect component 24, and/or additional functionality into computing system 100C. For example, additional functionality may include input processing, memory storage, data transfer within one or more processing devices 102, data transfer within one or more clusters 110 or super clusters 130, output processing, and/or other functionality. In some implementations, loading component 25 may be configured to execute (at least part of) applications, e.g. responsive to functions and/or connections being loaded into computing system 100C and/or its components.

Program component 26 may be configured to determine state for processing devices 102, clusters 110, super clusters 130 (if super clusters are implemented), and/or processing engines 120. The particular state for a particular cluster 110, super cluster 130 (if super clusters are implemented), or processing engine 120 may be in accordance with an assignment and/or routing from another component of system 100C. In some implementations, program component 26 may be configured to program and/or load instructions and/or state into one or more clusters 110, super clusters 130 (if super clusters are implemented), and/or processing engines 120. In some implementations, programming individual processing engines 120, clusters 110, super clusters 130 (if super clusters are implemented), and/or processing devices 102 may include setting and/or writing control registers, for example, CCRs for cluster controllers 116 and super cluster controllers 132, control registers within the device controller 106, or control registers within the processing engines 120.

Performance component 27 may be configured to determine performance parameters of computing system 100C, one or more processing devices 102, one or more clusters 110, one or more super clusters 130 (if super cluster is implemented), one or more processing engines 120, and/or other configurations or combinations of processing elements described herein. In some implementations, one or more performance parameters may indicate the performance of assignment, and/or routing as performed by assignment component 23, interconnect component 24, and/or other components. For example, one or more performance parameters may indicate (memory/computation/communication-) bottlenecks, speed, delays, and/or other characteristics of performance. In some implementations, performance may be associated with a particular application, e.g. a test application. In addition, other information being collected may include how often a computing resource may need to coordinate its processing with any other computing resources, the latency for communication between computing resources while they coordinate their respective processing, whether some computing resources may be idle while some other computing resources with assigned tasks may have to wait.

In some implementations, one or more performance parameters may be based on signals generated within and/or by one or more processing engines 120, one or more processing devices 102, one or more cluster controllers 116, one or more super cluster controllers 132, one or more various levels of routers, and/or other components of computing system 100C. For example, the generated signals may be indicative of occurrences or events within a particular component of computing system 100C, as described elsewhere herein. By virtue of the signaling mechanisms (e.g., SAM data collection) described in this disclosure, the performance of (different configurations of) multi-core processing systems may be monitored, determined, and/or compared.

Analysis component 28 may be configured to analyze performance parameters. In some implementations, analysis component 28 may be configured to compare performance of different configurations of multi-core processing systems, different ways to divide an application into a set of interconnected tasks by a programmer (or a compiler, or an assembler), different assignments by assignment component 23, different routings by interconnect component 24, and/or other different options used during the configuration, design, and/or operation of a multi-core processing system.

In some implementations, analysis component 28 may be configured to indicate a bottleneck and/or other performance issue in terms of memory access, computational load, and/or communication between multiple processing elements/engines. For example, one task may be loaded on a processing engine and executed on it. If the processing engine is kept busy (e.g., no event signal of idleness) for a predetermined amount of time, then the task may be identified as a computation intensive task and a good candidate to be executed in parallel, such as being executed in two or more processing engines. In another example, two processing engines may be assigned to execute some program code respectively (could be one task split between the two processing engines, or each processing engine executing one of two interconnected tasks). If each of the two processing engines spends more than a predetermined percentage of time (e.g., 10%, 20%, 30% or another percentage, which may be programmable) waiting on other processing engine (e.g., for data or an event signal), then the program code may be identified as communication intensive task(s) and a good candidate to be executed on a single processing engine, or moved to be closer (such as two processing engines in one cluster, two processing engines in one super cluster, or two processing engines in one processing device).

Adjustment component 29 may be configured to determine adjustments to the configuration, design, and/or operation of a multi-core processing system, e.g. based on an analysis carried out by analysis component 28. Adjustments may involve one or more of a different assignment by assignment component 23, a different routing by interconnect component 24, and/or other different options used during the configuration, design, and/or operation of a multi-core processing system. Adjustments may be guided by a user, by an algorithm that is based on one or more particular performance parameters, by heuristics based on general design principles, and/or by other ways to guide step-wise refinement of multi-core processing performance. In some implementations, one or more operations performed by the components of computing system 100C may be performed iteratively and/or repeatedly in order to find and/or determine higher levels of performance.

In some implementations, determination of adjustments may be based on a simulated annealing processes, which may also be referred to as a synthetic annealing process. In one embodiment, the adjustment component 29 may implement part or all functionalities of an example of a simulated annealing process. For example, after an adjustment has been made, the performance data may be collected on the adjusted configuration and analyzed. If an adjustment has improved the performance, the adjustment may be kept and other adjustment may be tried. If an adjustment has not improved the performance, the adjustment may be rolled back. In one embodiment, this process may be repeated until one or more performance goals are achieved. The performance goals may include absolute requirements or may be relative. For example, an absolute requirement may specify a predetermined number of operations per second and a relative performance goal may be a number of consecutive iterations (e.g., 2, 3, 4, or more) that provide an improvement of less than a certain percentage (e.g., 5%, 10%, 15% or a different percentage).

Simulated annealing techniques may also be used in the simulated annealing processes according to the present disclosure. For example, in some cases, annealing may introduce noise (e.g. random assignments of a particular processing engine 120 or processing device 102 to a particular task) in order to avoid localized optimizations in pursuit of global optimizations (i.e. noise may be introduced to avoid a local performance maximum/optimum among a range of options in configuring, assigning, routing, etc. of computing system 100C). In some implementations, adjustments to an assignment and/or a routing may include merging two tasks from the set of interconnected tasks into one new task. In some implementations, adjustments to an assignment and/or a routing may include splitting an individual task from the set of interconnected tasks into two new tasks. In some implementations, adjustments to an assignment and/or routing may include swapping tasks between two processing engines.

Referring to FIG. 8, one or more processors 20 may be configured to provide information-processing capabilities in computing system 100C and/or host 11. As such, processor 20 may include one or more of a digital processor, an analog processor, a digital circuit designed to process information, an analog circuit designed to process information, a state machine, and/or other mechanisms for electronically processing information. Although processor 20 may be shown in FIG. 8 as a single entity, this is for illustrative purposes only. In one embodiment, processor 20 may include a plurality of processing units. For example, each processor 20 may be a processing device 102 or a processor of a different type as described herein. These processing units may be physically located within the same physical apparatus, or processor 20 may represent processing functionality of a plurality of apparatuses operating in coordination (e.g., "in the cloud", and/or other virtualized processing solutions).

It should be appreciated that although components 23-29, are illustrated in FIG. 8 as being co-located within a single processing unit, in implementations in which processor 20 includes multiple processing units, one or more of components 23-29 may be located remotely from the other components. Any of components 23-29 may provide more or less functionality than is described. For example, one or more of components 23-29 may be eliminated, and some or all of its functionality may be provided by other ones of components 23-29. As another example, processor 20 may be configured to execute one or more additional components that may perform some or all of the functionality attributed herein to one of components 23-29.

Physical storage 60 of computing system 100C in FIG. 8 may include electronic storage media that stores information. In some implementations, physical storage 60 may store representations of computer program components, including instructions that implement the computer program components. The electronic storage media of physical storage 60 may include one or both of system storage that is provided integrally (i.e., substantially non-removable) with host 11 and/or removable storage that is removably connectable to host 11 via, for example, a port (e.g., a USB port, a FIREWIRE port, etc.) or a drive (e.g., a disk drive, etc.). Physical storage 60 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), network-attached storage (NAS), and/or other electronically readable storage media. Physical storage 60 may include virtual storage resources, such as storage resources provided via a cloud and/or a virtual private network. Physical storage 60 may store software algorithms, information determined by processor 20, information received via client computing platforms 14, and/or other information that enable host 11 and computing system 100C to function properly. Physical storage 60 may be one or more separate components within system 100C, or physical storage 60 may be provided integrally with one or more other components of computing system 100C (e.g., processor 20).

Users may interact with system 100C through client computing platforms 14. For example, client computing platforms may include one or more of a desktop computer, a laptop computer, a handheld computer, a NetBook, a Smartphone, a tablet, a mobile computing platform, a gaming console, a television, a device for streaming internet media, and/or other computing platforms. Interaction between the system 100C and client computing platforms may be supported by one or more networks 13, including the Internet.

Figure 9:
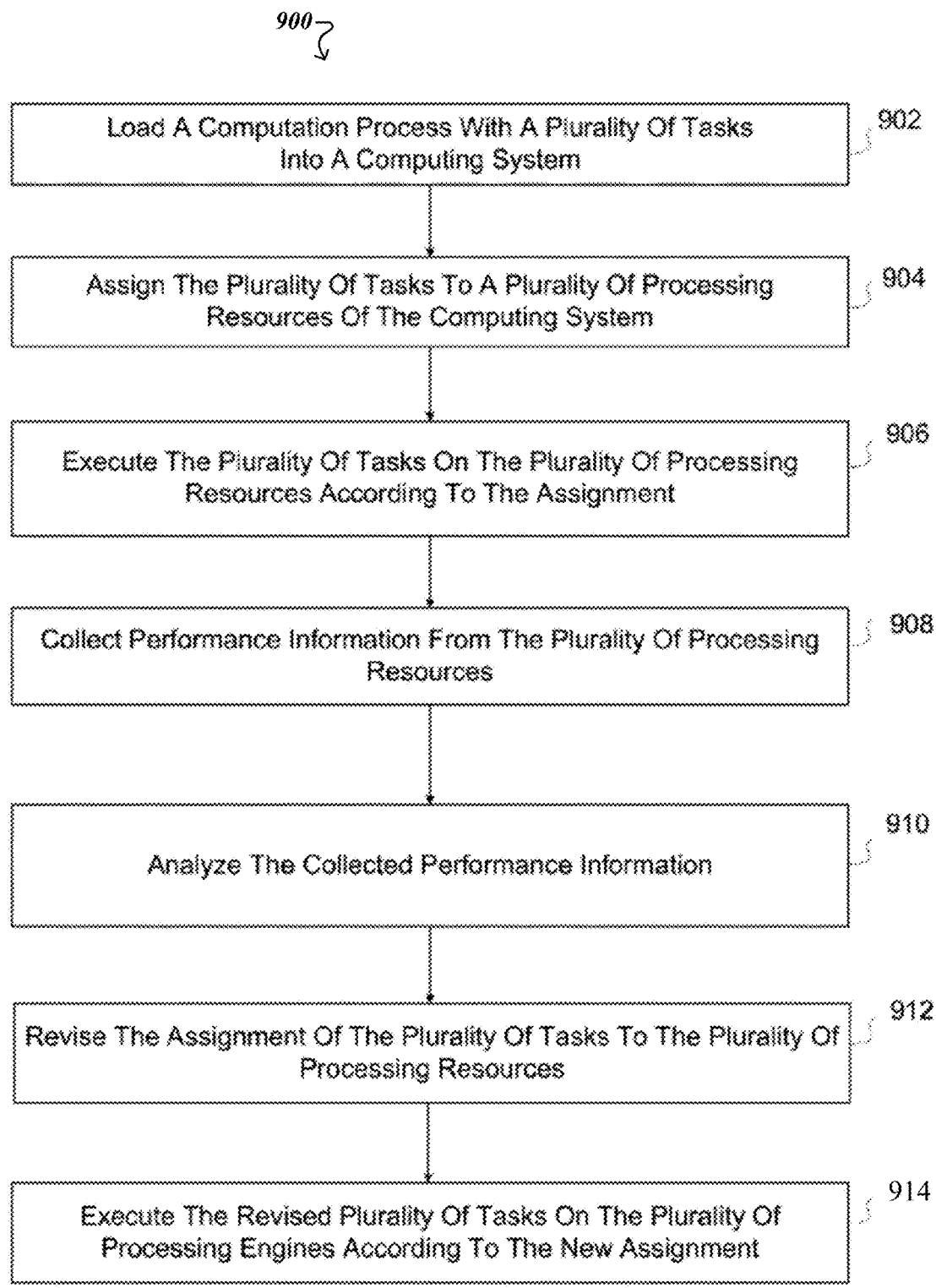
FIG. 9 is a flow diagram showing an example of a process by which a computing system adjusts assignment of computing tasks to a plurality of computing resources of the computing system.

FIG. 9 is a flow diagram showing an example of a process 900 for a computing system 100 to assign computing tasks to a plurality of computing resources of the computing system 100 according to the present disclosure. Each of the computing resources may be a processing engine 120, a cluster 110, a super cluster 130 (if super cluster is implemented) or a processing device 102. One example of computing system 100 configured to execute the process 900 may be the computing system 100C, in which the host 11 and other components of the computing system 100C may be configured through hardware, firmware, and/or software to be specifically designed for execution of one or more of the operations of process 900.

The process 900 may start with block 902, at which a computation process with a plurality of tasks may be loaded into a computing system 100C. For example, the computation process may be part of a computer application. Examples of such a computer application may include a test application, a web server, and a database management system. For such examples, the computing process may be the computing process that a web server serves web pages on the Internet or a database management system provides data storage and/or data analysis. In one embodiment, the software application may include a plurality of modules that may be loaded and executed by separate physical processing elements. Examples of such modules may include dynamic link libraries (DLLs), Java Archive (JAR) packages, and similar libraries on UNIX®, ANDROID® or MAC® operating systems. For example, for a web server application, the computing process of serving the web pages may include different tasks for authenticating users, for serving static web pages, and/or for generating dynamic web pages; for a database management system, the computing process of data analysis may include different tasks for querying databases and/or generating reports. An example of a computing process including a plurality of tasks is shown in FIG. 10A.

At block 904, the plurality of tasks may be assigned to a plurality of computing resources of the computing system. The assignment of tasks to computing resources may also be referred to as mapping. For example, one computing system 100C may include 10,000 processing devices 102 and each may include 256 processing engines 120 grouped in clusters, and the plurality of tasks may be assigned to the processing devices 102, clusters 110 and/or processing engines 120. If super clusters are implemented, the assignment may also be implemented at the super cluster level. In some embodiments, the program code being executed by the host 11 may assign the plurality of tasks across the processing devices, and deliver the tasks by packets addressed directly to the individual computing resource. FIG. 10B illustrates a plurality of computing resources P1 through P16 being assigned to execute the plurality of tasks. Each computing resources P1 through P16 may be assigned one task, duplicate of a task, or more than one task of FIG. 10A. Each of the computing resources P1 through P16 may be a processing device 102, a cluster 110, a super cluster 130 (if super cluster is implemented) or a processing engine 120.

At block 906, the plurality of tasks may be executed on the plurality of computing resources. As shown in FIG. 10B, the plurality of tasks may be executed on the computing resources P1 through P16. The directional links between the computing resources P1 through P16 may be communication channels between the computing resources. Although all of the channels are shown to be one-directional in FIG. 10B, it is within the scope of the present disclosure that some communication channels between some or all computing resources may be bi-directional.

At block 908, the performance information of the plurality of computing resources may be collected. As described herein, each processing devices 102 may collect SAM data at the device, cluster (and super cluster if super cluster is implemented), and processing engine levels. In some embodiments, while the plurality of computing resources are executing the tasks assigned to them, the host 11 may collect the performance information using the SAM data. For example, the performance component 27 may collect performance information from SAM instruments, including SAM counters, SAM registers, or both. In one embodiment, the plurality of tasks may be executed on the plurality of computing resources for a predetermined amount of time and the performance information may be collected for this predetermined amount of time, for example, a few milliseconds or up to a few minutes. In another embodiment, the performance information may be collected for an amount of time that is determined during operation. For example, once the plurality of tasks start to execute on the plurality of computing resources, there may be a spike of activity level on one or more routers for transmitting data to the plurality of computing resources. The activity level may be continuously monitored and the amount of time may be the period of time starting from the start of the spike until the activity level becomes steady. Steady may be determined, for example, as no substantial change (e.g., less than 5%, 10%, or 20%) over a predetermined time, such as 1 or 2 milliseconds, or 1 or 2 seconds.

At block 910, the collected performance information may be analyzed. For example, the analysis component 28 may perform analysis on the collected performance information. In one embodiment, the host 11 may collect SAM data prior to the tasks being assigned to and executed by the computing resources so that the host 11 may compare the SAM data for before and after assignment of the tasks to the computing resources as part of analysis.

At block 912, the assignment of the plurality of tasks to the plurality of computing resources may be revised. In one embodiment, based on the collected performance data, the host 11 may revise the mapping of the tasks to the processing resources. For example, the host 11 may determine that some tasks may be combined while some tasks (e.g., with multiple program modules) may be divided into smaller pieces (e.g., individual program modules or less modules in a software package).

Figure 11:
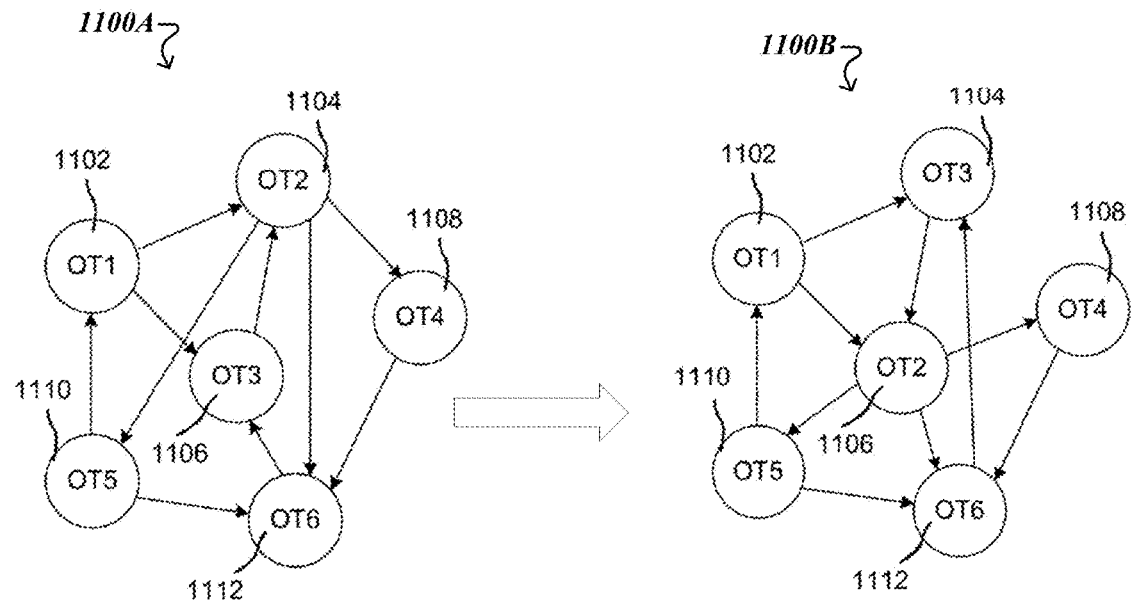
FIG. 11 is a block diagram illustrating an example of task re-assignment.

FIG. 11 illustrates an example of task re-assignment according to the present disclosure. An original mapping diagram 1100A shows that a plurality of computing resources 1102, 1104, 1106, 1108, 1110 and 1112 may originally be assigned tasks OT1 through OT6 to execute respectively. The revised mapping diagram 1100B shows the re-assignment of the tasks OT1 through OT6, in which the computing resources 1104 and 1106 may swap their assigned tasks OT2 and OT3. That is, the task OT2 now may be executed on the computing resource 1106 and the task OT3 may be executed on the computing resource 1102. Because the swap of the tasks between the computing resources 1104 and 1106, the directional links from and to these two computing resources 1104 and 1106 may be affected as shown. Each of the computing resources 1102 through 1112 may be a processing engine 120, a cluster 110, a super cluster 130 (if super cluster is implemented), or a processing device 102.

Figure 12:
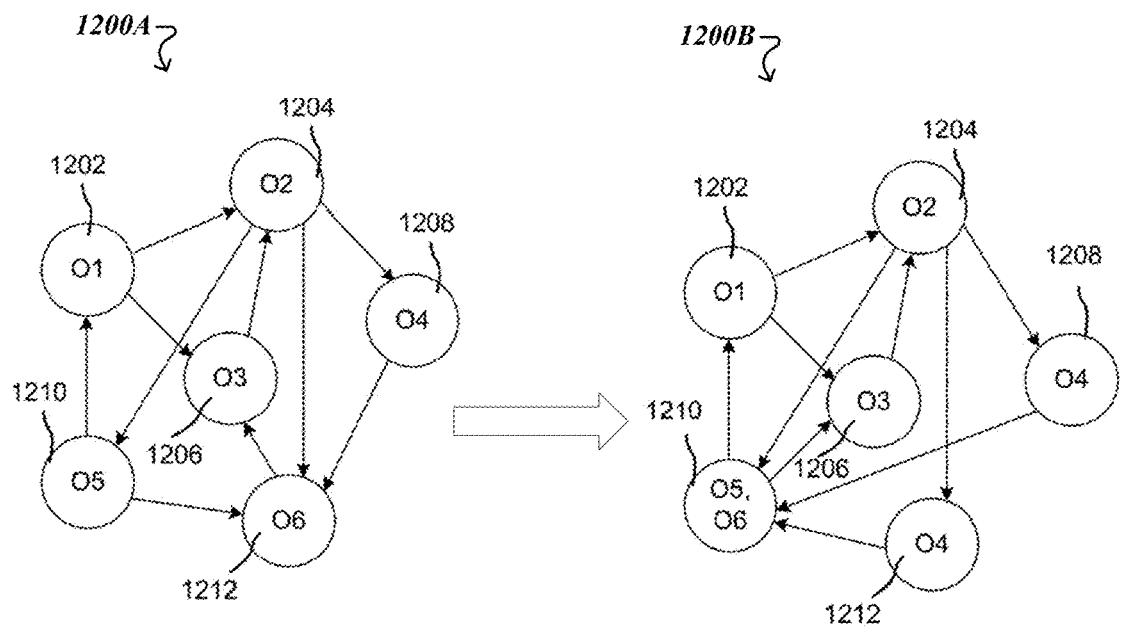
FIG. 12 is a block diagram illustrating another example of task re-assignment.

FIG. 12 illustrates another example of task re-assignment according to the present disclosure. An original mapping diagram 1200A shows that a plurality of computing resources 1202, 1204, 1206, 1208, 1210 and 1212 may originally be assigned tasks O1 through O6 to execute respectively. The re-assignment of the tasks O1 through O6 may be shown in the revised mapping diagram 1200B, in which both tasks O5 and O6 may be assigned to the computing resource 1210 and the task O4 may be assigned to both computing resources 1208 and 1212. Executing the tasks O5 and O6 together on a single computing resource may be useful, for example, if the tasks O5 and O6 exchange data frequently. Assigning the task O4 to two computing resources 1208 and 1212 may be achieved in a variety of ways. For example, the task O4 may be broken into parts and each part may be assigned to one computing resource, or alternatively, the task O4 may be duplicated and each duplicate copy may be assigned to one computing resource. Each of the computing resources 1202 through 1212 may be a processing engine 120, a cluster 110, a super cluster 130 (if super cluster is implemented), or a processing device 102.

Combining separate tasks to execute on a single computing resource may be referred to as a merge (or merger) of tasks and assigning one task to execute on multiple computing resources may be referred to as a split of a task. Although FIG. 12 shows one merge and one split being applied simultaneously, in various embodiments, merger and/or split of tasks may occur individually or in any combinations as appropriate to optimize the processing of the application. For example, in one embodiment, one or more merges may be used without any splits, and any of the merges may be a merger of two or more tasks. In another embodiment, one or more splits may be used without any merges, and any of the splits may be a split into two or more tasks. Moreover, when a merge may be applied, the merged tasks may be executed in any of the computing resource of the computing system, not necessarily one of the computing resource previously being used to carry out the execution of one of the merged tasks. That is, in some embodiments, the merged tasks O5 and O6 may be assigned to one of computing resources 1202 through 1208 or any other computing resources of the computing system. It should be noted that in one embodiment, a re-assignment of other tasks accompanies the assignment of one merged task. Similarly, when a split occurs, the split task may be executed in any of the computing resources of the computing system, not necessarily one of the computing resources previously being used to carry out the execution of the split task or one of merged tasks (if any). That is, in some embodiments, the split task O4 may be assigned to any two computing resources of the computing resources 1202, 1204, 1206 and 1210, or any other computing resources of the computing system.

Referring back to FIG. 9, at block 914, the re-assigned plurality of tasks may be executed on the plurality of computing resources according to the new assignment. Using the collected SAM data, the computing system 100C may assign computation tasks dynamically and adaptively to the computing resources of the computing system 100C. In some embodiments, the blocks 908 through 912 may be repeated after the initial revision and reassignment of the tasks. Moreover, in some embodiments, the computing system 100C may implement features of simulated annealing process, such as rolling back adjustments if performance does not improve, and inject simulated noise to the collected SAM data. Therefore, embodiments of the computing system 100C may be robust and responsive to computing needs, and may offer great scalability to complex computer applications.

To reduce the cost of SAM data collection, performed as described above in connection with FIGS. 7B-7D, by using SAM instruments 704, 714, 718, 722, 720, 732 at each respective computing resource 106, 114, 116, 118, 120, 132 and SAM instruments 706, 716, 734 at each respective L1-router 104, cluster-level router 112, super cluster-level router 134 of a processing device 102, SAM data collection is suitably performed, in accordance with the disclosed technologies, only at the L1-router 104 of the processing device. As the address space used in the computing system 100, 100C is flat, each address refers to a single respective memory location within a destination processing device 102 rather than to the entire destination processing device. The addresses, however, are typically hierarchical, so a destination computing resource can be selectively examined at a desired level of detail—for example, all the data destined for a single processing engine 120 or memory 118 of a cluster 110 of a processing device 102 may be examined; all the data destined for a single cluster 110 of a processing device 102 may be examined; all the data destined for an entire device 102 may be examined; or even all the data destined for a group of devices (e.g., a group of processing devices 102 contained in a particular chassis or rack of computing system 100C) may be examined. This can be accomplished in ways described below.

As noted above in connection with FIGS. 7A-7B, a respective SAM instrument 706 coupled with each external port of an L1-router 104 of a processing device 102 (also referred to as an output network port of the processing device) can identify, among data packets transmitted from the external port to computing resources of other processing devices of the computing system 100C, those data packets that are addressed to the computing resources having addresses in a specified destination address range. The specified destination address can be in a $j^{th}$ destination address range DR(j) from among N total destination address ranges (i.e., j=1 ... N). Also, the L1 router is configured such that data packets from some of source computing resources can be routed to the output network port with which the SAM instrument 706 is coupled, and hence, an address of this output network port is referred to as a source port address. In this manner, an $i^{th}$ SAM instrument 706 is said to be associated with a source port address SP(i) from among M total source port addresses (i.e., i=1 ... M). Moreover, the SAM instrument 706 associated with the source port address SP(i) can count, over a specified time interval ΔT (e.g., a few milliseconds, 10s of millisecond, 100s of milliseconds), data packets identified as being addressed to the computing resources having addresses in DR(j). Note that computing resources of the processing device 102—that includes the output network port (I) with which the SAM instrument 706 is coupled and (II) which has the source port address SP(i)—may be the original sources of only some data packets transmitted by the processing device; the remaining transmitted data packets originate at computing resources of other processing devices, such that the processing device is merely one of the links in communication chains leading to computing resources of one or more processing devices with addresses in the destination data range DR(j).

Example implementations of the SAM instrument 706 are described below in connection with FIGS. 13 and 14. Each of the example implementation of SAM instrument 1300 and the example implementation of SAM instrument 1400 is coupled with an L1-router 104 of a processing device 102. In some implementations, the SAM instrument 1300, 1400 is internal to the L1-router 104. In other implementations, the SAM instrument 1300, 1400 is external to the L1-router 104, but internal to the processing device 102.

Figure 13:
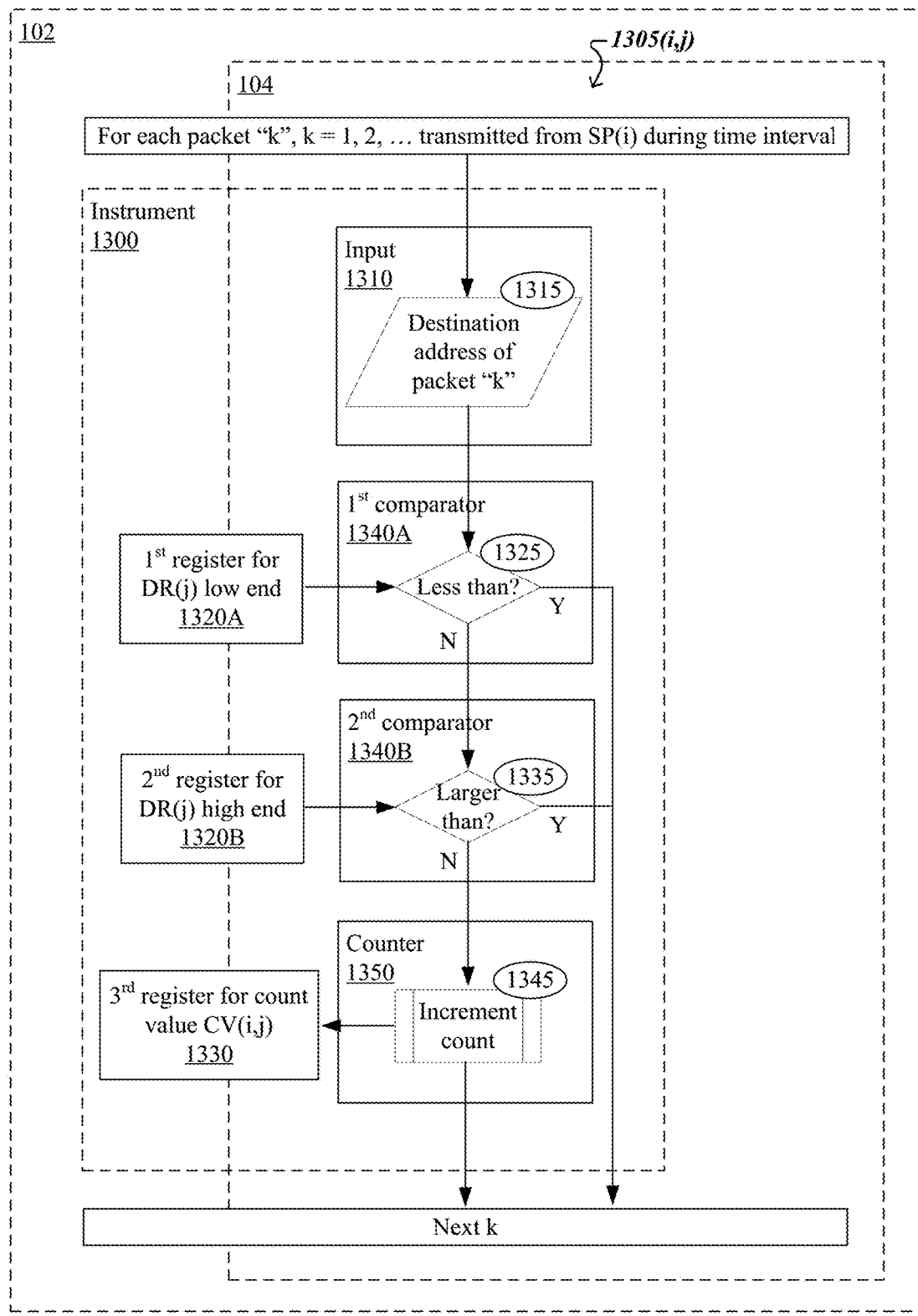
FIG. 13 shows structural and functional aspects of an example of a system activity monitoring (SAM) instrument.

Referring now to FIG. 13, the SAM instrument 1300 includes a first register 1320A (also referred to as ADDRLO (WO)), a second register 1320B (also referred to as ADDRHI (WO)), and a third register 1330 (also referred to as WCTR (RW)) addressable by a supervisor computing resource, e.g., host 11; and an input 1310 coupled with an external port of the L1-router 104. The SAM instrument 1300 further includes a first comparator circuit 1340A coupled with the input 1310 and the first register 1320A; and a second comparator circuit 1340B coupled with the first comparator circuit 1340A and the second register 1320B. Each of the first comparator circuit 1340A and the second comparator circuit 1340B includes comparator gates. The SAM instrument 1300 further includes a counter circuit 1350 coupled with the second comparator circuit 1340B and the third register 1330.

In the example illustrated in FIG. 13, the SAM instrument 1300 is coupled with an output network port of a processing device 102 having an $i^{th}$ source port address SP(i). Here, the SAM instrument 1300 is arranged and configured to perform a process 1305(i,j) for identifying, among data packets transmitted, over a specified time interval, from the processing device 102, that includes the output network port having the source port address SP(i), to computing resources of other processing devices of the computing system 100C, those data packets that are addressed to the computing resources having addresses in DR(j), and for counting the identified data packets. The process 1305(i,j) is a loop performed by the SAM instrument 1300 for each data packet "k", where k=1, 2, . . . , transmitted, over a specified time interval, from the source port address SP(i) with which the SAM instrument is associated. Prior to performing, by the SAM instrument 1300, of the process 1305(i,j), the supervisor computing resource associated with the computing system 100C writes a low address (i.e., the lower bound of DR(j)) to the $1^{st}$ register 1320A, a high address (i.e., the upper bound of DR(j)) to the $2^{nd}$ register 1320B, and specifies the time interval over which the process 1305(i,j) is to be performed by the SAM instrument 1300.

At 1315, a destination address of data packet k is accessed in the header thereof by the input 1310.

At 1325, the destination address of data packet k is compared by the $1^{st}$ comparator circuit 1340A to the low address of DR(j) stored in the $1^{st}$ register 1320A. If the destination address of data packet k is less than the low address of DR(j), then, at 1325(Y), the $k^{th}$ iteration of the process 1305(i,j) is terminated, so the $(k+1)^{th}$ iteration of the process 1305(i,j) can be started. A new iteration will be performed if the time elapsed since the beginning of the process 1305(i,j) is less than the specified time interval. If the destination address of data packet k is equal to or greater than the low address of DR(j), then, at 1325(N), the $k^{th}$ iteration of the process 1305(i,j) continues to the next operation.

At 1335, the destination address of data packet k is compared by the $2^{nd}$ comparator circuit 1340B to the high address of DR(j) stored in the $2^{nd}$ register 1320B. If the destination address of data packet k is larger than the low address of DR(j), then, at 1335(Y), the $k^{th}$ iteration of the process 1305(i,j) is terminated, so the $(k+1)^{th}$ iteration of the process 1305(i,j) can be started. A new iteration will be performed, if the time elapsed since the beginning of the process 1305(i,j) is less than the specified time interval. If the destination address of data packet k is smaller than or equal to the high address of DR(j), then, at 1335(N), the $k^{th}$ iteration of the process 1305(i,j) continues to the next operation.

At 1345, a count value CV(i,j) stored in the $3^{rd}$ register 1330 is incremented by one by the counter circuit 1350. At this point, the $k^{th}$ iteration of the process 1305(i,j) ends, so the $(k+1)^{th}$ iteration of the process 1305(i,j) can be started. A new iteration will be performed, if the time elapsed since the beginning of the process 1305(i,j) is less than the specified time interval.

The portion of the process 1305(i,j)—in which an outgoing data packet's destination address (referred to as PktAdr) is compared to DR(j) by comparator circuits 1340A, 1340B; and if the destination address is within DR(j) then counter value C(i,j) is incremented by counter circuit 1350—can be summarized using the following portion of pseudo-code:

```
if(PktAdr <= ADDRHI & PktAdr >= ADDRLO) {
    WCTR++;
}.
```

Figure 14:
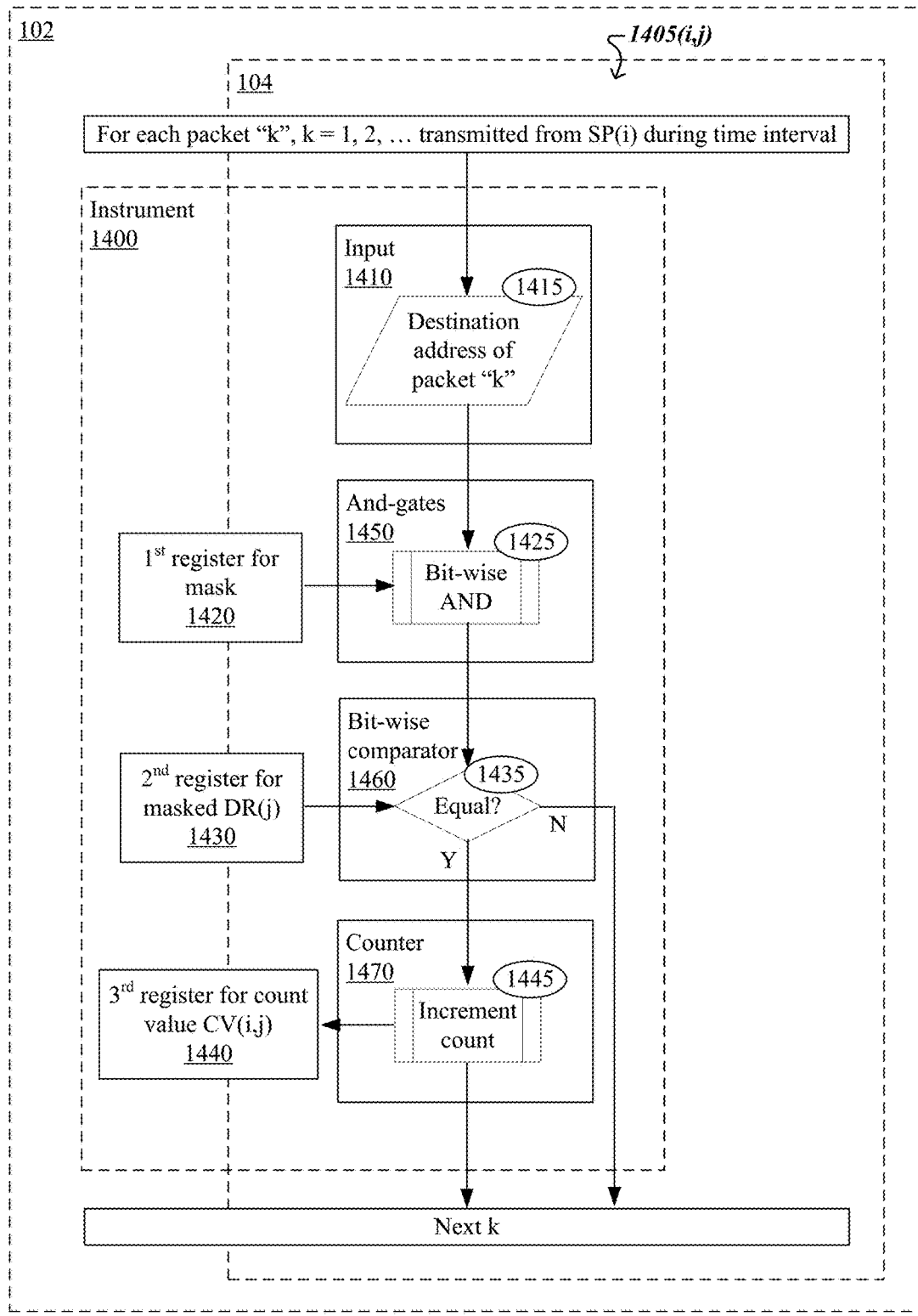
FIG. 14 shows structural and functional aspects of an example of another SAM instrument.

Referring now to FIG. 14, the SAM instrument 1400 includes a first register 1420 (also referred to as PKTADRMSK (WO)), a second register 1430 (also referred to as TRGT (WO)), and a third register 1440 (also referred to as WCTR (RW)) addressable by a supervisor computing resource, e.g., host 11; and an input 1410 coupled with an external port of the L1-router 104. The SAM instrument 1400 further includes AND-gates 1450 coupled with the input 1410 and the first register 1420A; and a bit-wise comparator circuit 1460 coupled with the AND-gates 1450 and the second register 1430. The bit-wise comparator circuit 1460 includes comparator gates. The SAM instrument 1400 further includes a counter circuit 1470 coupled with the bit-wise comparator circuit 1460 and the third register 1440. Here, the SAM instrument 1400 reduces hardware expense further relative to the SAM instrument 1300 (at the cost of a slight reduction in flexibility) by using a mask register and a test for equality, as explained below.

In the example illustrated in FIG. 14, the SAM instrument 1400 is coupled with an external port of an L1-router 104 of a processing device 102 having an $i^{th}$ source port address SP(i). Here, the SAM instrument 1400 is arranged and configured to perform a process 1405(i,j) for identifying, among data packets transmitted, over a specified time interval, from the processing device 102, that includes the output network port having the source port address SP(i), to computing resources of other processing devices of the computing system 100C, those data packets that are addressed to the computing resources having addresses in DR(j), and for counting the identified data packets. The process 1405(i,j) is a loop performed by the SAM instrument 1400 for each data packet "k", where k=1, 2, . . . , transmitted, over a specified time interval, from the source port address SP(i) with which the SAM instrument is associated. Prior to performing, by the SAM instrument 1400, of the process 1305(i,j), the supervisor computing resource associated with the computing system 100C writes a mask associated with DR(j) to the $1^{st}$ register 1420, a masked instance of DR(j) to the $2^{nd}$ register 1430, and specifies the time interval over which the process 1405(i,j) is to be performed by the SAM instrument 1400.

At 1415, a destination address of data packet k is accessed in the header thereof by the input 1410.

At 1425, a bit-wise AND operation is performed by the AND-gates 1450, where a first operand is the destination address of data packet k and a second operand is the mask stored in the $1^{st}$ register 1420. A result of the bit-wise AND operation is a masked instance of the destination address of data packet k.

At 1435, the masked instance of the destination address of data packet k is compared by the bit-wise comparator circuit 1460 to the masked instance of DR(j) stored in the $2^{nd}$ register 1430. If the masked instance of the destination address of data packet k is not bit-wise equal to the masked instance of DR(j), then, at 1435(N), the $k^{th}$ iteration of the process 1305(i,j) is terminated, so the $(k+1)^{th}$ iteration of the process 1405(i,j) can be started. A new iteration will be performed, if the time elapsed since the beginning of the process 1405(i,j) is less than the specified time interval. If the masked instance of the destination address of data packet k is bit-wise equal to the masked instance of DR(j), then, at 1435(Y), the $k^{th}$ iteration of the process 1405(i,j) continues to the next operation.

At 1445, a count value CV(i,j) stored in the $3^{rd}$ register 1440 is incremented by one by the counter circuit 1470. At this point, the $k^{th}$ iteration of the process 1405(i,j) ends, so the $(k+1)^{th}$ iteration of the process 1405(i,j) can be started. A new iteration will be performed, if the time elapsed since the beginning of the process 1405(i,j) is less than the specified time interval.

The portion of the process 1405(i,j)—in which an outgoing data packet's destination address (referred to as PktAdr) is bit-wise AND-ed with PKTADRMSK by AND-gates 1450 before the masked destination address is compared to the masked DR(j) by bit-wise comparator circuit 1460; and if the masked destination address matches the masked DR(j) then counter value C(i,j) is incremented by counter circuit 1470—can be summarized using the following portion of pseudo-code:

```
AddressBits = PktAdr & PKTADRMSK;
If (AddresssBits == TRGT) {
    WCTR++;
}.
```

As the AND-gates 1450 of the SAM instrument 1400 are less complex than the $1^{st}$ comparator circuit 1340A of the SAM instrument 1300, and the bit-wise comparator circuit 1450 of the SAM instrument 1400 is less complex than the $2^{nd}$ comparator circuit 1340B of the SAM instrument 1300, the SAM instrument 1400 has an overall smaller complexity than the SAM instrument 1300, at the cost of a slight reduction in flexibility caused by a mask-based test for equality used as part of the operation of the SAM instrument 1400. Note that, in some implementations, one or more of the components of each of the SAM instruments 1300, 1400 can be turned off to save power.

Further note that, in each of the SAM instruments 1300, 1400, the count value CV(i,j) stored in the $3^{rd}$ register 1330, 1440 can be accessed by the supervisor computing resource associated with the computing system 100C. In some cases, the supervisor clears the accessed count value CV(i,j). In some cases, the supervisor can use the accessed count value CV(i,j) for further processing, as described below in this specification.

In some implementations, each of the SAM instruments 1300, 1400 can further include an accumulation register and an adder circuit. The latter is arranged and configured to add, if the destination address of the data packet k is within DR(j), a size of the data packet k to a size value SV(i,j) stored in the accumulation register as a sum of sizes of data packets previously transmitted, during the specified time interval, to computing resources within DR(j). As such, in response to determining that the destination address of the data packet k is within DR(j), the SAM instrument 1300, 1400 accesses the size of the data packet k in the size field of the header thereof. Then, the adder circuit performs the operation SV(i,j)=SV(i,j; stored in accumulation register)+ SIZ(indicated in header of data packet k), and then stores the result SV(i,j) in the accumulation register.

In this manner, values of network-traffic TV(i,j) corresponding to DR(j) can be calculated, e.g., by the host 11, based on the counter value CV(i,j) stored in the third register 1330, 1440 of the SAM instrument 1300, 1400 associated with SP(i); and values of bandwidth BV(i,j) corresponding to DR(j) can be calculated based on the size value SV(i,j) stored in the accumulation register of the SAM instrument 1300, 1400 associated with SP(i). For instance, for a specified time interval ΔT, a value of network-traffic TV(i,j) can be calculated as a ratio of CV(i,j) and ΔT, and a value of bandwidth data BV(i,j) can be calculated as a ratio of SV(i,j) and ΔT.

In some implementations, network-traffic values TV(i,j) and bandwidth values BV(i,j) corresponding to DR(j), that are stored in registers of the SAM instrument 1300, 1400 associated with SP(i), can be combined to produce latency values LV(i,j) corresponding to DR(j). Affinity histogramming is a mechanism for collecting and presenting data center traffic flows. The latter is referred to as network-traffic or more generally as affinity data. Various processes 1500, 1600, 1700 and 1800 for collecting affinity data are described below in connection with FIGS. 15A, 16A, 17A and 18A, respectively. Various ways to present the affinity data collected using the foregoing affinity data collection processes are described below in connection with FIG. 19 and Table 1.

Moreover, updates to CV(i,j) stored in the third register 1330, 1440 and/or SV(i,j) stored the accumulation register of the SAM instrument 1300, 1400 can be mapped to flags for signaling the associated processing device 102 or host 11. Examples of such signaling configurations are described in detail below.

The registers of the SAM instruments 1300, 1400 can be initialized for sampling in the following manners. The third register 1330, 1440 and the accumulation register of the SAM instrument 1300, 1400 are typically initialized to zero. The first and second registers of the SAM 1300, 1400, that store information about a specified destination address range to be sampled, e.g., DR(j), where j=1. . . n. N, are suitably initialized to an address window of interest. In a typical case, DR(j) will not be static—rather, the registers are initialized, data collected for a time interval, e.g., a few milliseconds, 10s of millisecond, 100s of milliseconds, then the address window of interest will be changed DR(j)→DR(j+1), etc., as described below in connection with FIGS. 16A-16B. Moreover, DR(j) to be specified first for the SAM instruments 1300, 1400 can be a particular range of addresses that are of particular interest, e.g., addresses that are used for a part of a process that is already known to form a bottleneck in processing. In this case, the SAM instruments 1300, 1400 may sample all the addresses devoted to one processing device 102 in the particular address range, then to another processing device in the particular address range, and so on until every processing device in the particular address range has been sampled.

In some implementations, the network connections of a processing device 102 can carry not only network-traffic originating from or destined to that processing device, but can also act as a router that carries network-traffic from some other source processing device(s) to some other destination processing device(s). Depending on the routing pattern in use, this can (and often will) beneficially allow collection of network-traffic data and/or bandwidth data about large portions of a network by setting up monitoring at a relatively small number of selected locations.

Figure 15A:
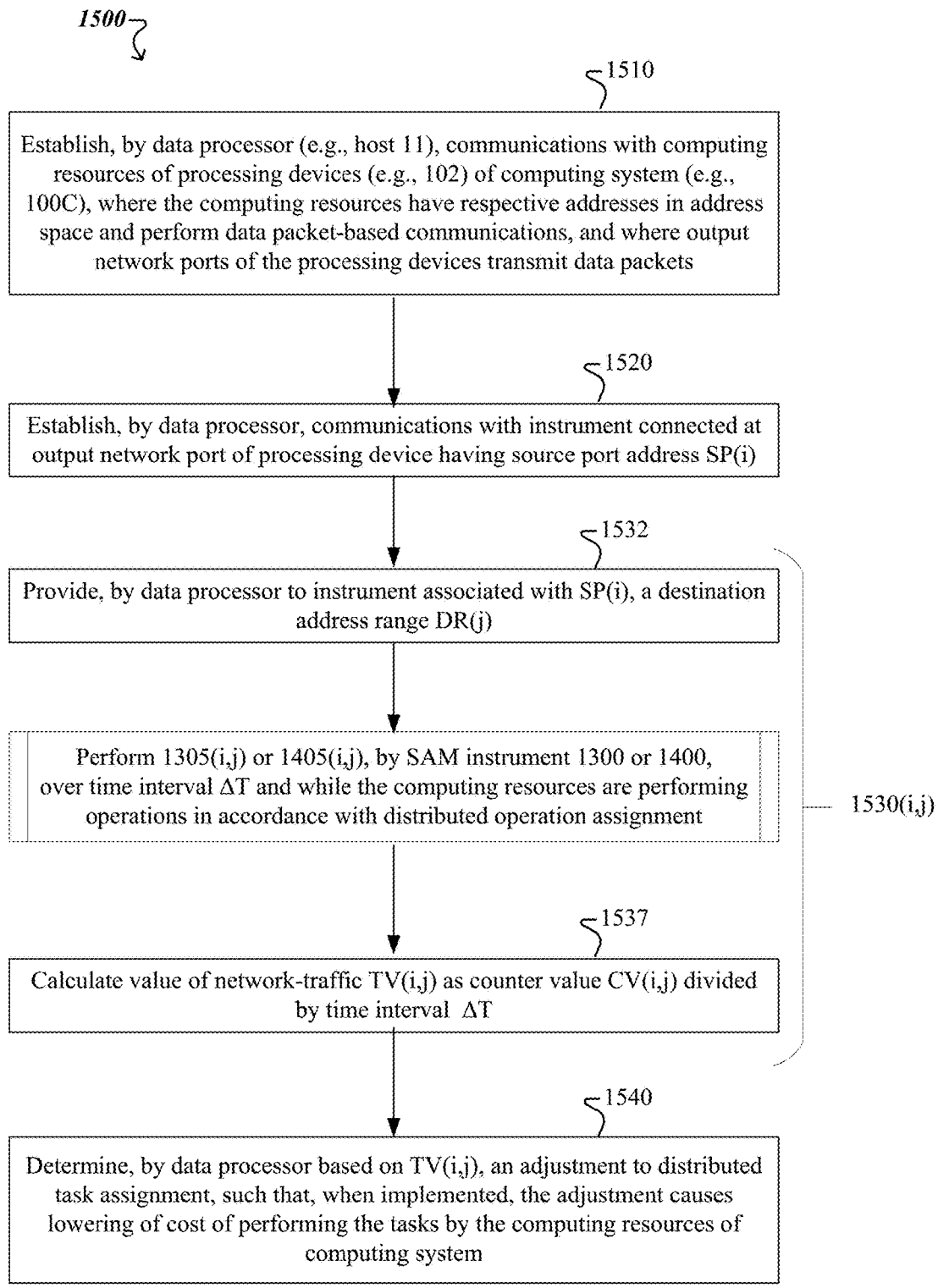
FIGS. 15A-15B show aspects of an example of a process that uses a SAM instrument to monitor network-traffic corresponding to a destination address range of an address space used by computing resources of a computing system.
Figure 16A:
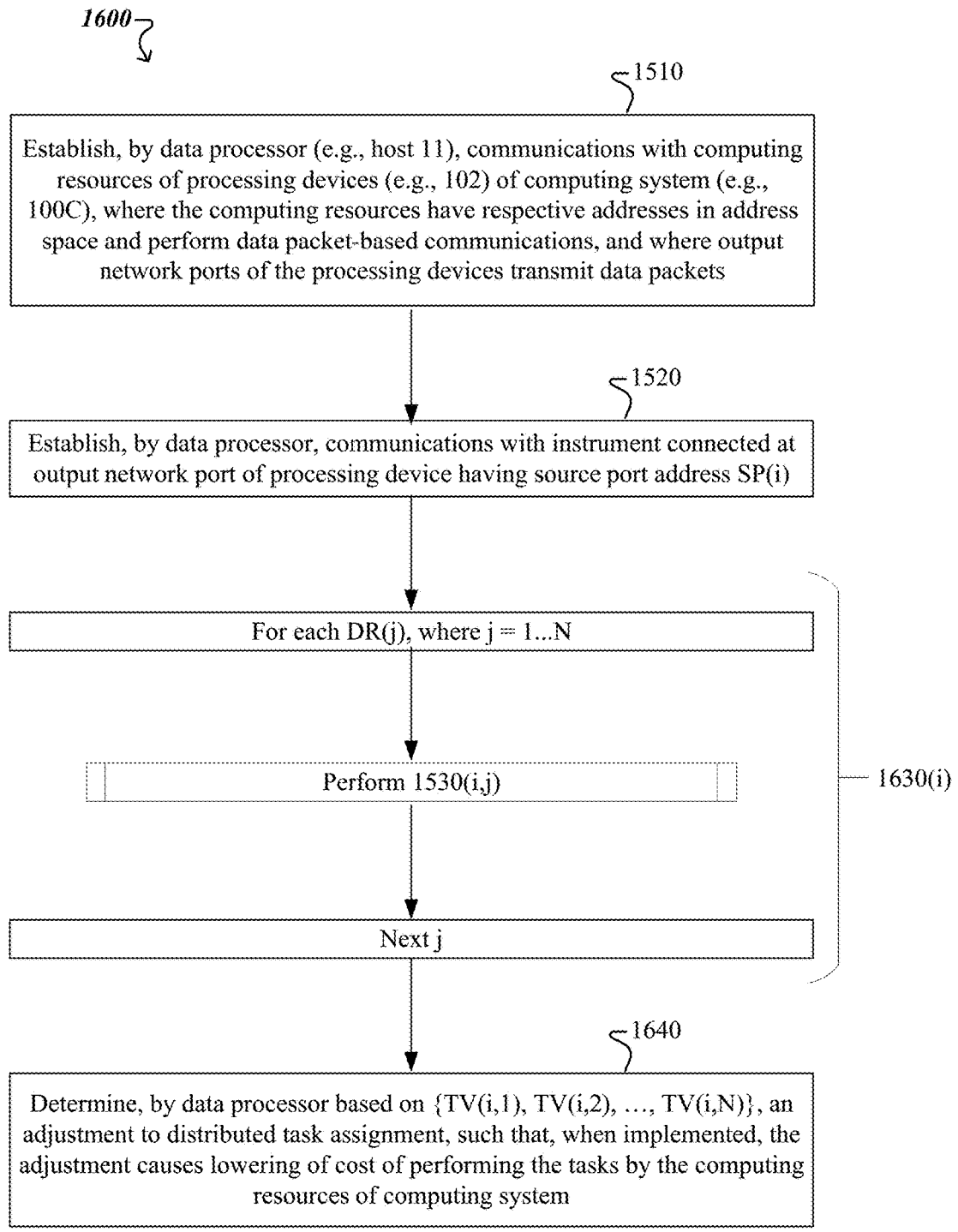
FIGS. 16A-16B show aspects of an example of a process that uses a SAM instrument to monitor network-traffic corresponding to multiple destination address ranges of the address space.
Figure 17A:
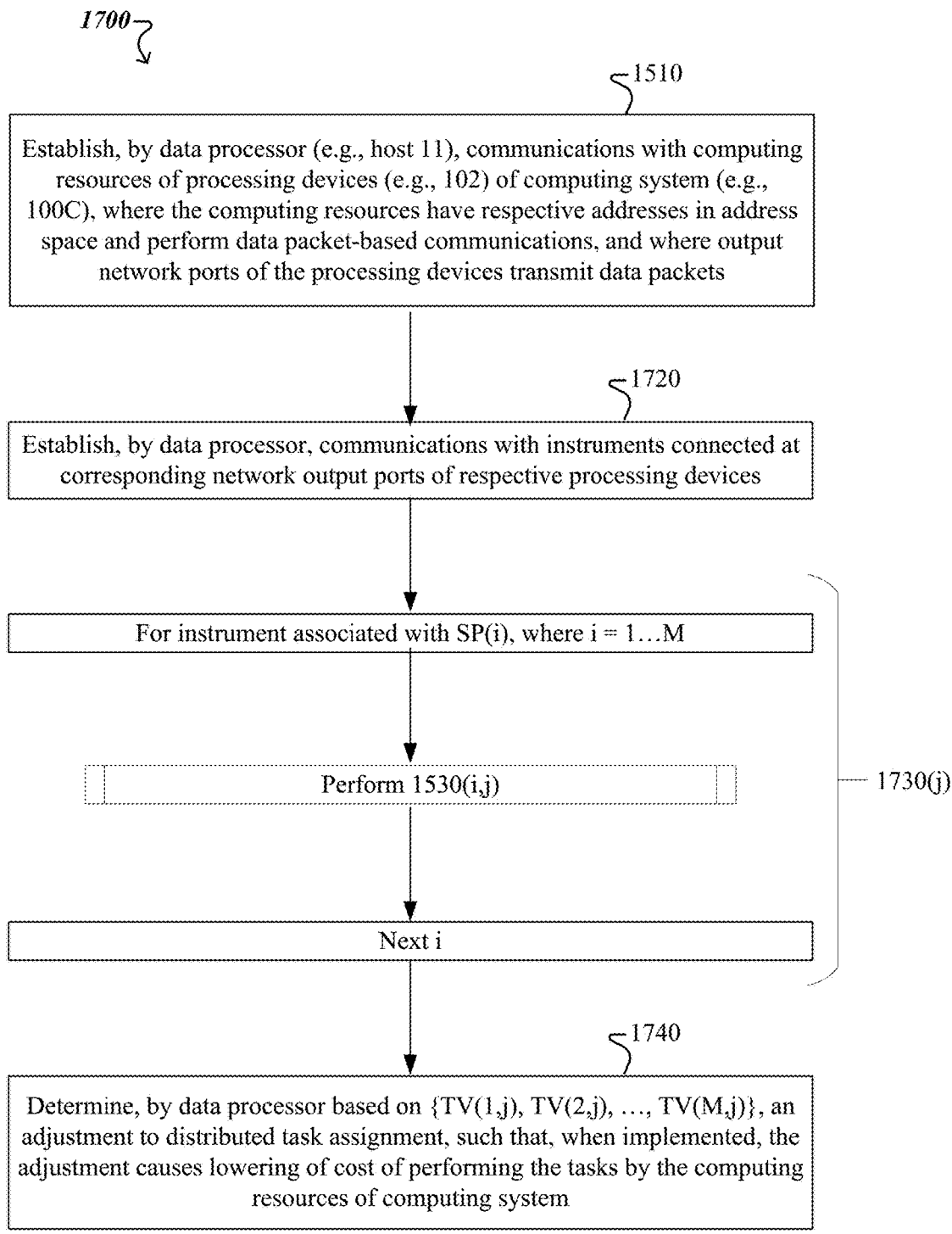
FIGS. 17A-17B show aspects of an example of a process that uses multiple SAM instruments to monitor network-traffic corresponding to a destination address range of the address space.
Figure 18A:
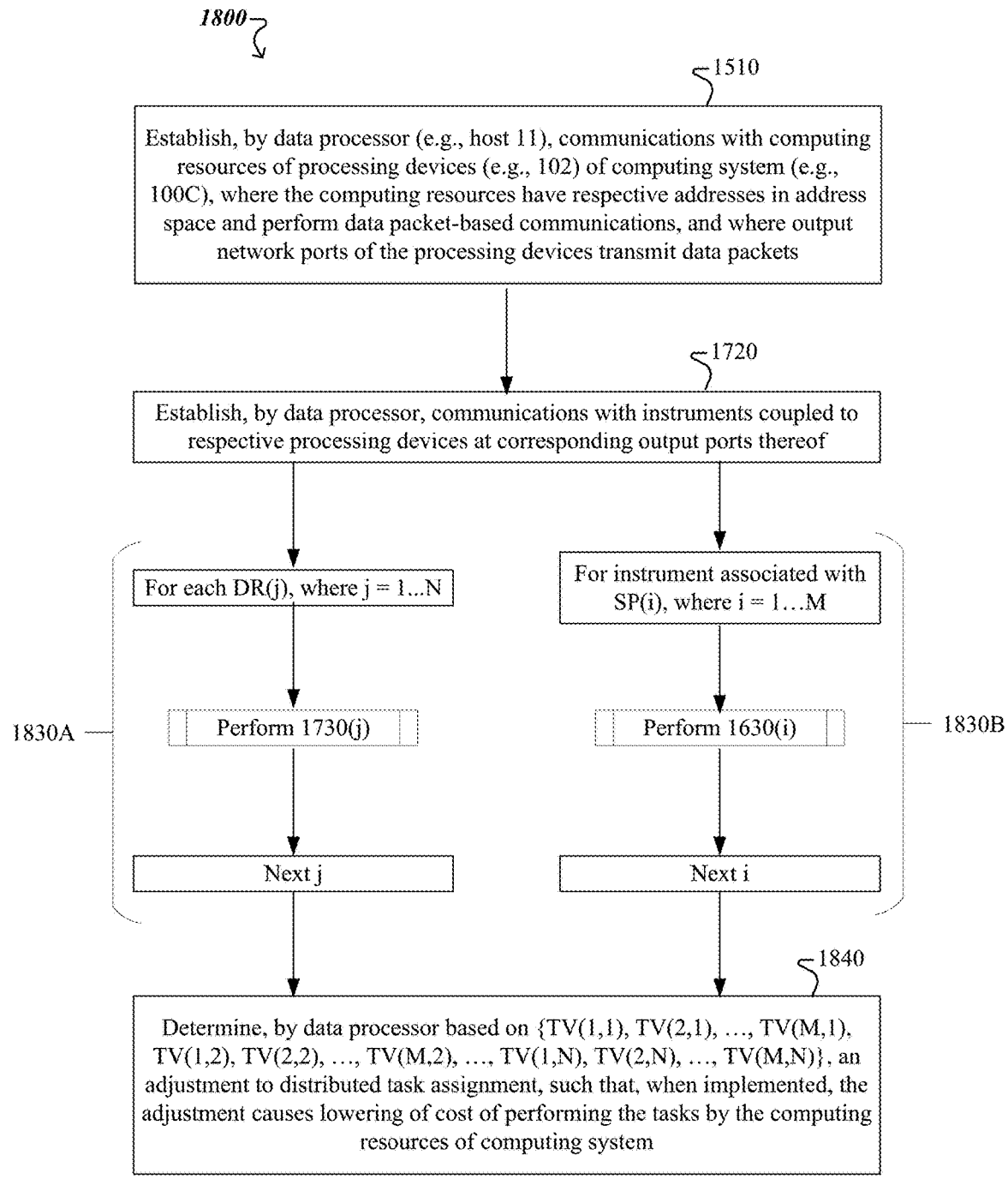
FIGS. 18A-18B show aspects of an example of a process that uses multiple SAM instruments to monitor network-traffic corresponding to multiple destination address ranges of the address space.

FIG. 15A shows an example of a process 1500 that uses a SAM instrument associated with a source port address SP(i) for monitoring network-traffic corresponding to a destination address range DR(j) of an address space used by computing resources of a computing system. FIG. 16A shows an example of a process 1600 that uses the SAM instrument associated with the source port address SP(i) for monitoring network-traffic corresponding to destination address ranges DR(1), . . . , DR(j), . . . , DR(N) of the address space. FIG. 17A shows an example of a process 1700 that uses multiple SAM instruments associated with respective source port addresses SP(1), . . . , SP(i), . . . , SP(M) for monitoring network-traffic corresponding to the destination address range DR(j) of the address space. FIG. 18A shows an example of a process 1800 that uses multiple SAM instruments associated with respective source port addresses SP(1), . . . , SP(i), . . . , SP(M) for monitoring network-traffic corresponding to the destination address ranges DR(1), . . . , DR(j), . . . , DR(N) of the address space.

Each of the processes 1500, 1600, 1700 and 1800 can be implemented in the computing system 100C described above in connection with FIG. 8, using one or more instances of the SAM instrument 1300 or 1400 connected to an output port of L1-router 104 of a respective one or more processing devices 102 from among the processing devices of the computing system. Communications between computing resources (e.g., 118, 120, etc.) of the processing devices 102 of the computing system 100C are carried out based on data packets 140 transmitted from the output ports of the processing devices, and the computing resources have respective addresses in an address space. Some operations of each of the processes 1500, 1600, 1700 and 1800 are performed by a data processor of the computing system 100C, and other operations of each of these processes are performed by one or more instances of the SAM instrument 1300, 1400. In some implementations, the data processor is the host 11 of the computing system 100C. In some implementations, the data processor can be one of the processing devices 102 of the computing system 100C.

For each of the processes 1500, 1600, 1700 and 1800, at 1510, the data processor establishes communications between the data processor and the computing resources of the computing system. For example, as part of the communications between a host 11 and computing resources of processing devices 102 of the computing system 100C, the host implements a distributed task assignment as described above in connection with FIG. 8. In this manner, tasks necessary for running a software application can be assigned by the data processor to the available computing resources of the computing system.

For each of the processes 1500 and 1600, at 1520, the data processor establishes communications with a SAM instrument 1300 or 1400 associated with source port address SP(i) from among M source port addresses of the address space used by the computing resources of the computing system 100C.

Referring now to FIG. 15A, a sequence of operations 1530$(i,j)$ of the process 1500 are performed next in the following manner.

At 1532, the data processor provides a destination address range DR(j) to the SAM instrument 1300, 1400 associated with the source port address SP(i). Along with providing DR(j), the data processor can further provide a time interval over which the SAM instrument 1300, 1400 is to perform the monitoring of DR(j). In some cases, the data processor can initialize, e.g., to zero, the third register 1330, 1440 of the SAM instrument 1300, 1400.

At this point of the sequence of operations 1530$(i,j)$, the SAM instrument 1300 performs the process 1305 described above in connection with FIG. 13 or the SAM instrument 1400 performs the process 1405 described above in connection with FIG. 14. Notably, the process 1305 or 1405 is performed by the respective SAM instrument 1300 or 1400 over the time interval provided by the data processor and while the computing resources of the computing system 100C are performing operations in accordance with the above-noted distributed operation assignment. In this manner, upon completion of the process 1305 or 1405, the respective SAM instrument 1300 or 1400 has stored, in the respective third register 1330 or 1440, a count value CV(i,j) that can be accessed by the data processor for further processing.

At 1537, the data processor calculates a value of network-traffic TV(i,j) based on the counter value CV(i,j) collected by process 1305 or 1405 and the time interval $\Delta T$. For example, the value of network-traffic TV(i,j) can be calculated as a ratio of CV(i,j) and $\Delta T$.

Note that the sequence of operations 1530$(i,j)$ described above can be performed iteratively as part of either process 1600 as described below in connection with FIG. 16A, or process 1700 as described below in connection with FIG. 17A.

Figure 15B:
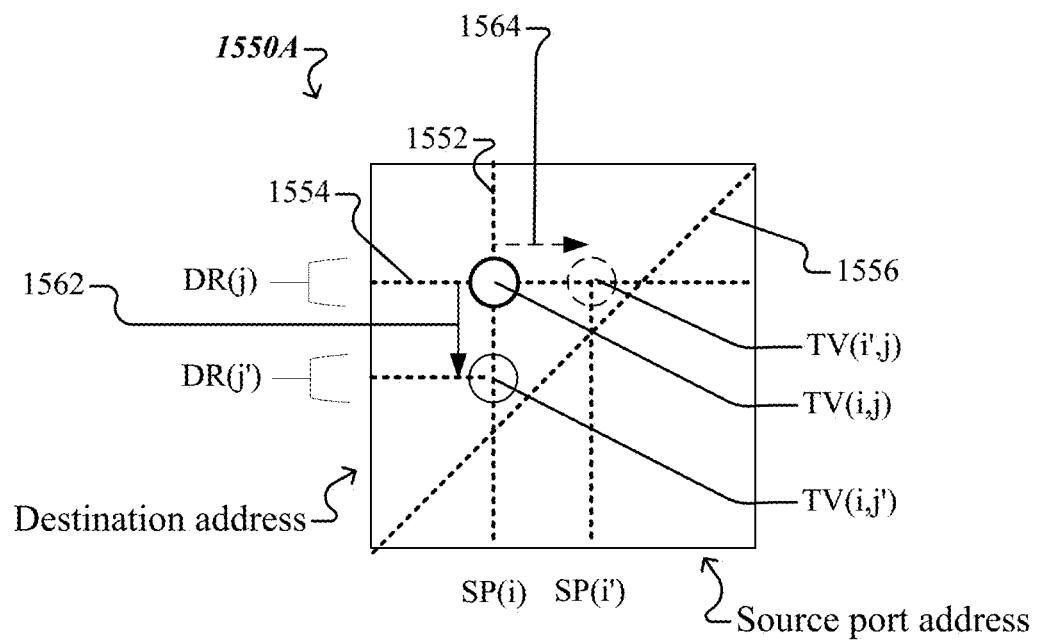

Referring now to FIG. 15B, the value of network-traffic TV(i,j) produced using the sequence of operations 1530$(i,j)$ can be represented as part of an instance 1550A of an affinity chart. The horizontal axis of an affinity chart represents all possible source port addresses and the vertical axis represents all possible addresses of destinations of network-traffic, respectively of the data space used by computing resources of the computing system 100C. Here, each time a data packet is sent, from a processing device that includes an output network port having a source port address SP(i) 1552, to a computing resource that has an address 1554 in address range DR(j), a network-traffic value TV(i,j) is updated at that intersection of column SP(i) with row DR(j) of the affinity chart 1550A. In some implementations, the network-traffic values represented in an affinity chart are the count values collected during a specified time interval (e.g., during a unit of time).

As the address space used by the computing resources of computing system 100C is not only flat, but also hierarchical, the most significant bits of an address suitably refer to a processing device (essentially an entire chip) 102. Less significant bits refer a cluster 110's number within that processing device, and the least significant bits to a memory region 118 or a processing engine 120 within that cluster 110. In some cases, addresses of processing devices are configured so that (for example) processing device #0 is right next to processing device #1, while processing device #500 is much further away from processing device #1 (with distance typically defined primarily in terms of network hops). As such, network-traffic from a processing device to itself lands on a diagonal 1556 of the affinity chart, while long-distance network-traffic appears far away from the diagonal.

Moreover, an affinity chart has a form somewhat similar to distance charts found on some travel books, the distance charts including cities listed on both the horizontal-axis and vertical-axis, and the distance from one city to another being entered at the intersection of that row and column. However, for an affinity chart, rather than a distance, the intersection of a row DR(j) and a column SP(i) has a corresponding value TV(i,j) of network-traffic from a source port address SP(i) to a destination address range DR(j) in the network, where TV(i,j) can be represented in the affinity chart at a desired level of granularity (precision). Depending on the level of desired precision, the foregoing network-traffic value TV(i,j) can be represented as a number, in some implementations. In other implementations, the value TV(i,j) of network-traffic from a source port address SP(i) to a destination address range DR(j) in the network can be represented using color or symbol shape/size coding to make the most interesting data as easy to find as possible.

Referring back to FIG. 15A, at 1540, the data processor determines, based on the calculated value of network-traffic TV(i,j) an adjustment to the distributed task assignment, such that, when implemented, the adjustment causes lowering of a cost of performing the tasks by the computing resources of computing system. For instance, if the calculated value of network-traffic TV(i,j) exceeds a threshold value $TV_{th}$ and is represented as far, non-diagonal network-traffic in the instance 1550A of the affinity chart shown in FIG. 15B, then tasks to be executed by at least some of the computing resources of the computing system 100C can be reassigned to other of the computing resources to keep long distance network-traffic to a minimum, in the following manner.

Assume that data stored at memory 118 communicatively coupled with the source port address SP(i) is to be processed by a processing engine 120 having an address in the destination address range DR(j). For example, the data processor can determine, at 1540, an adjustment 1562 to a distributed task assignment associated with the computing resources of computing system 100C. As part of the adjustment 1562, processing of the data stored at the memory 118 communicatively coupled with the source port address SP(i) can be reassigned to another processing engine 120 having an address in another destination address range DR(j'), such that a new distance between SP(i) and DR(j') is shorter than an original distance between SP(i) and DR(j). In this manner, when the adjustment 1562 is implemented, the cost for performing the tasks by the computing resources of computing system 100C will be lower because TV(i,j') is now produced by near-diagonal network-traffic which is less expensive than TV(i,j) that was originally produced by far, non-diagonal network-traffic.

As another example, the data processor can determine, at 1540, an adjustment 1564 to the distributed task assignment. As part of the adjustment 1564, storing of the data to be processed by the processing engine 120 having the address in the destination address range DR(j) has been reassigned to another memory 118 communicatively coupled with a source port address SP(i'), such that a new distance between SP(i') and DR(j) is shorter than the original distance between SP(i) and DR(j). In this manner, when the adjustment 1564 is implemented, the cost for performing the tasks by the computing resources of computing system 100C will be lower because TV(i',j) is now produced by another near-diagonal network-traffic which is less expensive than TV(i,j) that was originally produced by far, non-diagonal network-traffic.

Referring now to FIG. 16A, after the operations at 1510 and the operations at 1520 of the process 1600 have been completed as described above, a loop 1630(i) of this process is performed next. The loop 1630(i) has N iterations, such that the $j^{th}$ iteration of the loop 1630(i) is the sequence of operations 1530(i,j) corresponding to the destination address range DR(j) that are performed in part by the SAM instrument 1300, 1400 associated with the source port address SP(i). Here, a single instrument associated with a single source port address is used to iteratively produce network-traffic values corresponding to multiple destination address ranges. In this manner, a first iteration of the loop 1630(i) produces a first network traffic value TV(i,1) corresponding to DR(1) and associated with SP(i); a second iteration of the loop 1630(i) produces TV(i,2) corresponding to DR(2) and associated with SP(i); and so on and so forth to the $N^{th}$ iteration of the loop 1630(i) that produces TV(i,N) corresponding to DR(N) and associated with SP(i). In some implementations, because the loop 1630(i) uses a single instrument, the network-traffic values {TV(i,1), TV(i,2), . . . , TV(i,N)} are produced sequentially in time. In other implementations, the network-traffic values {TV(i,1), TV(i,2), . . . , TV(i,N)} can be produced in a time-interleaved manner.

Figure 16B:
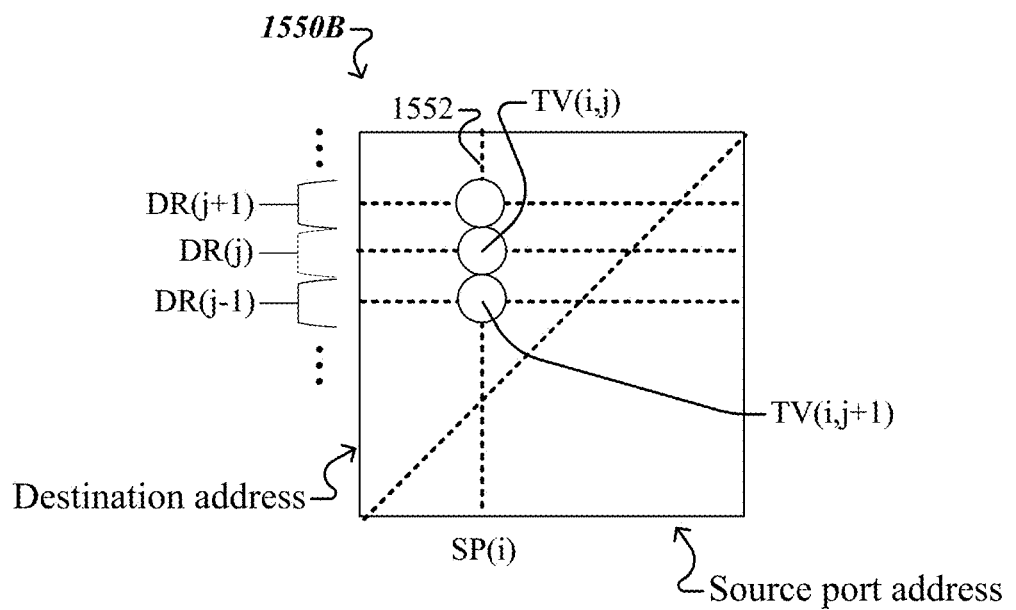

Referring now to FIG. 16B, the network-traffic values {TV(i,1), TV(i,2), . . . , TV(i,N)} produced by the loop 1630(i) can be represented as part of an instance 1550B of an affinity chart. By moving, in accordance with the iterations of loop 1630(i), the destination address range DR(j) across the whole address space (e.g., over all the computing resources of each processing device 102 of computing system 100C), a vertical line 1552 corresponding to the source port address SP(i) in the affinity chart can be filled.

Referring back to FIG. 16A, at 1640, the data processor determines, based on the network-traffic values {TV(i,1), TV(i,2), . . . , TV(i,N)} produced by the loop 1630(i), an adjustment to the distributed task assignment, such that, when implemented, the adjustment causes lowering of a cost of performing the tasks by the computing resources of computing system. As this adjustment has been determined at 1640 based on N>1 network traffic values, it is likely to be more precise than the adjustment determined at 1540 based on a single traffic value.

Referring now to FIGS. 17A and 18A, after the operations at 1510 of each of the processes 1700 and 1800 have been completed as described above, at 1720, the data processor establishes communications with M instances of the SAM instrument 1300 or 1400 connected to an output port of L1-router 104 of respective processing devices 102 having respective source port addresses SP(1), SP(2), ..., SP(M) of the address space used by the computing resources of the computing system 100C.

Referring now to FIG. 17A, after the operations at 1510 and the operations at 1720 of the process 1700 have been completed as described above, a loop 1730(j) of this process is performed next. The loop 1730(j) has M iterations, such that the ith iteration of the loop 1730(j) is the sequence of operations 1530(i,j) corresponding to the destination address range DR(j) that are performed in part by an instance of the SAM instrument 1300, 1400 associated with the source port address SP(i). Here, multiple instances of an instrument associated with respective source port addresses are used iteratively to produce respective network-traffic values corresponding to a single destination address range. In this manner, a first iteration of the loop 1730(j) produces a first network traffic value TV(1,j) corresponding to DR(j) and associated with SP(1); a second iteration of the loop 1730(i) produces TV(2,j) corresponding to DR(j) and associated with SP(2); and so on to the $N^{th}$ iteration of the loop 1630(i) that produces TV(M,j) corresponding to DR(j) and associated with SP(M). In some implementations, because the loop 1730(j) uses multiple instances of an instrument, the network-traffic values {TV(1,j), TV(2,j), ..., TV(M,j)} can be produced concurrently. In other implementations, the network-traffic values {TV(1,j), TV(2,j), ..., TV(M,j)} can be produced in a sequential manner.

Figure 17B:
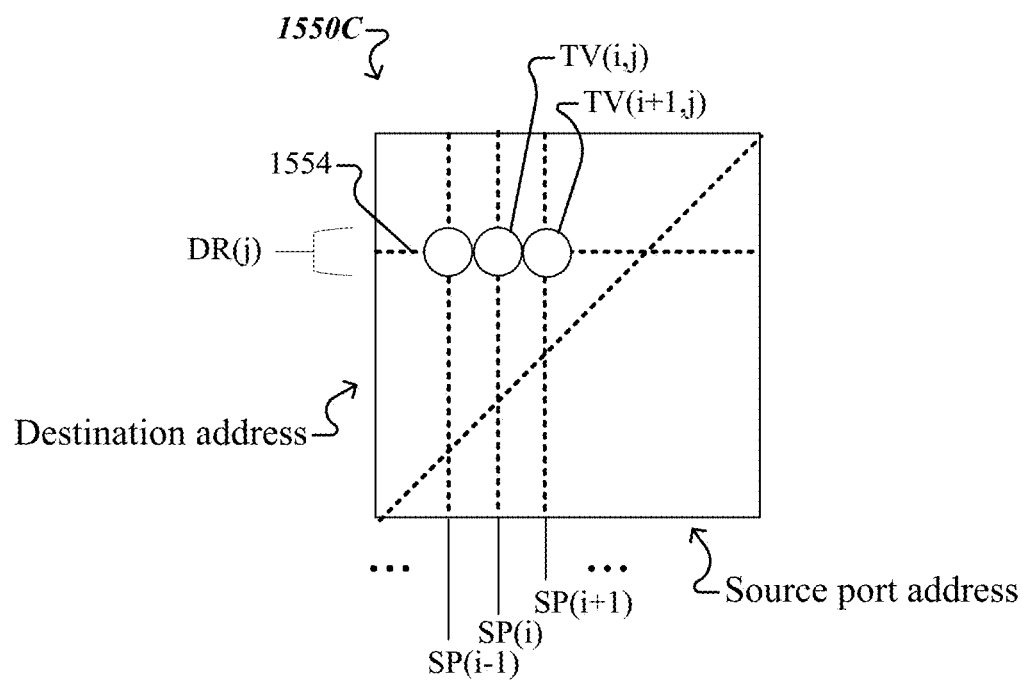

Referring now to FIG. 17B, the network-traffic values {TV(1,j), TV(2,j), ..., TV(M,j)} produced by the loop 1730(j) can be represented as part of an instance 1550C of an affinity chart. By moving, in accordance with the iterations of loop 1730(j), the source port address SP(i) across the whole address space (e.g., over all the processing devices 102 of computing system 100C that are equipped with respective instances of the SAM instrument 1300, 1400), a horizontal line 1554 corresponding to the destination address range DR(j) in the affinity chart can be filled.

Referring back to FIG. 17A, at 1740, the data processor determines, based on the network-traffic values {TV(1,j), TV(2,j), ..., TV(M,j)} produced by the loop 1730(j), an adjustment to the distributed task assignment, such that, when implemented, the adjustment causes lowering of cost of performing the tasks by the computing resources of computing system. As this adjustment has been determined at 1740 based on M>1 network traffic values, it is likely to be more precise than the adjustment determined at 1540 based on a single traffic value.

Referring now to FIG. 18A, after the operations at 1510 and the operations at 1720 of the process 1800 have been completed as described above, either a loop 1830A or another loop 1830B of this process is performed next, depending on the implementation. In either implementation, multiple instances of an instrument associated with respective source port addresses are used iteratively to iteratively produce network-traffic values corresponding to multiple destination address ranges, as described below.

In some implementations, the loop 1830A of the process 1800 is used. This loop has N iterations, such that the $j^{th}$ iteration of the loop 1830A is the loop 1730(j) corresponding to the destination address range DR(j) that is performed in part by M instances of the SAM instrument 1300, 1400 associated with respective source port addresses SP(1), ..., SP(M). In this manner, a first iteration of the loop 1830A produces a first set of network traffic values {TV(1,1), TV(2,1), ..., TV(M,1)} corresponding to DR(1) and associated with respective SP(1), SP(2), ..., SP(M); a second iteration of the loop 1830A produces a second set of network traffic values {TV(1,2), TV(2,2), ..., TV(M,2)} corresponding to DR(2) and associated with respective SP(1), SP(2), ..., SP(M); and so on and so forth to the $N^{th}$ iteration of the loop 1830A that produces a $N^{th}$ set of network traffic values {TV(1,N), TV(2,N), ..., TV(M,N)} corresponding to DR(N) and associated with respective SP(1), SP(2), ..., SP(M).

Figure 18B:
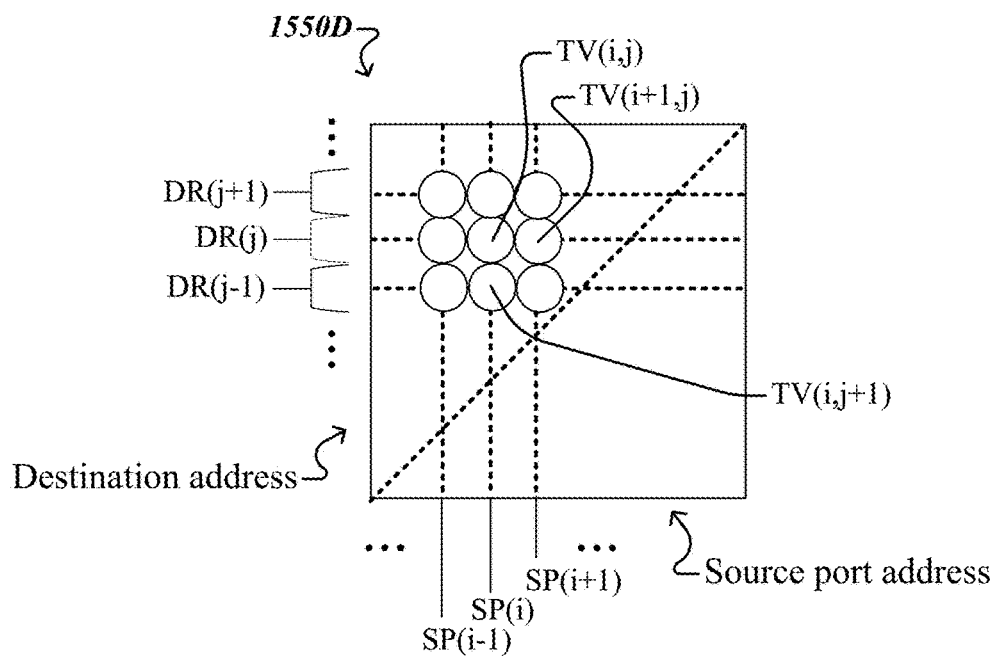

Referring now to FIG. 18B, the network-traffic values produced by the loop 1830A can be represented as part of an instance 1550D of an affinity chart. By moving, in accordance with the iterations of loop 1830A, the destination address range DR(j) across the whole address space (e.g., over all the computing resources of each processing device 102 of computing system 100C), each of the vertical lines corresponding to the source port addresses SP(1), ..., SP(M) in the affinity chart can be filled. In this manner, the loop 1830A of the process 1800 can be used to produce the affinity chart 1500, one vertical line at-a-time.

Returning to FIG. 18A, some implementations, the loop 1830B of the process 1800 is used. This loop has M iterations, such that the $i^{th}$ iteration of the loop 1830B is the loop 1630(i) corresponding to N destination address ranges DR(1), ..., DR(N) that is performed in part by the SAM instrument 1300, 1400 associated with a source port address SP(i). In this manner, a first iteration of the loop 1830B produces a first set of network traffic values {TV(1,1), TV(1,2), ..., TV(1,N)} corresponding to respective DR(1), DR(N) and associated with SP(1); a second iteration of the loop 1830B produces a second set of network traffic values {TV(2,1), TV(2,2), ..., TV(2,N)} corresponding to respective DR(1), DR(N) and associated with SP(2); and so on and so forth to the $M^{th}$ iteration of the loop 1830B that produces a $M^{th}$ set of network traffic values {TV(M,1), TV(M,2), ..., TV(M,N)} corresponding to respective DR(1), ..., DR(N) and associated with SP(M).

Referring now to FIG. 18B, the network-traffic values produced by the loop 1830B can be represented as part of an instance 1550D of an affinity chart. By moving, in accordance with the iterations of loop 1830B, the source port address SP(i) across the whole address space (e.g., over all the computing resources of each processing device 102 of computing system 100C), each of the horizontal lines corresponding to the destination address ranges DR(1), DR(N) in the affinity chart can be filled. In this manner, the loop 1830B of the process 1800 can be used to produce the affinity chart 1500, one horizontal line at-a-time.

Referring back to FIG. 18A, the data processor determines, based on the network-traffic values {TV(1,1), TV(2, 1), ..., TV(M,1), TV(1,2), TV(2,2), ..., TV(M,2), ..., TV(1,N), TV(2,N), ..., TV(M,N)}, produced by either the loop 1830A or the loop 1830B, an adjustment to the distributed task assignment, such that, when implemented, the adjustment causes lowering of cost of performing the tasks by the computing resources of computing system. As this adjustment has been determined at 1840 based on M×N network-traffic values, it is likely to be more precise than the either the adjustment determined at 1640 based on N network-traffic values or at 1740 based on M network-traffic values.

The technologies described above in this specification can be used to tune code of a program running on a plurality of computing resources of the computing system 100C. In particular, transmission between the computing resources over longer distances almost always increases latency, and typically limits bandwidth as well. The greatest bandwidth and lowest latency is between processing engines 120 in a single cluster 110 of a processing device 102. The next fastest is between processing engines 120 of different clusters 110 within a single super-cluster 130. After that, it is between processing engines 120 of different super-clusters 130, but still within a single processing device 102. Inter-processing device transmission adds the possibility of multiple hops from a source computing resource to destination computing resource, as well as the possibility that (for example) one route might have greater bandwidth (multiple physical links) where another has lower latency (fewer hops).

Figure 19:
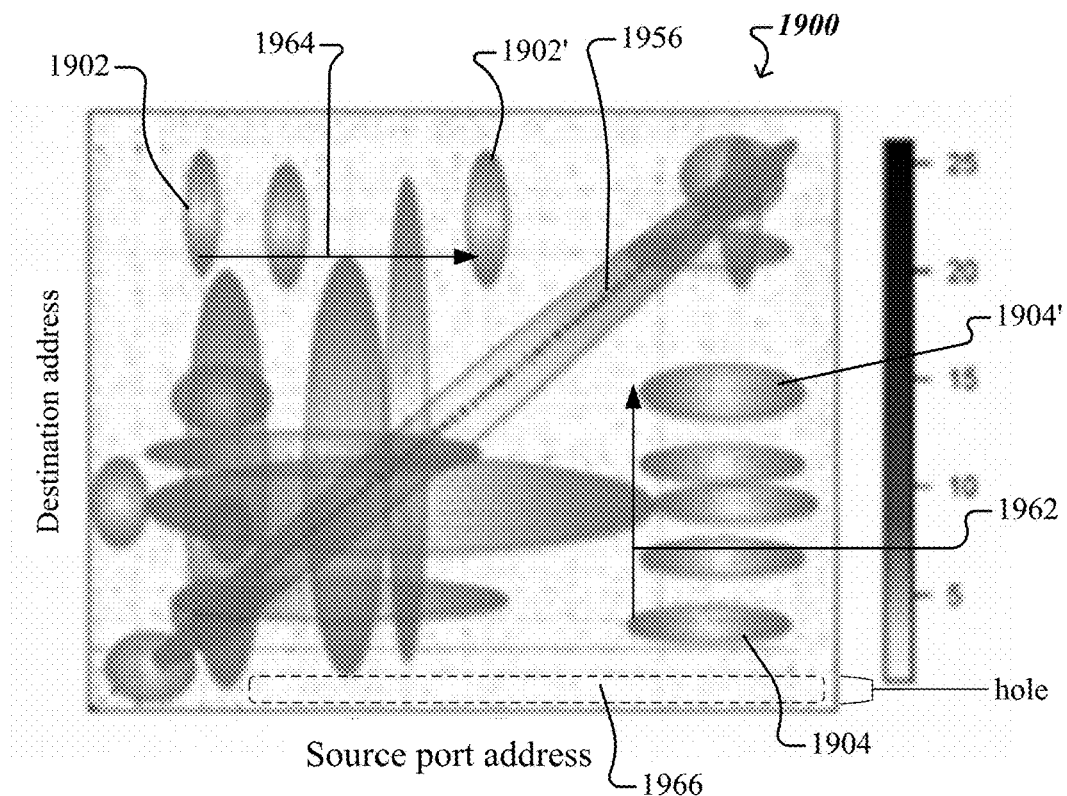
FIG. 19 shows an example of an affinity chart produced based on the process described in connection with FIGS. 18A-18B.

Referring now to FIG. 19, affinity data collected as described above, e.g., using the process 1800, can be represented in affinity chart 1900 to provide guidance about which logical processes communicate with which others (and, of course, which don't, or communicate so little that such communications have little effect on total expense). For instance, affinity chart 1900 shows that a majority of network-traffic in computing system 100C is on, or adjacent to, the diagonal 1956 of the affinity chart, indicating that most of network communications are carried out between computing resources located at the same processing device 102 (e.g., between processing engines 120 of the same chip) or at processing devices linked through short network connections (e.g., characterized by a few network hops.) However, the affinity chart 1900 also shows that some network-traffic bundles are off the diagonal 1956, e.g., bundles 1902 or 1904, indicating that corresponding network communications are carried out between computing resources located at different processing devices 102 that are linked through more expensive network connections (e.g., characterized by many network hops.)

As such, the collected affinity data, e.g., as represented in affinity chart 1900, can be used to tune the code, e.g., by moving kernels of code closer together if they communicate a great deal, and further apart if they don't. This can be used in conjunction with other profiling techniques to determine which parts of the code are sensitive to latency vs. bandwidth, to determine which route(s) to use when/if a direct tradeoff between bandwidth and latency is available. Note that, as part of some profiling techniques, the program is simply run under some particular circumstances and a time it takes to complete some work is recorded.

As such, code optimization will be suitably carried out in two phases. In a first phase, known aspects of a process are looked at. For example, when a particular communication between a pair of processing engines 120 is bandwidth sensitive, the particular communication is assigned to be carried out between processing engines that are placed/distributed based on bandwidth of connections there between. As another example, when a particular communication between a pair of processing engines 120 is latency sensitive, the particular communication is assigned to be carried out between processing engines that are placed/distributed based on latency of connections there between. This first phase of the code optimization allows determination of a few of (what are hoped to be) some of the most important parameters. However, there will be communications left for which knowledge necessary to optimize with any certainty is lacking. In many of these cases, requirements may conflict so it's not immediately apparent how to balance requirements for bandwidth and latency. For these, a second phase of the code optimization that uses simulated annealing, e.g., as described above in connection with FIGS. 8 and 11-12, can be implemented to find a configuration that at least approaches a global optimum. In this case, the intent is to run the program under a number of different circumstances to find which parameters have large effects on execution speed, and which don't.

The foregoing optimizations result in adjustments that include a reduction in effective distance or other cost parameter. Optimization carried out in the manners described above can result in adjustments to the assignment of operations performed by the computing resources of the computing system 100C. For example, in affinity chart 1900, adjustment 1962 is represented by a vertical arrow and corresponds to reassigning processing tasks from a computing resource within a destination address range that is far from a data source communicatively coupled with a source port address, represented as bundle 1904, to a computing resource within a new destination address range that is closer to the source port address, represented as bundle 1904'. As another example, adjustment 1964 is represented by a horizontal arrow and corresponds to reassigning data sourcing tasks from a data source communicatively coupled with a source port address that is far from a processing computing resource within a destination address range, represented as bundle 1902, to a data source communicatively coupled with a new source port address that is closer to the destination address range, represented as bundle 1902'. The effective distance will typically be measured in terms the number of network hops from a source port address to destination address range, which might not correspond directly to a physical distance between a computing resource communicatively coupled with the source port address and a computing resource from the destination address range.

Also note that if the parameter being optimized is bandwidth, concern for a particular link is basically a step function. That is, there may be little benefit to reducing bandwidth usage from, say, 70% to 20%—but quite possibly a huge benefit to reducing from 100% to 90%.

Figure 20A:
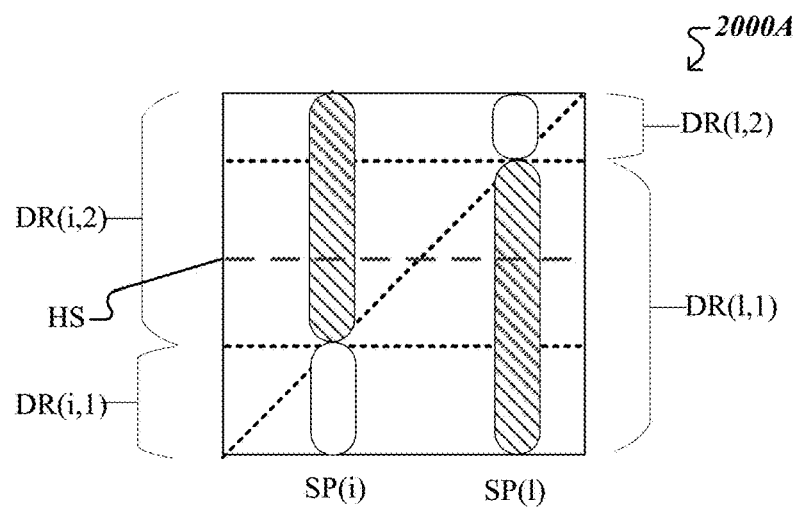
FIGS. 20A-20C show aspects of a process for finding a network-traffic hot spot of an address space by using a binary search process.
Figure 20B:
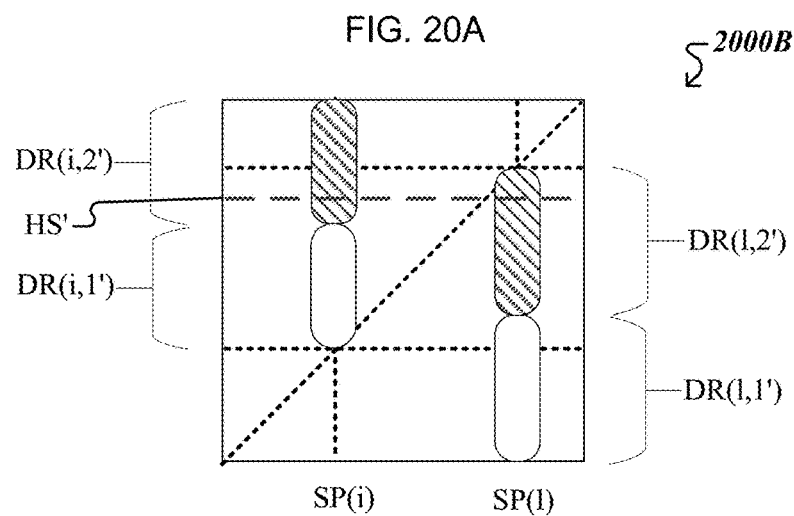
Figure 20C:
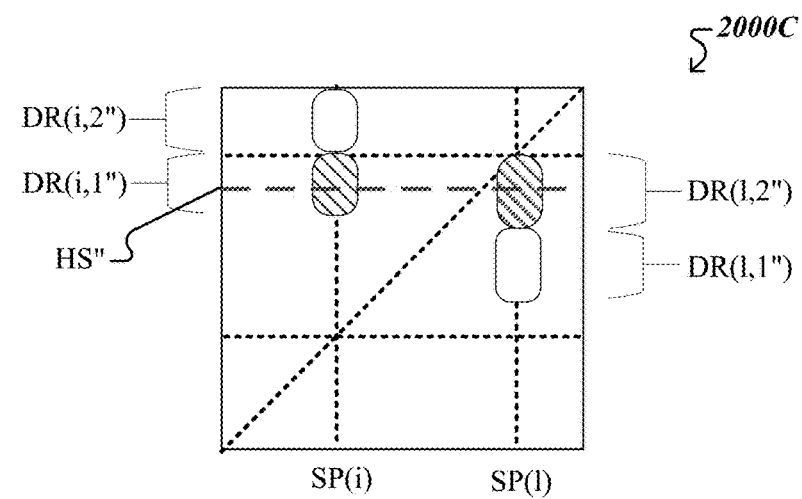

Further, the technologies described above in this specification can be used to determine a portion of an address space associated with the computing system 100C having the highest usage, also referred to as a network-traffic hot spot of the address space. FIGS. 20A-20C show aspects of a binary search process for finding the network-traffic hot spot of the address space. Here, a data processor of the computing system 100C, e.g., the host 11, can control collection of network-traffic data by one or more instances of a SAM instrument 1300, 1400 connected to output ports of at least some of the processing devices 102 to perform a binary search for a portion of the address space associated with the computing system that is most heavily loaded.

As a first step, the instances of the SAM instrument 1300, 1400 operated at respective source port addresses, e.g., SP(i), SP(l), etc., start by sampling over a period of time the entire address space to determine an approximate rate at which data packets are being transmitted. A computing system 100C is said to be reasonably stable if computing resources of its processing devices 102 exchange data packets at about the same rate over time. Here, the larger of two portions of the address space—that are separated by a source port address associated with the respective instance of the SAM instrument 1300, 1400—is selected so it can be further searched. FIG. 20A shows an instance 2000A of an affinity chart in which the selected portions are hashed. In this example, for the instance of the SAM instrument 1300, 1400 associated with SP(i), the selected portion is DR(i,2), and for the instance of the SAM instrument 1300, 1400 associated with SP(l), the selected portion is DR(l,1). Note that, at this point, a calculated address HS of the hot spot, represented by dash-line in the affinity chart 2000A, is approximately at the center of the address space, possibly quite far away from an actual address range of the hot spot.

As a next step, the instances of the SAM instrument 1300, 1400 operated at respective source port addresses, e.g., SP(i), SP(1), etc., sample one half of the selected portion of the address space for the same period of time. The half of the selected portion of address space that is carrying the majority of the data traffic is determined in this manner. The determined half becomes the currently selected portion of address space, so it can be further searched. FIG. 20B shows another instance 2000B of the affinity chart in which the selected portions are hashed. In this example, for the instance of the SAM instrument 1300, 1400 associated with SP(i) the selected portion is DR(i,2'), and for the instance of the SAM instrument 1300, 1400 associated with SP(1) the selected portion is DR(1,2'). Note that an updated calculated address HS'of the hot spot has shifted closer to the actual address range of the hot spot.

As a next step, the previously described step can be repeated relative to the currently selected portions of address space. FIG. 20C shows another instance 2000C of the affinity chart in which the selected portions are hashed. In this example, for the instance of the SAM instrument 1300, 1400 associated with SP(i) the selected portion is DR(i,1"), and for the instance of the SAM instrument 1300, 1400 associated with SP(1) the selected portion is DR(1,2"). Note that an updated calculated address HS" of the hot spot has shifted asymptotically closer to the actual address range of the hot spot.

These steps can be repeated as necessary until the address range of the hot spot has been determined (with whatever desired level of granularity). In this manner, the top K (e.g., K=10) destinations for data (or all destinations that exceed a specified threshold) can be found. For instance, once the hot-spot with the largest network-traffic value has been found, the affinity data, e.g., as represented in affinity chart 2000, can be re-examined to find the next largest, and so on.

In many cases, having determined the destination of a large network-traffic, it would be beneficial to work backward to find the source(s) of that network-traffic. Again, based upon the routing pattern in use, this can be determined by setting up monitoring along the path(s) toward a given destination, as explained below. The disclosed technique for backward tracking is based upon two things: 1) the external ports of a processing device 102 are used by SAM instruments 1300, 1400 to monitor data packets in point-to-point connections, so network-traffic coming in at a given port of the processing device was necessarily transmitted from one other device; and 2) host computer 11 has access to data specifying the connections between processing devices, so it can determine that data being sent to input port of processing device "j" was sent there from some other processing device "i". Note that processing device "i" may not have been the original source of those packets—it may be the source of some, but merely the last link in a chain leading to processing device "j" from some other processing devices.

Moreover, a SAM instrument 1300, 1400 of each of at least some of the processing devices 102 is suitably programmed to raise an alarm if excessive traffic is detected at that processing device. In response to the alarm, the host 11 can identify the input port(s) that is (are) producing the bulk of this network-traffic. Then, the host 11 determines from its global routing table the processing device(s) that is (are) connected to that port (those ports). The process continues until the source(s) of the unexpected level of activity is reached.

Furthermore, the disclosed technologies described can be used to monitor port activity at an L1-router 104 of a processing device 102. Port activity monitoring allows counting the total number of data packets emerging from a given port of the L1-router 104 per unit time to compute a network-traffic value TV for the given port. Network-traffic values computed in this manner at various ports of the L1-router 104 can be used for locating overloaded ports thereof by comparing the network traffic values against network-traffic thresholds. Additionally, network-traffic values computed in this manner at various ports of the L1-router 104 can be used for determining paths that are not programmed into the L1-router's address resolution table (ART). Also, the computed network-traffic values can be used for determining whether the L1-router 104 has been configured such that a particular port is used as expected.

Additionally, the disclosed technologies can be used to check for errant packets during debugging or execution of a program run by a plurality of computing resources of the computing system 100C. For instance, debug checking allows a programmer to set a range of addresses (watch area) that, if written to, will cause signaling of an error. Optionally, the signaling includes interrupting the execution of the program. In a conventional debugger, a breakpoint can be set to stop a program's execution when (for example) a particular location is written (i.e., when a particular variable is modified). This can be implemented in a more selective manner, such as by stopping execution if this variable has changed 50 times, or only stop when/if a value outside this watch area is written to the variable. As part of watch checking, the host computer 11 does roughly the same thing, but in a distributed computing system.

Also, the disclosed technologies can be used to detect erroneous programs that run in the computing system 100C. For example, an address space of the computing system 100C can have "holes", where a hole of the address space is a range of addresses that simply isn't used. The affinity chart 1900 represents a hole 1966 of the address space of the computing system 100C as an "empty horizontal band", for instance. Any data packet addressed to this address range is suitably deemed to be erroneous. It might be a bug, or it might be malware, but either way it is beneficial to identify the program that is doing this, and either get rid of the program in question (if it's malware) or fix it (if it's a bug).

In addition, the disclosed technologies can be used to determine functionality of a program running on the computing resources of the computing system 100C. Here, the affinity data can be used to determine average and standard deviation of network-traffic values corresponding to a source port address. It is typically expected that the standard deviation is fairly high for a source port address from where quite a bit of data is transmitted to a few computing resources in a given destination address range, and none (or nearly none) to most others destination address ranges. A program that sends a small amount of data from a particular source port address to most of the computing resources could be (for example) a port scanner, probing for computing system 100C's vulnerabilities. This would be detected as an extremely low standard deviation. The standard deviation isn't the only measure of variation among samples—other measures such as variance also can be used.

Other representations of the affinity data are possible. For some purposes, it may be preferable to present this data in tabular form, e.g., as shown in Table 1, rather than graphical form, e.g., as shown in FIG. 19, especially if looking for data that isn't simply about total amounts, such as, e.g., when tracking down a source of an odd data packet if a destination is receiving an odd number of data packets, but only even numbers are expected.

TABLE 1

| Source | Destination | | | | |
|---|---|---|---|---|---|
| | Machine 1 | Machine 2 | Machine 3 | Machine 4a | Machine 4b |
| Machine 1 | — | 1.2 | 1.1 | 0.7 | 17.4 |
| Machine 2 | 2.7 | — | 0.9 | 7.8 | 0.1 |
| Machine 3 | 2.1 | 1.1 | — | 3.3 | 2.1 |
| Machine 4a | 12.2 | 0.3 | 2.9 | — | — |
| Machine 4b | 13.2 | .2 | 2.8 | — | — |

In these cases, the disclosed technique for tracking down the source of an odd data packet can be performed in the following manner. Data packets addressed to a destination DR(j) can be sampled as illustrated in connection with FIG. 13 or 14. If it is determined, based on a global routing table maintained by a host 11 of computing system 100C, that odd numbers of data packets are coming from one port of the L1-router 104 of a processing device 102, then it can be inferred which other processing device of the computer system 100C is sending data to that port. As such, a SAM instrument 1300, 1400 coupled at the output port of the L1-router 104 of that processing device 102 can be used to determine where the odd data packets are coming from, and repeat until the processing device that is the source of the odd data packets is identified.

Table 1 further shows that since network-traffic is monitored at outgoing network ports, affinity histogramming is directed to measuring network-traffic addressed to different parts of a particular processing device 102, e.g., machine 4a and machine 4b), but is not directed to measuring network-traffic between two parts of the same processing device, as indicated by the dash-symbols. Moreover, in some implementations, the network-traffic values represented in an affinity table (e.g., like Table 1) are the count values collected during a specified time interval (e.g., during a unit of time).

The type of affinity data representation can be configured to automatically change from a table, e.g., Table 1, when presenting a smaller number of data points to a color-coded affinity chart, e.g., 1900, when presenting a large number of data points. A user can configure the point at which the affinity data representation switches types. Either or both types of display can be preferred, depending on the application being monitored. Additionally, both affinity charts (e.g., 1900) and affinity tables (e.g., Table 1) can be set to represent network-data values either in terms of total data-packet count per unit time, TV(i,j), or bandwidth BV(i,j).

In the above description, numerous specific details have been set forth in order to provide a thorough understanding of the disclosed technologies. In other instances, well known structures, interfaces, and processes have not been shown in detail in order to avoid unnecessarily obscuring the disclosed technologies. However, it will be apparent to one of ordinary skill in the art that those specific details disclosed herein need not be used to practice the disclosed technologies and do not represent a limitation on the scope of the disclosed technologies, except as recited in the claims. It is intended that no part of this specification be construed to effect a disavowal of any part of the full scope of the disclosed technologies. Although certain embodiments of the present disclosure have been described, these embodiments likewise are not intended to limit the full scope of the disclosed technologies.

While specific embodiments and applications of the disclosed technologies have been illustrated and described, it is to be understood that the disclosed technologies are not limited to the precise configuration and components disclosed herein. The terms, descriptions and figures used herein are set forth by way of illustration only and are not meant as limitations. Various modifications, changes, and variations which will be apparent to those skilled in the art may be made in the arrangement, operation, and details of the apparatuses, methods and systems of the disclosed technologies disclosed herein without departing from the spirit and scope of the disclosed technologies. For example, it will be understood that the block diagrams included herein are intended to show a selected subset of the components of each apparatus and system, and each pictured apparatus and system may include other components which are not shown on the drawings. Additionally, those with ordinary skill in the art will recognize that certain steps and functionalities described herein may be omitted or re-ordered without detracting from the scope or performance of the embodiments described herein.

The various illustrative logical blocks, modules, circuits, and algorithm steps described in connection with the embodiments disclosed herein may be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application—such as by using any combination of control circuitry, e.g., state machines, microprocessors, microcontrollers, field programmable gate arrays (FPGAs), application specific integrated circuits (ASICs), and/or System on a Chip (SoC)—but such implementation decisions should not be interpreted as causing a departure from the scope of the disclosed technologies.

The steps of a method or algorithm described in connection with the embodiments disclosed herein may be embodied directly in hardware, in a software module executed by a data processor, or in a combination of the two. A software module may reside in RAM, flash memory, ROM, EPROM, EEPROM, registers, hard disk, a removable disk, a CD-ROM, or any other form of storage medium known in the art.

The methods disclosed herein include one or more steps or actions for achieving the described method. The method steps and/or actions may be interchanged with one another without departing from the scope of the disclosed technologies. In other words, unless a specific order of steps or actions is required for proper operation of the embodiment, the order and/or use of specific steps and/or actions may be modified without departing from the scope of the disclosed technologies.

What is claimed is:

1. A network-traffic monitoring system comprising:
a data collecting instrument comprising:
(a) an input coupled with an output network port of a processing device, the input configured to receive a destination address of each data packet transmitted from the output network port of the processing device, wherein the processing device is connected to a plurality of processing devices and wherein the processing device is configured to transmit data packets from output network ports of the processing device to other devices of the plurality of processing devices,
(b) one or more address registers configured to store information about a destination address range,
(c) a counter register configured to store a counter value, and
(d) digital circuitry coupled with the input, the one or more address registers, and the counter register, the digital circuitry configured to:
(I) determine, based on the information stored in the one or more address registers, that the destination address received at the input is within the destination address range, and
(II) increment the counter value stored in the counter register; and
a data processor communicatively coupled with the data collecting instrument and the plurality of processing devices, wherein the data processor is configured to:
(i) provide to the input of the data collecting instrument a first address range as the destination address range,
(ii) access the counter value stored in the counter register of the data collecting instrument, the counter value collected over a time interval while the plurality of processing devices performed operations in accordance with a distributed operation assignment,
(iii) determine, based on the counter value, an adjustment to the distributed operation assignment, wherein the adjustment comprises reassigning at least some operations executed by one of the plurality of processing devices having a first address within the first address range to another one of the plurality of processing devices having a second address within a second address range, wherein a separation between a source port address and the second address range is smaller than a separation between the source port address and the first address range, and
(iv) reassign, based on the determined adjustment, the at least some operations executed by the one of the plurality of processing devices.

2. The network-traffic monitoring system of claim 1, wherein:
the one or more address registers of the data collecting instrument comprise:
(i) a first register configured to store a low end of the destination address range, and
(ii) a second register configured to store a high end of the destination address range, and
the digital circuitry of the data collecting instrument comprises:
(i) comparator gates coupled with the input to access the destination address, the first register, and the second register, the comparator gates configured to determine that the destination address is between the low end of the destination address range and the high end of the destination address range, and (ii) a counter circuit coupled with the comparator gates and the counter register, the counter circuit configured to increment by one the counter value stored in the counter register.

3. The network-traffic monitoring system of claim 1, wherein
the one or more address registers of the data collecting instrument comprise:
(i) a first register configured to store a mask related to the destination address range, and
(ii) a second register configured to store a masked destination address range, and
the digital circuitry of the data collecting instrument comprises:
(i) AND-gates coupled with the input and the first register, the AND-gates configured to bit-wise AND a mask to the destination address to produce a masked destination address, and
(ii) a bit-wise comparator coupled with the and-gates and the second register, the bit-wise comparator configured to determine that the masked destination address is equal to the masked destination address range, and
(iii) a counter circuit coupled with the bit-wise comparator and the counter register, the counter circuit configured to increment by one the counter value stored in the counter register.

4. The network-traffic monitoring system of claim 1, wherein the data processor determines the adjustment by lowering a latency of network-traffic.

5. The network-traffic monitoring system of claim 1, wherein the data processor determines the adjustment by lowering a bandwidth of network-traffic.

6. The network-traffic monitoring system of claim 1, wherein the plurality of processing devices communicate based on network protocols comprising one of Ethernet, InfiniBand, Bluetooth, 802.11, 802.16 or LTE.

7. A method for monitoring network-traffic between a plurality of processing devices, the method comprising:
establishing, by a data processor, communications with the plurality of processing devices that are configured to perform data packet-based communications with each other;
establishing, by the data processor, communications with a plurality of data collecting instruments, wherein each data collecting instrument is coupled to an output network port of a respective processing device from among the plurality of processing devices, wherein the output network ports transmit data packets;
providing, by the data processor, a first address range to a first data collecting instrument;
determining, by the first data collecting instrument over a time interval, that a destination address of a data packet transmitted from the output network port associated with the data collecting instrument is within the first address range;
incrementing, by the first data collecting instrument, a first counter value stored in a counter register of the data collecting instrument;
accessing, by the data processor, the first counter value, the first counter value collected over a time interval while the plurality of processing devices performed operations in accordance with a distributed operation assignment;
determining, by the data processor, an adjustment to the distributed operation assignment, wherein the adjustment comprises reassigning, by the data processor using the first counter value of the first data collecting instrument, at least some operations to be executed by one of the plurality of processing devices having an address in the first address range to another one the plurality of processing devices having an address in a second address range, wherein a separation between a source port address and the second address range is smaller than a separation between the source port address and the first address range; and reassigning, by the data processor based on the determined adjustment, the at least some operations executed by the plurality of processing devices.

8. The method of claim 7, comprising:
representing, by the data processor, the first counter value corresponding to the first address range in a graph having an axis representing source port addresses and another axis representing destination address ranges.

9. The method of claim 7, comprising:
representing, by the data processor, the first counter value corresponding to the first address range in a table in which rows of the table correspond to one of source port addresses or destination address ranges, and columns of the table correspond to the one of destination address ranges or source port addresses.

10. The method of claim 7, comprising:
obtaining a plurality of counter values from a plurality of data collecting instruments, the plurality of counter values comprising the first counter value; and
applying, by the data processor, a binary search of the plurality of counter values to determine a hot spot corresponding to an address range with a largest counter value.

11. The method of claim 7, comprising:
obtaining a plurality of counter values from a plurality of data collecting instruments, the plurality of counter values comprising the first counter value; and
determining, by the data processor, an overloaded port of a network router using the plurality of counter values.

12. The method of claim 7, comprising:
obtaining a plurality of counter values from a plurality of data collecting instruments, the plurality of counter values comprising the first counter value;
determining, by the data processor, one or more statistics of the plurality of counter values; and
identifying, by the data processor based on the determined one or more statistics, functionality of a source responsible for at least some of the plurality of counter values.

13. The method of claim 7, comprising:
accessing the destination address of the data packet transmitted from the output network port associated with the first data collecting instrument; and
determining, by comparator gates of the first data collecting instrument, that the destination address is between a low end of an address range stored in a first register of the data collecting instrument and a high end of the address range stored in a second register of the data collecting instrument,
wherein the incrementing of the first counter value stored in the counter register is performed by a counter of the first data collecting instrument.

14. The method of claim 7, comprising:
accessing the destination address of the data packet transmitted from the output network port associated with the first data collecting instrument;

bit-wise ANDing, by a plurality of and-gates of the first data collecting instrument, a mask stored in a first register to the destination address to obtain a masked destination address; and
determining, by a bit-wise comparator of the first data collecting instrument, that the masked destination address is equal to a masked destination address range stored in a second register,
wherein the incrementing of the first counter value stored in the counter register is performed by a counter of the first data collecting instrument.

15. A network-traffic monitoring system comprising:
a host configured to communicate with a plurality of processing devices, each processing device comprising (i) a network router; and (ii) a plurality of computing resources; and
one or more data collecting instruments coupled with respective network routers of corresponding processing devices, each data collecting instrument comprising a counter and being configured to perform operations comprising:
(i) determining, for a packet transmitted from a network router coupled to the data collecting instrument while the plurality of computing resources of the plurality of processing devices are executing a software application comprising a plurality of tasks in accordance with a distributed task assignment, that a destination address of the packet is within a first address range, and
(ii) incrementing a counter value stored in an associated counter register,
wherein the host is configured to perform operations comprising:
accessing the counter value, the counter value collected over a time interval while the plurality of processing devices performed operations in accordance with a distributed operation assignment;
determining, using the counter value, an adjustment to the distributed task assignment, such that, when implemented, the adjustment causes lowering of a cost of performing the plurality of tasks by the plurality of computing resources of the plurality of processing devices, wherein the adjustment comprises reassigning at least some operations to be executed by a first computing resource having a first address within the first address range to a second computing resource having a second address within a second address range, such that separation between a source port address and the second address range is smaller than separation between the source port address and the first address range; and
implementing the adjustment to reassign the at least some operations executed by the first computing resource.

16. The monitoring system of claim 15, wherein the cost of operating the plurality of processing devices comprises a latency of network-traffic.

17. The monitoring system of claim 15, wherein the cost of operating the plurality of processing devices comprises a bandwidth of network-traffic.

18. The monitoring system of claim 15, wherein
each data collecting instrument is configured to perform operations comprising:
determining, for a second packet transmitted from a network router coupled to the data collecting instrument, that the destination address of the packet is within a third address range, and
incrementing a second counter value stored in the associated counter register, and the host is configured to perform operations comprising:
providing to each of the data collecting instruments the first address range and the third address range.

19. The monitoring system of claim 18, wherein the host is configured to perform operations comprising:
representing the counter value in a graph having an axis representing source port addresses and another axis representing destination addresses.

20. The monitoring system of claim 18, wherein the host is configured to perform operations comprising:
representing the counter value in a table in which rows and columns of the table each correspond to one of source port addresses or destination addresses.

21. The monitoring system of claim 18, wherein the host is configured to perform operations comprising:
obtaining a plurality of counter values from a plurality of data collecting instruments; and
applying a binary search of the plurality of counter values to determine a hot spot corresponding to an address range with a largest counter value.

22. The monitoring system of claim 18, wherein the host is configured to perform operations comprising:
obtaining a plurality of counter values from a plurality of data collecting instruments; and
determining an overloaded port of a network router using the plurality of counter values.

23. The monitoring system of claim 15, wherein the host is configured to perform operations comprising:
raising a flag associated with a particular address range monitored by at least one of the data collecting instruments to indicate that a communication target corresponding to the particular address range has been met during execution of the software application; and
signaling, in response to the communication target having been met, to affect execution of the software application.

24. The monitoring system of claim 23, wherein the host is configured to signal by performing one of
transmitting a notification data packet to a notification target,
triggering an interrupt associated with the software application, or
setting a flag that wakes up a particular computing resource.

25. The monitoring system of claim 23, wherein the communication target corresponding to the particular address range comprises one of
a predetermined value of, or change in, network-traffic corresponding to the particular address range,
a predetermined value of, or change in, bandwidth usage corresponding to the particular address range, or
a predetermined value of, or change in, latency usage corresponding to the particular address range.

26. The monitoring system of claim 15, wherein the host is configured to perform operations comprising:
obtaining a plurality of counter values from a plurality of data collecting instruments,
determining one or more statistics of the plurality of counter values; and
identifying, based on the determined one or more statistics, functionality of a source responsible for at least some of the plurality of counter values.

27. The monitoring system of claim 15, wherein
each of the data collecting instruments comprises, in addition to the counter and the associated counter register,
a first register to store a low end of the first address range,
a second register to store a high end of the first address range,
comparator gates coupled with the first register, the second register and the counter, the comparator gates configured to
receive a destination address, and
determine that the destination address is between the low end of the first address range and the high end of the first address range, and
the counter is configured to increment by one the counter value stored in the associated counter register.

28. The monitoring system of claim 15, wherein
each of the data collecting instruments comprises, in addition to the counter and the associated counter register,
a first register to store mask relating to the first address range,
and-gates coupled with the first register and configured to
receive a destination address,
bit-wise AND a mask to the destination address to obtain a masked destination address, and
a second register to store a masked first address range,
a bit-wise comparator coupled with the and-gates, the second register and the counter, the bit-wise comparator configured to
receive the masked destination address,
determine that the masked destination address is equal to the masked first address range, and
the counter is configured to increment by one the counter value stored in the associated counter register.

* * * * *